US007800216B2

(12) United States Patent
Inagaki et al.

(10) Patent No.: US 7,800,216 B2
(45) Date of Patent: Sep. 21, 2010

(54) MULTILAYER PRINTED WIRING BOARD

(75) Inventors: Yasushi Inagaki, Gifu (JP); Katsuyuki Sano, Gifu (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 893 days.

(21) Appl. No.: 10/565,078

(22) PCT Filed: Feb. 3, 2005

(86) PCT No.: PCT/JP2005/001610
§ 371 (c)(1),
(2), (4) Date: Jan. 18, 2006

(87) PCT Pub. No.: WO2005/076682
PCT Pub. Date: Aug. 18, 2005

(65) Prior Publication Data
US 2006/0244134 A1 Nov. 2, 2006

(30) Foreign Application Priority Data
Feb. 4, 2004 (JP) ............... 2004-028073
Feb. 5, 2004 (JP) ............... 2004-029201

(51) Int. Cl.
*H01L 23/14* (2006.01)
(52) U.S. Cl. ............... 257/700; 257/E23.067; 257/E23.173
(58) Field of Classification Search ................. 257/700, 257/746, E23.067, E23.173
See application file for complete search history.

(56) References Cited
U.S. PATENT DOCUMENTS

| 6,165,892 | A | 12/2000 | Chazan et al. |
| 6,323,439 | B1 | 11/2001 | Kambe et al. |
| 6,333,857 | B1 * | 12/2001 | Kanbe et al. ............... 361/792 |
| 6,724,638 | B1 | 4/2004 | Inagaki et al. |
| 6,876,554 | B1 | 4/2005 | Inagaki et al. |
| 2003/0173676 | A1 | 9/2003 | Horikawa |
| 2005/0157478 | A1 | 7/2005 | Inagaki et al. |
| 2005/0236177 | A1 | 10/2005 | Inagaki et al. |

FOREIGN PATENT DOCUMENTS
EP 1117283 A1 * 7/2001

(Continued)

OTHER PUBLICATIONS

U.S. Appl. No. 10/780,856, filed Feb. 19, 2004, Inagaki, et al.

(Continued)

*Primary Examiner*—Wael M Fahmy
*Assistant Examiner*—Abul Kalam
(74) *Attorney, Agent, or Firm*—Oblon, Spivak, McClelland, Maier & Neustadt, L.L.P.

(57) ABSTRACT

An IC chip for a high frequency region, particularly, a packaged substrate in which no malfunction or error occurs even if 3 GHz is exceeded. A conductive layer is formed at a thickness of 30 μm on a core substrate and a conductive circuit on an interlayer resin insulation layer is formed at a thickness of 15 μm. By thickening the conductive layer, the volume of the conductor itself can be increased thereby decreasing its resistance. Further, by using the conductive layer as a power source layer, the capacity of supply of power to an IC chip can be improved.

7 Claims, 40 Drawing Sheets

| | FOREIGN PATENT DOCUMENTS | | JP | 2002-353365 | 12/2002 |

| | | |
|---|---|---|
| JP | 6-260756 | 9/1994 |
| JP | 6-275959 | 9/1994 |
| JP | 2000-244130 | 9/2000 |
| JP | 2001-044591 | 2/2001 |
| JP | 2002-64272 | 2/2002 |
| JP | 2002-271034 | 9/2002 |

OTHER PUBLICATIONS

U.S. Appl. No. 10/551,439, filed Sep. 29, 2005, Kato.
U.S. Appl. No. 10/564,856, filed Jan. 17, 2006, Inagaki, et al.

* cited by examiner

Fig.3
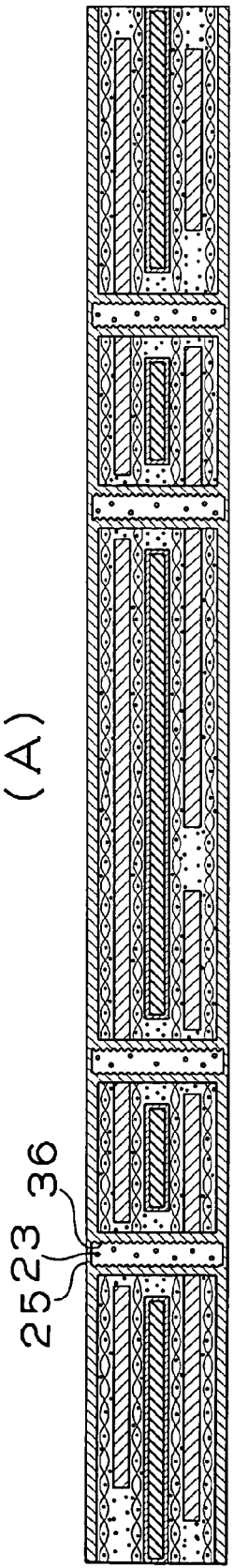
(A)
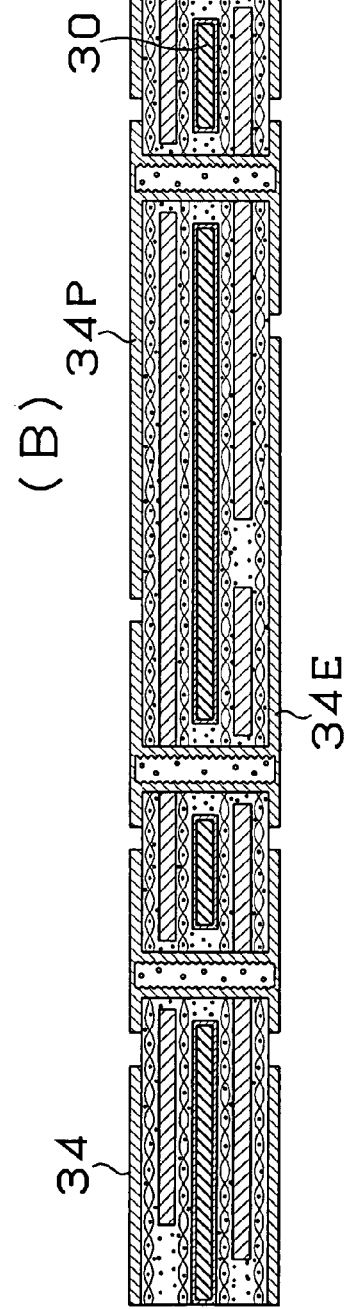
(B)
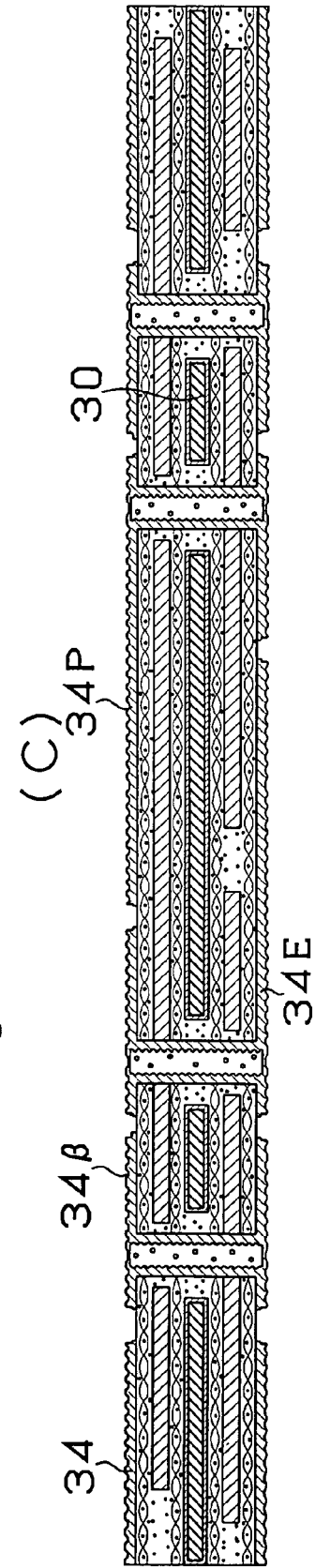
(C)

Fig.5
(A)
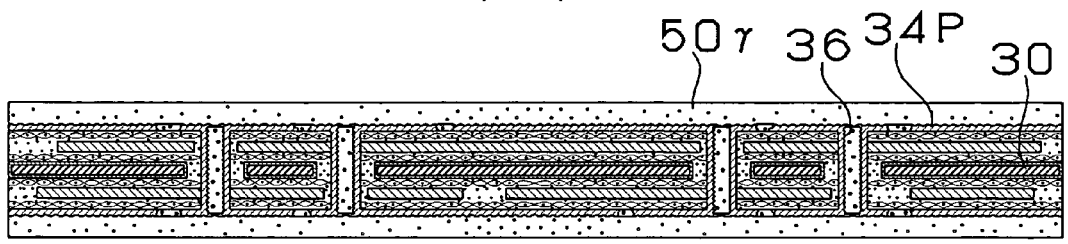
(B)
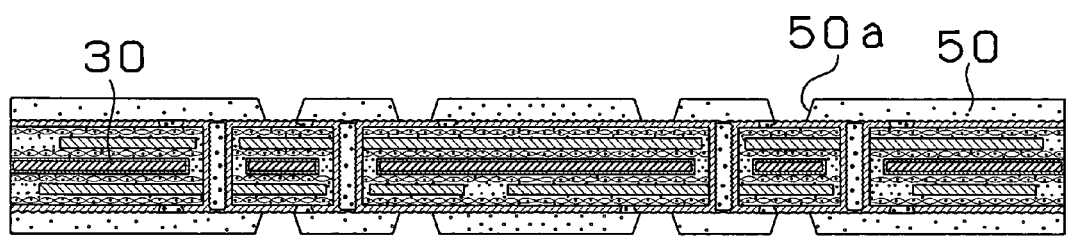
(C)
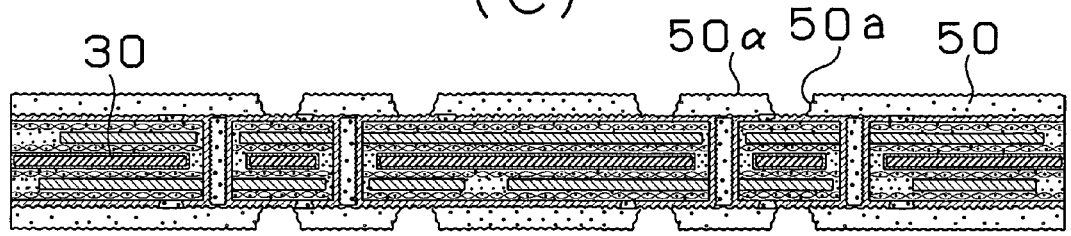
(D)
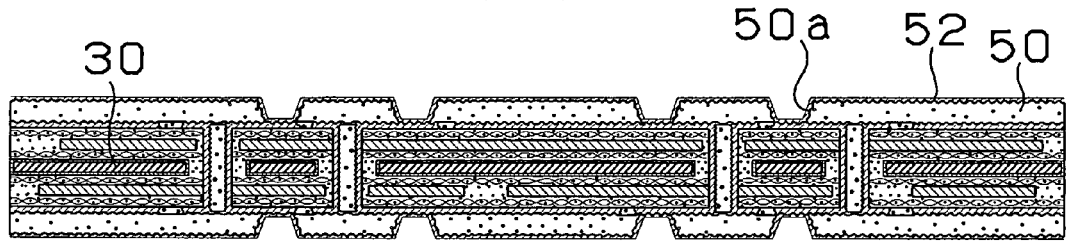

Fig.6
(A)
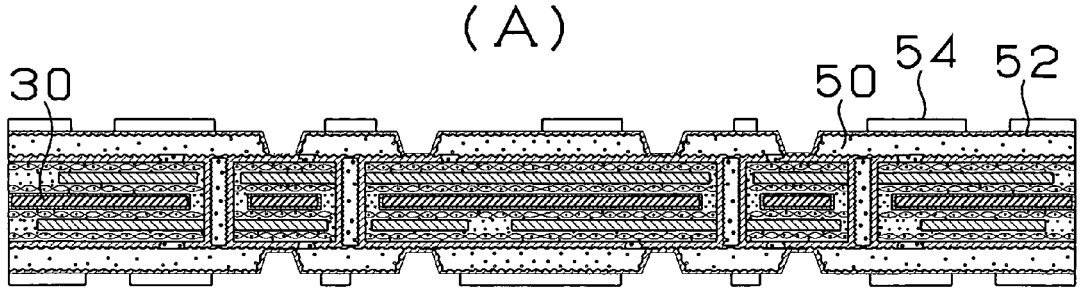
(B)
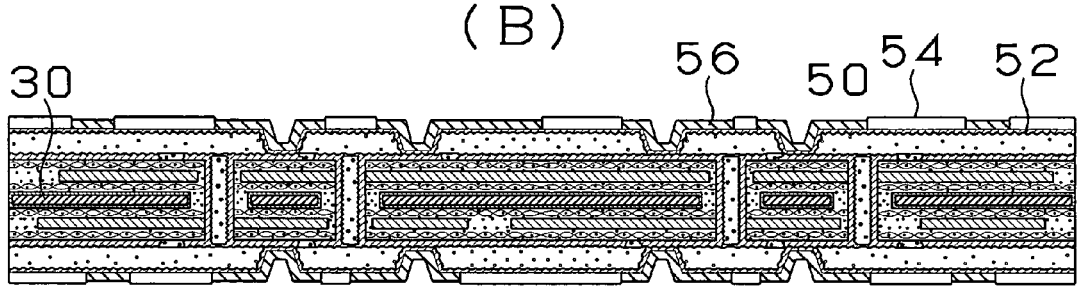
(C)
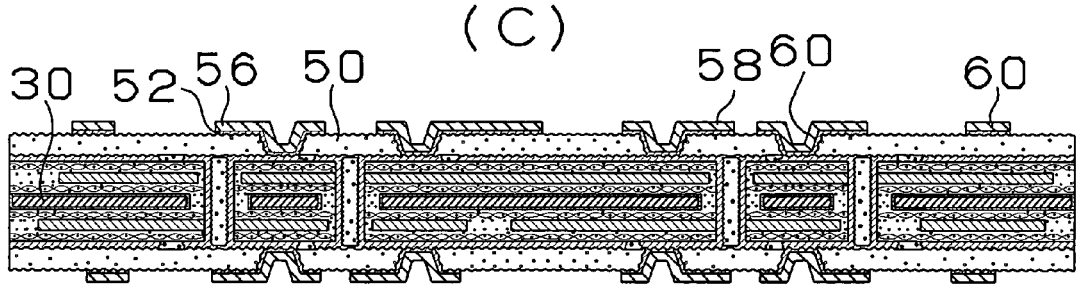
(D)
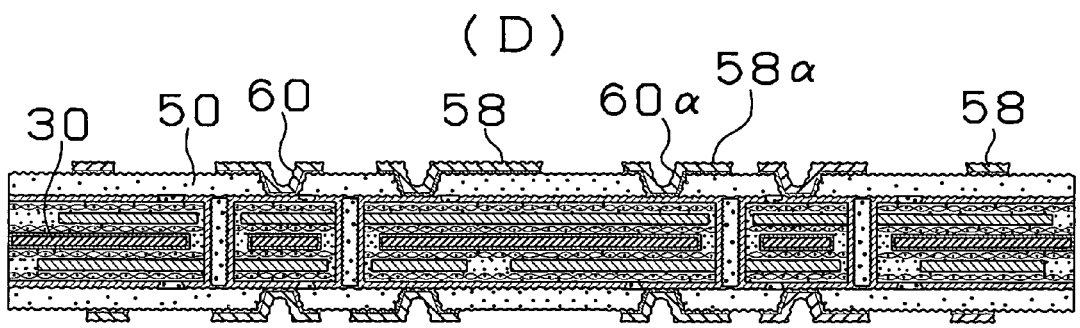

Fig. 7
(A)
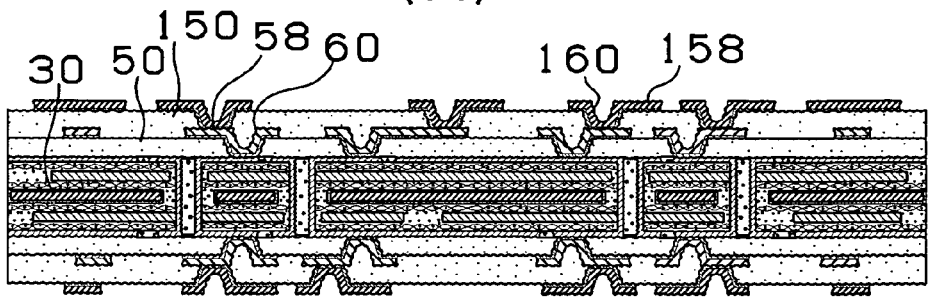
(B)
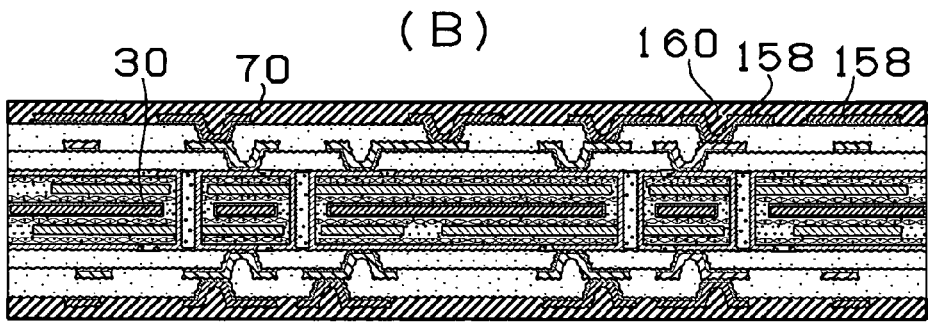
(C)
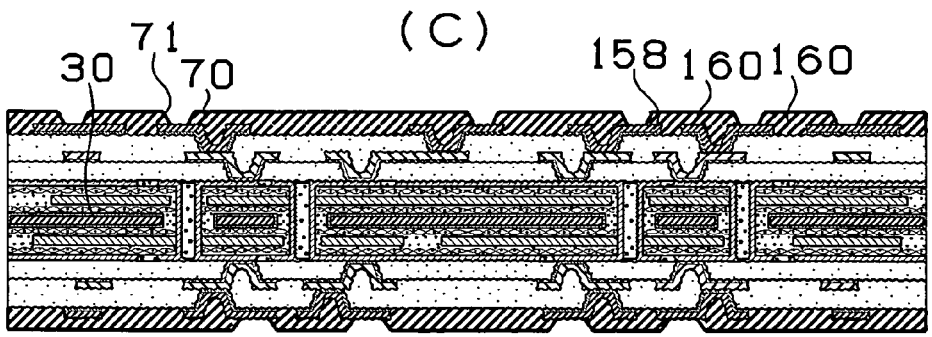
(D)
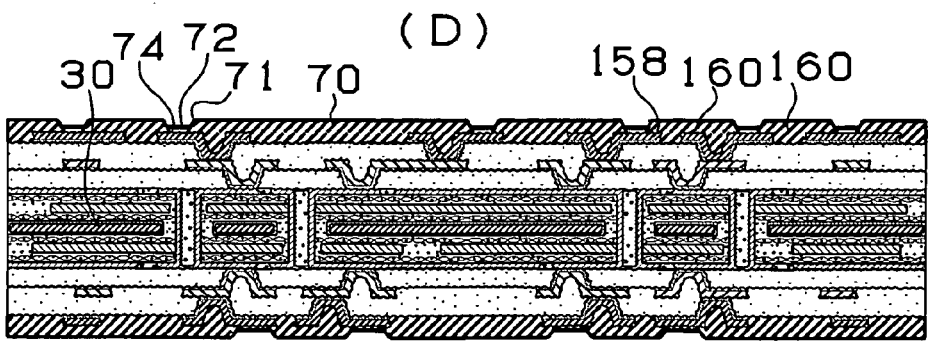

Fig.13

| # | α1/α2 | QUANTITY OF LAYERS IN INNER LAYER | THICKNESS OF CONDUCTIVE LAYER ON INTERLAYER INSULATION LAYER (μm) | THICKNESS OF POWER SOURCE LAYER ON FRONT SURFACE LAYER OF CORE SUBSTRATE (μm) | THICKNESS OF POWER SOURCE LAYER IN INNER LAYER OF CORE SUBSTRATE (μm) | SUM OF THICKNESSES OF POWER SOURCE LAYERS OF CORE (μm) | AMOUNT OF VOLTAGE DROP (V) | RESULT OF HAST TEST |
|---|---|---|---|---|---|---|---|---|
| FIRST EMBODIMENT-1 | 2 | 2 | 20 | 15 | 25 | 40 | 0.091 | ○ |
| FIRST EMBODIMENT-2 | 1.2 | 2 | 20 | 9 | 15 | 24 | 0.093 | ○ |
| FIRST EMBODIMENT-3 | 3 | 2 | 20 | 15 | 45 | 60 | 0.085 | ○ |
| FIRST EMBODIMENT-4 | 3.75 | 2 | 20 | 15 | 60 | 75 | 0.085 | ○ |
| FIRST EMBODIMENT-5 | 30.75 | 12 | 20 | 15 | 100 | 615 | 0.095 | ○ |
| FIRST EMBODIMENT-6 | 40.75 | 16 | 20 | 15 | 100 | 815 | 0.097 | ○ |
| FIRST EMBODIMENT-7 | 3 | 2 | 20 | 45 | 15 | 60 | 0.087 | ○ |
| FIRST EMBODIMENT-8 | 3.75 | 2 | 20 | 60 | 15 | 75 | 0.086 | ○ |
| FIRST EMBODIMENT-9 | 3.25 | 2 | 20 | 15 | 50 | 65 | 0.084 | ○ |
| FIRST EMBODIMENT-10 | 8.25 | 2 | 20 | 15 | 150 | 165 | 0.083 | × |
| FIRST EMBODIMENT-11 | 9.5 | 2 | 20 | 15 | 175 | 190 | 0.09 | × |
| FIRST EMBODIMENT-12 | 10.75 | 2 | 20 | 15 | 200 | 215 | 0.093 | ○ |
| FIRST EMBODIMENT-28 | 7 | 2 | 20 | 15 | 125 | 140 | 0.084 | ○ |
| FIRST COMPARATIVE EXAMPLE-1 | 1 | 2 | 20 | 10 | 10 | 20 | 0.108 | ○ |
| FIRST COMPARATIVE EXAMPLE-2 | 42 | 16 | 20 | 40 | 100 | 840 | 0.103 | ○ |
| FIRST COMPARATIVE EXAMPLE-3 | 50.75 | 20 | 20 | 15 | 100 | 1015 | 0.123 | ○ |

Fig.14

| # | WIDTH OF CONDUCTOR/INTERVAL OF CONDUCTORS($\mu$m) | | | | |
|---|---|---|---|---|---|
| | 5/5 | 7.5/7.5 | 10/10 | 12.5/12.5 | 15/15 |
| FIRST EMBODIMENT—3 | ○ | ○ | ○ | ○ | ○ |
| FIRST EMBODIMENT—4 | ○ | ○ | ○ | ○ | ○ |
| FIRST EMBODIMENT—7 | × | × | ○ | ○ | ○ |
| FIRST EMBODIMENT—8 | × | × | ○ | ○ | ○ |

Fig.15

| # | α1/α2 | QUANTITY OF LAYERS IN INNER LAYER | THICKNESS OF CONDUCTIVE LAYER ON INTERLAYER INSULATION LAYER (μm) | THICKNESS OF POWER SOURCE LAYER ON FRONT SURFACE LAYER OF CORE SUBSTRATE (μm) | THICKNESS OF POWER SOURCE LAYER IN INNER LAYER OF CORE SUBSTRATE (μm) | SUM OF THICKNESSES OF POWER SOURCE LAYERS OF CORE (μm) | AMOUNT OF VOLTAGE DROP (V) | PRESENCE/ABSENCE OF MALFUNCTION | | |
|---|---|---|---|---|---|---|---|---|---|---|
| | | | | | | | | No.1 IC MOUNTED | No.2 IC MOUNTED | No.3 IC MOUNTED |
| FIRST EMBODIMENT-1 | 2 | 2 | 20 | 15 | 25 | 40 | 0.091 | NONE | YES | YES |
| FIRST EMBODIMENT-2 | 1.2 | 2 | 20 | 9 | 15 | 24 | 0.093 | NONE | YES | YES |
| FIRST EMBODIMENT-3 | 3 | 2 | 20 | 15 | 45 | 60 | 0.085 | NONE | NONE | NONE |
| FIRST EMBODIMENT-4 | 3.75 | 2 | 20 | 15 | 60 | 75 | 0.085 | NONE | NONE | NONE |
| FIRST EMBODIMENT-5 | 30.75 | 12 | 20 | 15 | 100 | 615 | 0.095 | NONE | YES | YES |
| FIRST EMBODIMENT-6 | 40.75 | 16 | 20 | 15 | 100 | 815 | 0.097 | NONE | YES | YES |
| FIRST EMBODIMENT-7 | 3 | 2 | 20 | 45 | 15 | 60 | 0.087 | NONE | NONE | YES |
| FIRST EMBODIMENT-8 | 3.75 | 2 | 20 | 60 | 15 | 75 | 0.086 | NONE | NONE | YES |
| FIRST EMBODIMENT-9 | 3.25 | 2 | 20 | 15 | 50 | 65 | 0.084 | NONE | NONE | NONE |
| FIRST EMBODIMENT-10 | 8.25 | 2 | 20 | 15 | 150 | 165 | 0.083 | NONE | NONE | YES |
| FIRST EMBODIMENT-11 | 9.5 | 2 | 20 | 15 | 175 | 190 | 0.09 | NONE | YES | YES |
| FIRST EMBODIMENT-12 | 10.75 | 2 | 20 | 15 | 200 | 215 | 0.093 | NONE | YES | YES |
| FIRST EMBODIMENT-27 | 4 | 4 | 20 | 15 | 32.5 | 80 | 0.087 | NONE | NONE | YES |
| FIRST EMBODIMENT-28 | 7 | 2 | 20 | 15 | 125 | 140 | 0.084 | NONE | NONE | NONE |
| FIRST COMPARATIVE EXAMPLE-1 | 1 | 2 | 20 | 10 | 10 | 20 | 0.108 | YES | YES | YES |
| FIRST COMPARATIVE EXAMPLE-2 | 42 | 16 | 20 | 40 | 100 | 840 | 0.103 | YES | YES | YES |
| FIRST COMPARATIVE EXAMPLE-3 | 50.75 | 20 | 20 | 15 | 100 | 1015 | 0.123 | YES | YES | YES |

Fig.16

| # | α1/α2 | HAVING NO DUMMY LAND TH% | QUANTITY OF LAYERS IN INNER LAYER | THICKNESS OF CONDUCTIVE LAYER ON INTERLAYER INSULATION LAYER (μm) | THICKNESS OF POWER SOURCE LAYER ON FRONT SURFACE LAYER OF CORE SUBSTRATE (μm) | THICKNESS OF POWER SOURCE LAYER IN INNER LAYER OF CORE SUBSTRATE (μm) | SUM OF THICKNESSES OF POWER SOURCE LAYERS OF CORE (μm) | PRESENCE/ABSENCE OF MALFUNCTION | | |
|---|---|---|---|---|---|---|---|---|---|---|
| | | | | | | | | No.1 IC MOUNTED | No.2 IC MOUNTED | No.3 IC MOUNTED |
| FIRST EMBODIMENT-13 | 3 | 50 | 2 | 20 | 15 | 45 | 60 | NONE | NONE | NONE |
| FIRST EMBODIMENT-14 | 3 | 100 | 2 | 20 | 15 | 45 | 60 | NONE | NONE | NONE |
| FIRST EMBODIMENT-15 | 3.25 | 50 | 2 | 20 | 15 | 50 | 65 | NONE | NONE | NONE |
| FIRST EMBODIMENT-16 | 3.25 | 100 | 2 | 20 | 15 | 50 | 65 | NONE | NONE | NONE |
| FIRST EMBODIMENT-17 | 3.75 | 50 | 2 | 20 | 15 | 60 | 75 | NONE | NONE | NONE |
| FIRST EMBODIMENT-18 | 3.75 | 100 | 2 | 20 | 15 | 60 | 75 | NONE | NONE | NONE |
| FIRST EMBODIMENT-19 | 8.25 | 50 | 2 | 20 | 15 | 150 | 165 | NONE | NONE | NONE |
| FIRST EMBODIMENT-20 | 8.25 | 100 | 2 | 20 | 15 | 150 | 165 | NONE | NONE | NONE |
| FIRST EMBODIMENT-21 | 9.5 | 50 | 2 | 20 | 15 | 175 | 190 | NONE | NONE | YES |
| FIRST EMBODIMENT-22 | 9.5 | 100 | 2 | 20 | 15 | 175 | 190 | NONE | NONE | YES |
| FIRST EMBODIMENT-23 | 10.75 | 50 | 2 | 20 | 15 | 200 | 215 | NONE | NONE | YES |
| FIRST EMBODIMENT-24 | 10.75 | 100 | 2 | 20 | 15 | 200 | 215 | NONE | NONE | YES |
| FIRST EMBODIMENT-25 | 3 | 50 | 2 | 20 | 45 | 15 | 60 | NONE | NONE | YES |
| FIRST EMBODIMENT-26 | 3 | 100 | 2 | 20 | 45 | 15 | 60 | NONE | NONE | YES |
| FIRST EMBODIMENT-29 | 4 | 50 | 4 | 20 | 15 | 32.5 | 80 | NONE | NONE | NONE |
| FIRST EMBODIMENT-30 | 4 | 100 | 4 | 20 | 15 | 32.5 | 80 | NONE | NONE | NONE |

Fig.19
(A)
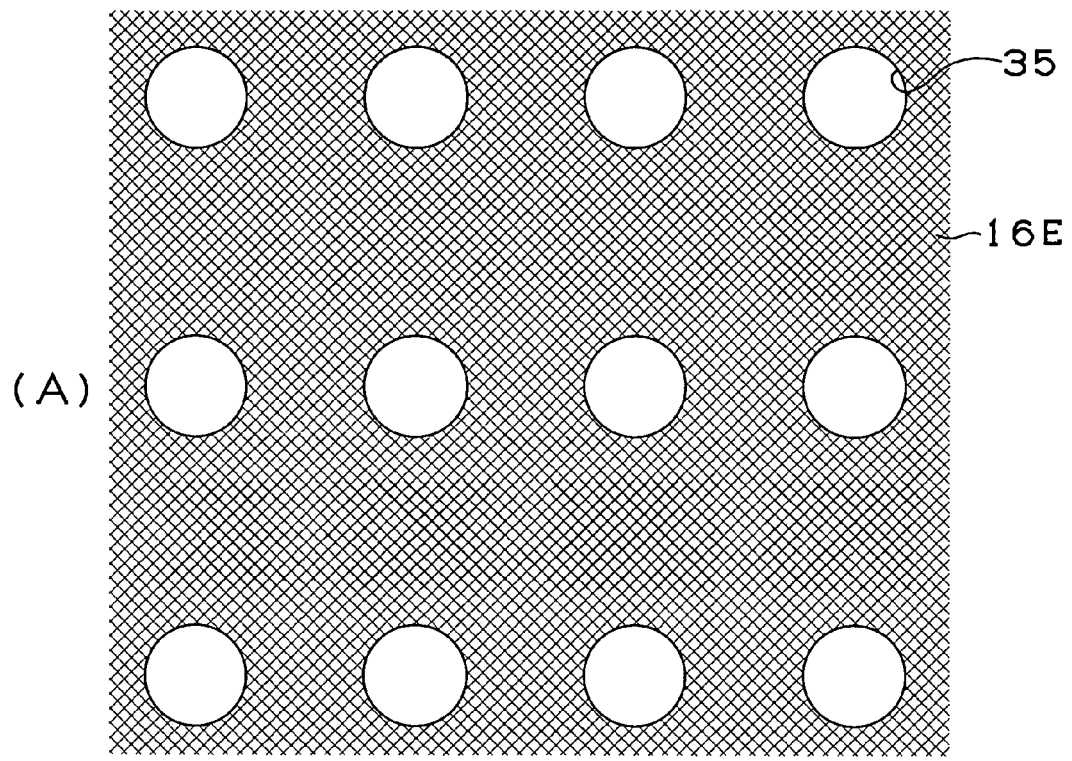
(B)
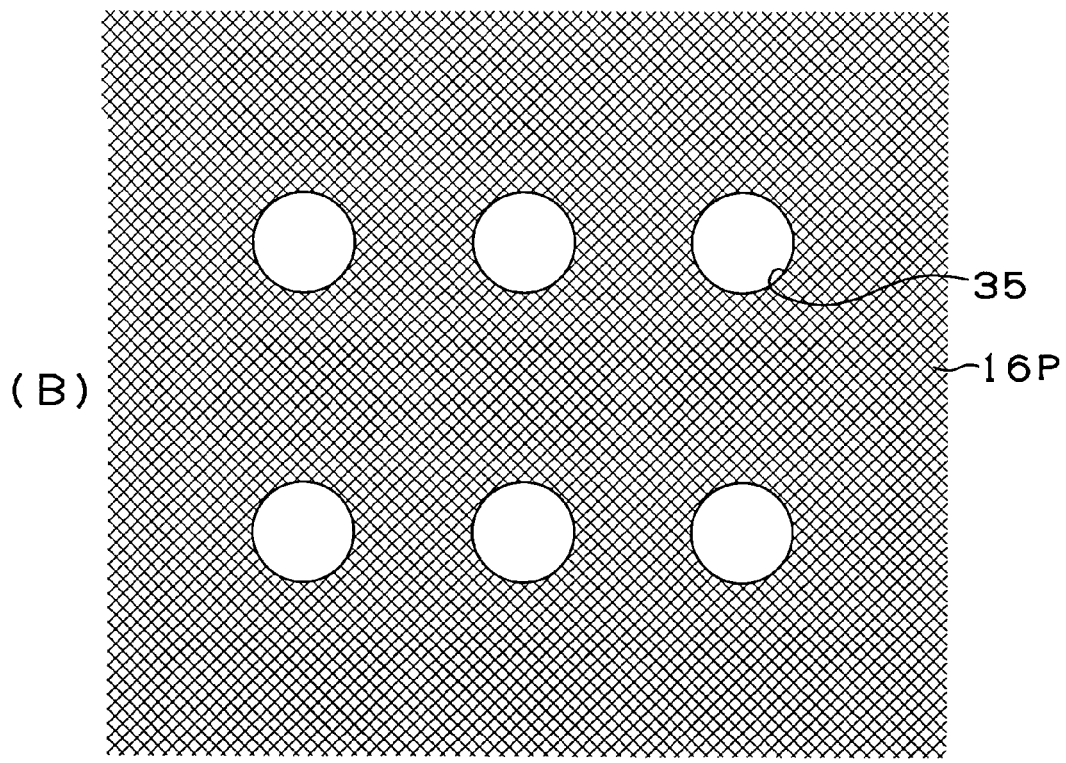

Fig.25
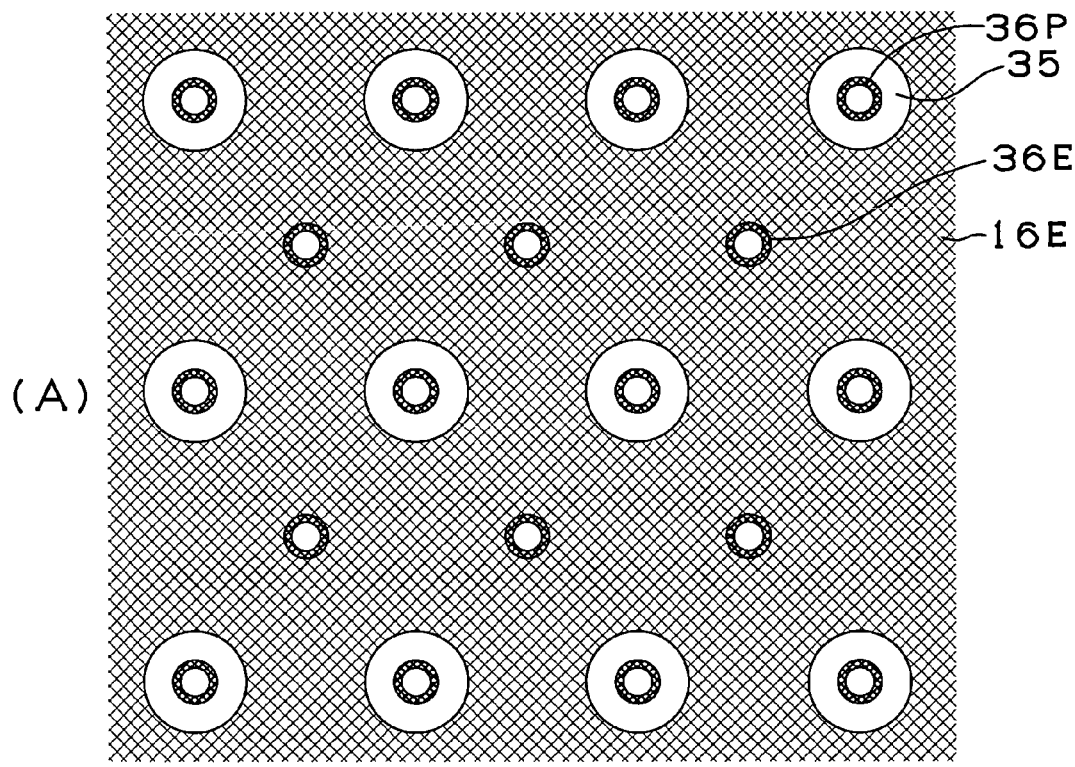
(A)
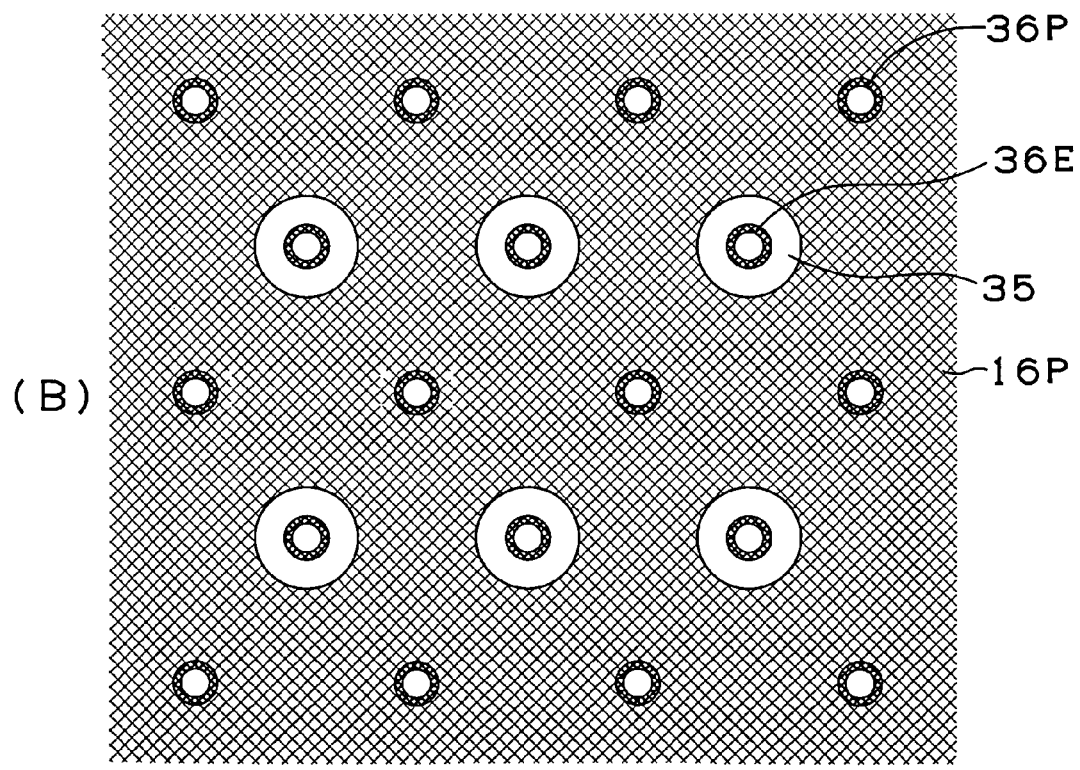
(B)

Fig.26
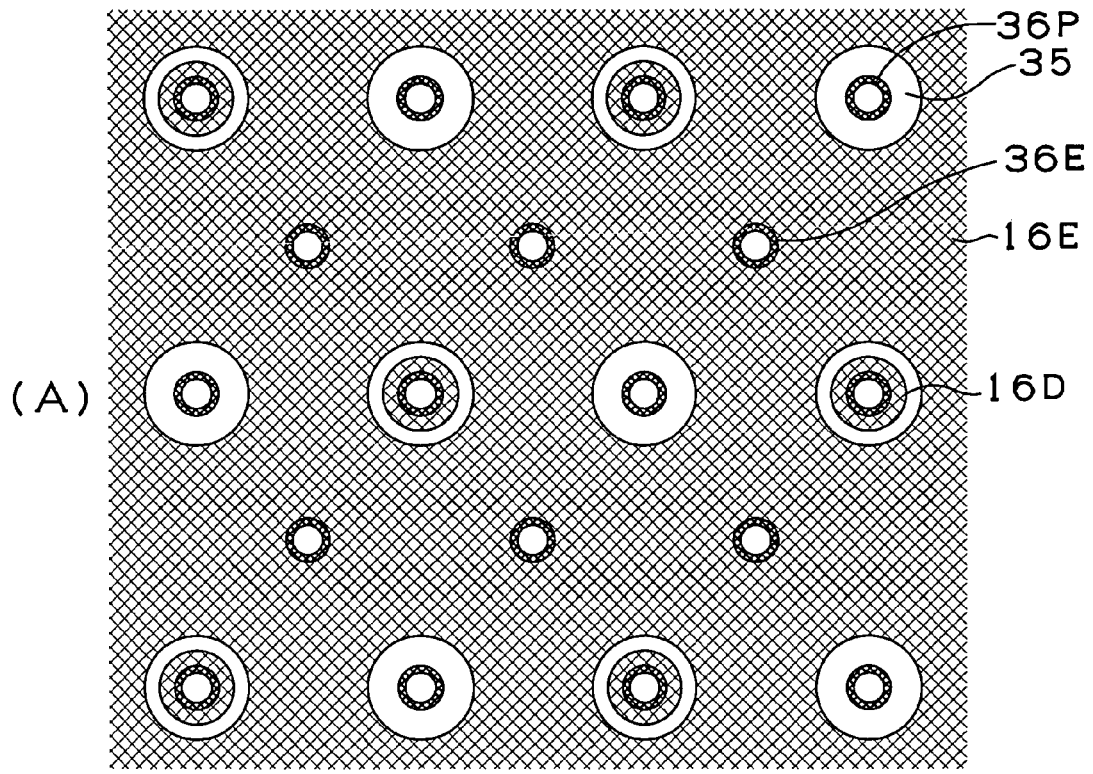
(A)
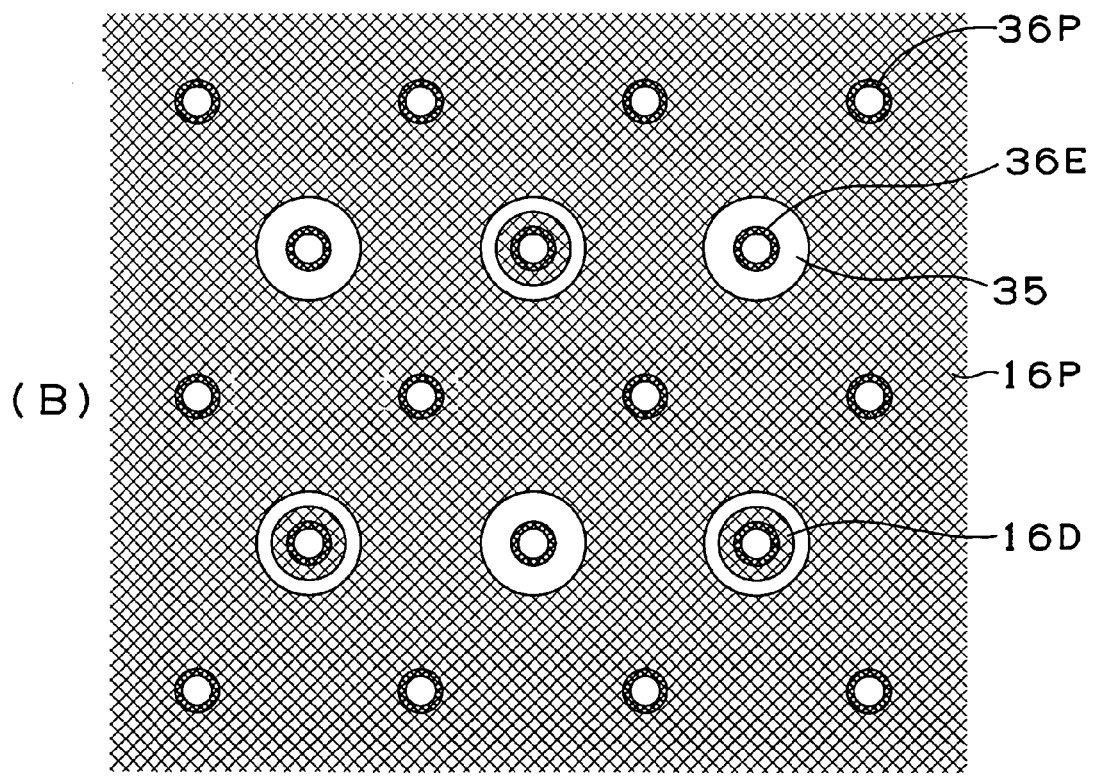
(B)

Fig.30

| # | THICKNESS OF CONDUCTOR OF BU LAYER (μm) | THICKNESS OF CONDUCTOR IN INNER LAYER OF MULTILAYER CORE (μm) | REGION HAVING NO DUMMY LAND OR/AND PERCENTAGE THEREOF | AMOUNT OF VOLTAGE DROP (V) FIRST TIME | SECOND TIME | THIRD TIME | PRESENCE/ABSENCE OF IC MALFUNCTION #1 (3.06 GHz,400MHz) | #2 (3.2 GHz,800MHz) | #3 (3.46GHz,1066MHz) |
|---|---|---|---|---|---|---|---|---|---|
| SECOND EMBODIMENT-11 | 15 | 30 | JUST BELOW IC | 0.154 | 0.116 | 0.086 | NONE | NONE | YES |
| SECOND EMBODIMENT-12 | 15 | 30 | 50% | 0.222 | 0.132 | 0.086 | NONE | YES | YES |
| SECOND EMBODIMENT-13 | 15 | 30 | 70% | 0.206 | 0.128 | 0.086 | NONE | NONE | YES |
| SECOND EMBODIMENT-14 | 15 | 30 | 80% | 0.202 | 0.126 | 0.087 | NONE | NONE | YES |
| SECOND EMBODIMENT-15 | 15 | 30 | 90% | 0.205 | 0.122 | 0.085 | NONE | NONE | YES |
| SECOND EMBODIMENT-16 | 15 | 45 | JUST BELOW IC | 0.137 | 0.108 | 0.078 | NONE | NONE | NONE |
| SECOND EMBODIMENT-17 | 15 | 60 | JUST BELOW IC | 0.135 | 0.108 | 0.076 | NONE | NONE | NONE |
| SECOND EMBODIMENT-18 | 15 | 75 | JUST BELOW IC | 0.130 | 0.106 | 0.074 | NONE | NONE | NONE |
| SECOND EMBODIMENT-19 | 15 | 75 | 70% | 0.132 | 0.106 | 0.074 | NONE | NONE | NONE |
| SECOND EMBODIMENT-20 | 15 | 45 | 30% JUST BELOW | 0.201 | 0.123 | 0.078 | NONE | NONE | YES |
| SECOND EMBODIMENT-21 | 15 | 60 | 30% JUST BELOW | 0.159 | 0.118 | 0.076 | NONE | NONE | NONE |
| SECOND EMBODIMENT-22 | 15 | 75 | 30% JUST BELOW | 0.155 | 0.117 | 0.074 | NONE | NONE | NONE |
| SECOND EMBODIMENT-23 | 15 | 150 | 30% JUST BELOW | 0.154 | 0.116 | 0.072 | NONE | NONE | NONE |
| SECOND EMBODIMENT-24 | 15 | 300 | 30% JUST BELOW | 0.208 | 0.129 | 0.086 | NONE | NONE | YES |
| SECOND EMBODIMENT-25 | 15 | 45 | 50% JUST BELOW | 0.165 | 0.120 | 0.078 | NONE | NONE | NONE |
| SECOND EMBODIMENT-26 | 15 | 60 | 50% JUST BELOW | 0.155 | 0.117 | 0.076 | NONE | NONE | NONE |
| SECOND EMBODIMENT-27 | 15 | 75 | 50% JUST BELOW | 0.155 | 0.117 | 0.074 | NONE | NONE | NONE |
| SECOND EMBODIMENT-28 | 15 | 150 | 50% JUST BELOW | 0.155 | 0.117 | 0.072 | NONE | NONE | NONE |
| SECOND EMBODIMENT-29 | 15 | 300 | 50% JUST BELOW | 0.201 | 0.129 | 0.086 | NONE | NONE | YES |
| SECOND EMBODIMENT-30 | 15 | 45 | 70% JUST BELOW | 0.155 | 0.117 | 0.078 | NONE | NONE | NONE |
| SECOND EMBODIMENT-31 | 15 | 60 | 70% JUST BELOW | 0.155 | 0.117 | 0.076 | NONE | NONE | NONE |
| SECOND EMBODIMENT-32 | 15 | 75 | 70% JUST BELOW | 0.155 | 0.117 | 0.074 | NONE | NONE | NONE |
| SECOND EMBODIMENT-33 | 15 | 150 | 70% JUST BELOW | 0.155 | 0.117 | 0.072 | NONE | NONE | NONE |
| SECOND EMBODIMENT-34 | 15 | 300 | 70% JUST BELOW | 0.203 | 0.127 | 0.086 | NONE | NONE | YES |
| SECOND EMBODIMENT-35 | 15 | 60 | 50% JUST BELOW | 0.201 | 0.130 | 0.078 | NONE | NONE | YES |
| SECOND EMBODIMENT-36 | 15 | 30 | 50% JUST BELOW | 0.204 | 0.121 | 0.078 | NONE | NONE | YES |
| SECOND COMPARATIVE EXAMPLE-3 | 15 | 5 | NONE | 0.306 | 0.150 | 0.087 | YES | YES | YES |

Fig.31
(A) 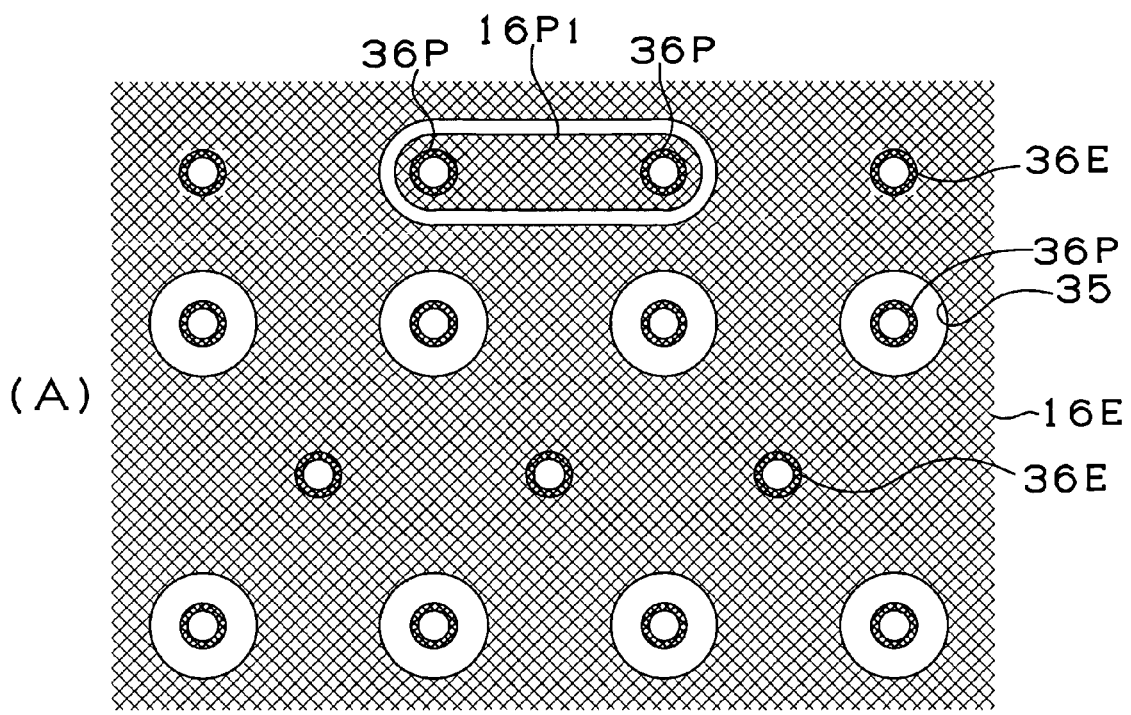
(B) 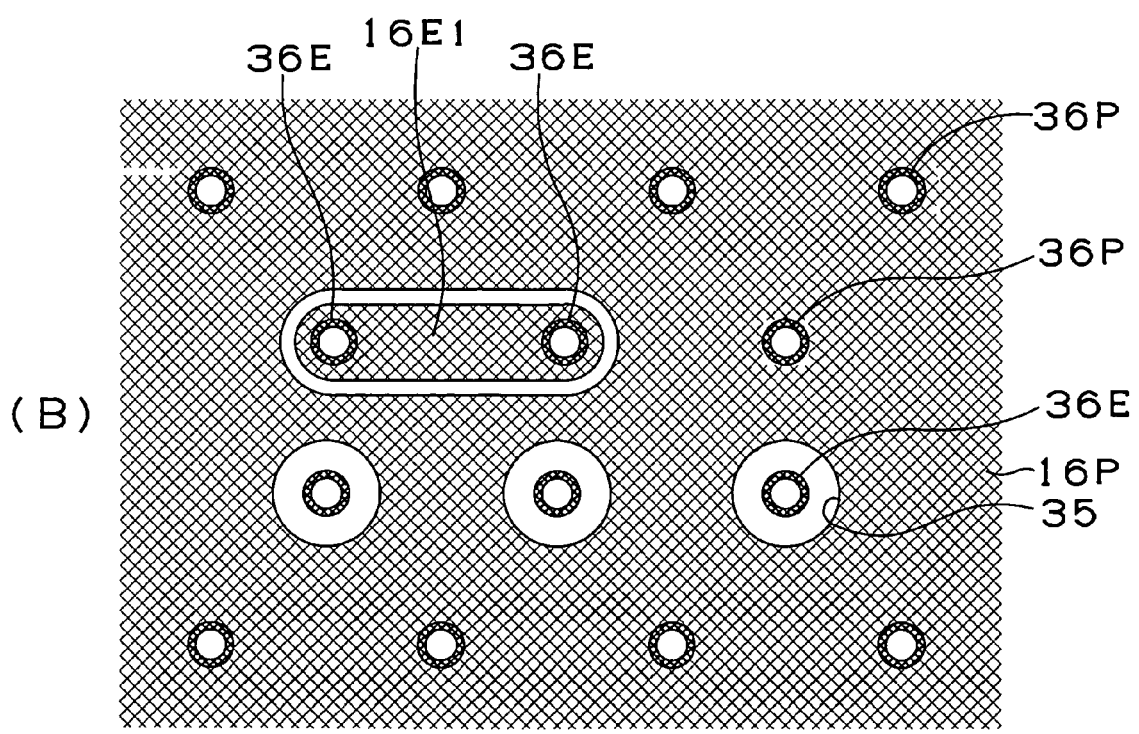

Fig.32
(A)
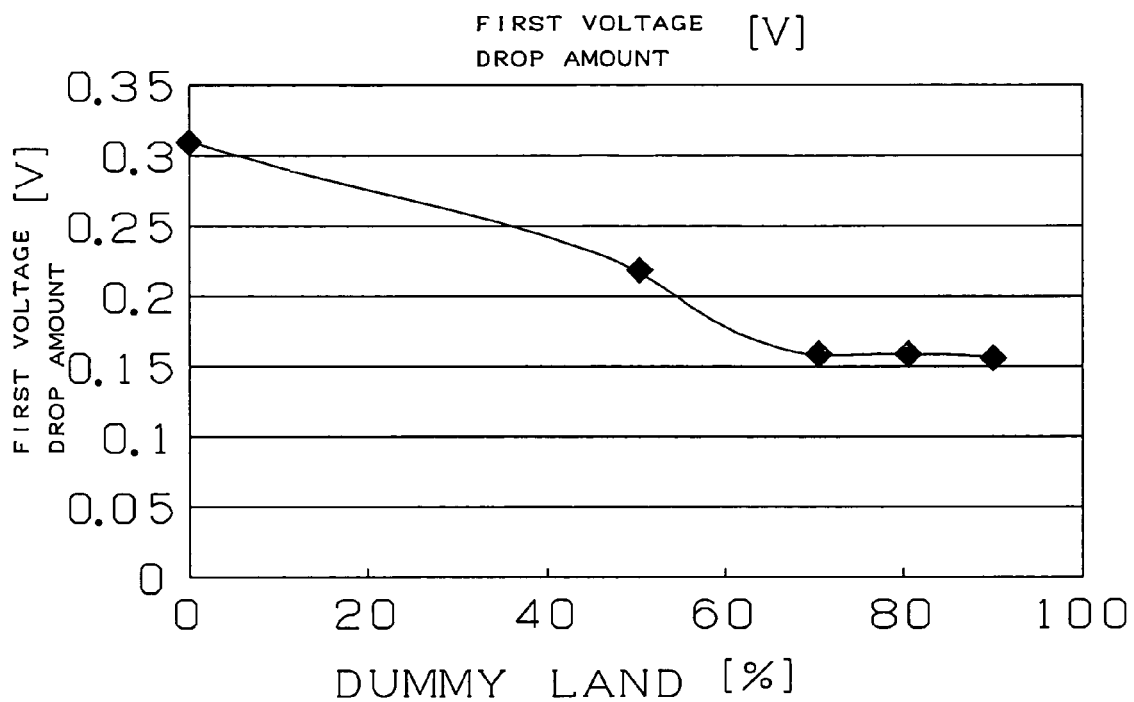
(B)
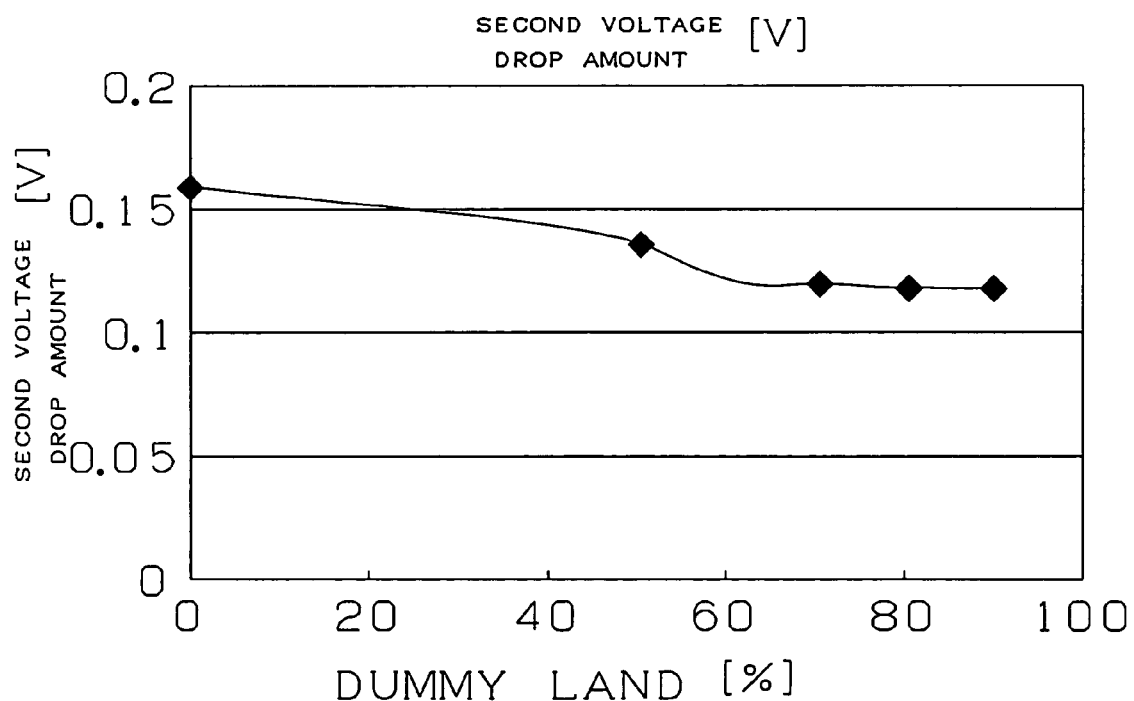

Fig.33

| # | THICKNESS OF Cu IN BUILT-UP LAYER (μm) | THICKNESS OF Cu IN INNER LAYER OF MULTILAYER CORE (μm) | RESION HAVING NO DUMMY LAND OR PERCENTAGE THEREOF | AMOUNT OF VOLTAGE DROP(V) | | | PRESENCE/ABSENCE OF IC MALFUNCTION |
|---|---|---|---|---|---|---|---|
| | | | | FIRST TIME | SECOND TIME | THIRD TIME | |
| SECOND EMBODIMENT1 | 15 | 30 | JUST BELOW IC | 0.157 | 0.118 | 0.089 | NONE |
| SECOND EMBODIMENT2 | 15 | 30 | 50% | 0.218 | 0.135 | 0.088 | YES |
| SECOND EMBODIMENT3 | 15 | 30 | 70% | 0.158 | 0.120 | 0.088 | NONE |
| SECOND EMBODIMENT4 | 15 | 30 | 80% | 0.158 | 0.118 | 0.089 | NONE |
| SECOND EMBODIMENT5 | 15 | 30 | 90% | 0.155 | 0.118 | 0.087 | NONE |
| SECOND EMBODIMENT6 | 15 | 45 | JUST BELOW IC | 0.140 | 0.110 | 0.088 | NONE |
| SECOND EMBODIMENT7 | 15 | 60 | JUST BELOW IC | 0.138 | 0.110 | 0.088 | NONE |
| SECOND EMBODIMENT8 | 15 | 75 | JUST BELOW IC | 0.133 | 0.108 | 0.086 | NONE |
| SECOND EMBODIMENT9 | 15 | 75 | 70% | 0.135 | 0.108 | 0.086 | NONE |
| SECOND COMPARATIVE EXAMPLE1 | 15 | 30 | NONE | 0.310 | 0.153 | 0.089 | YES |
| SECOND COMPARATIVE EXAMPLE2 | 15 | 15 | NONE | 0.389 | 0.160 | 0.108 | YES |

Fig.36
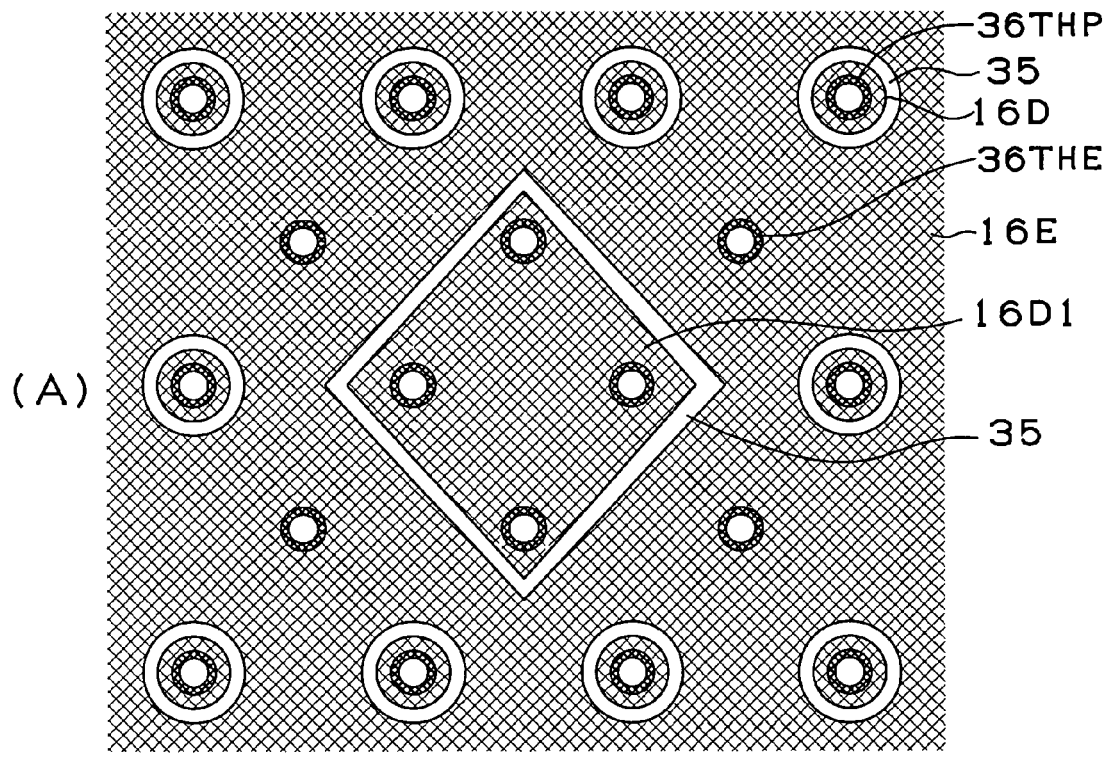
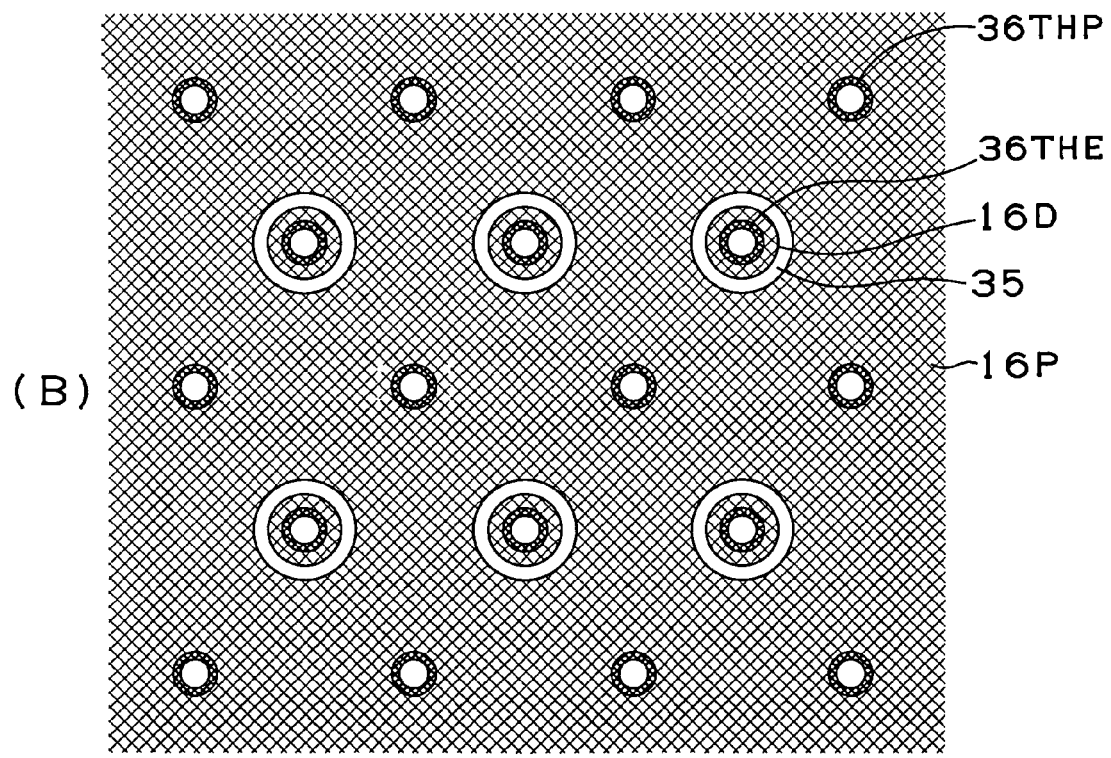

Fig.37
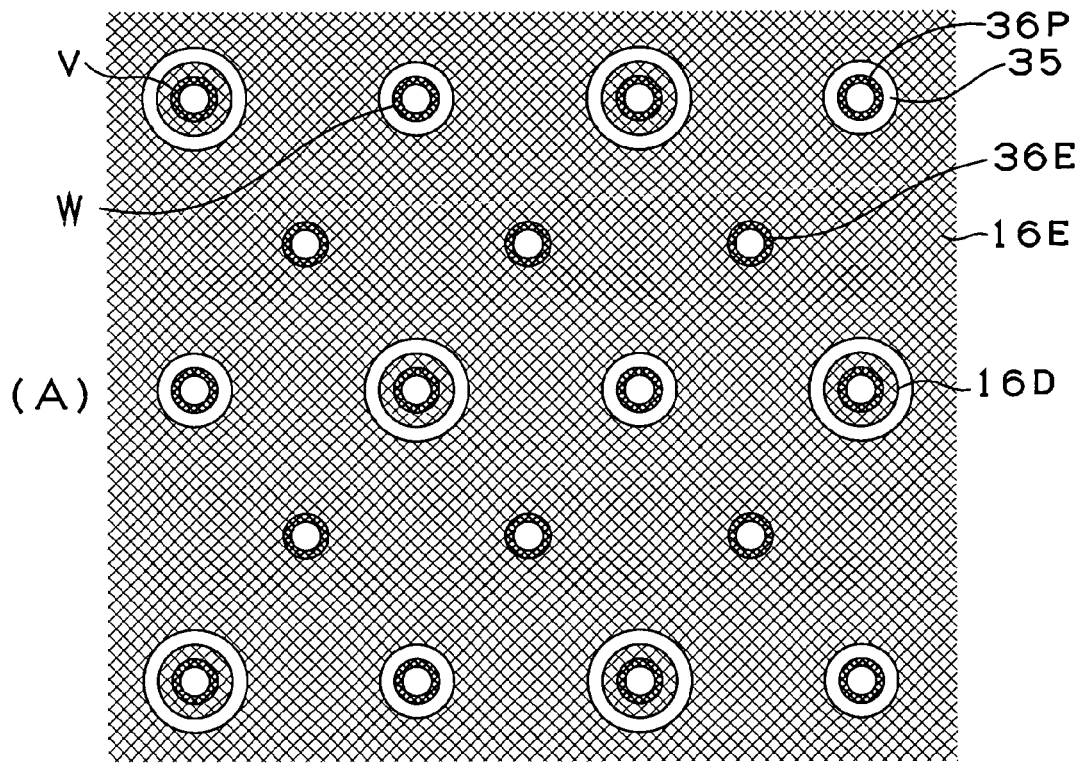
(A)
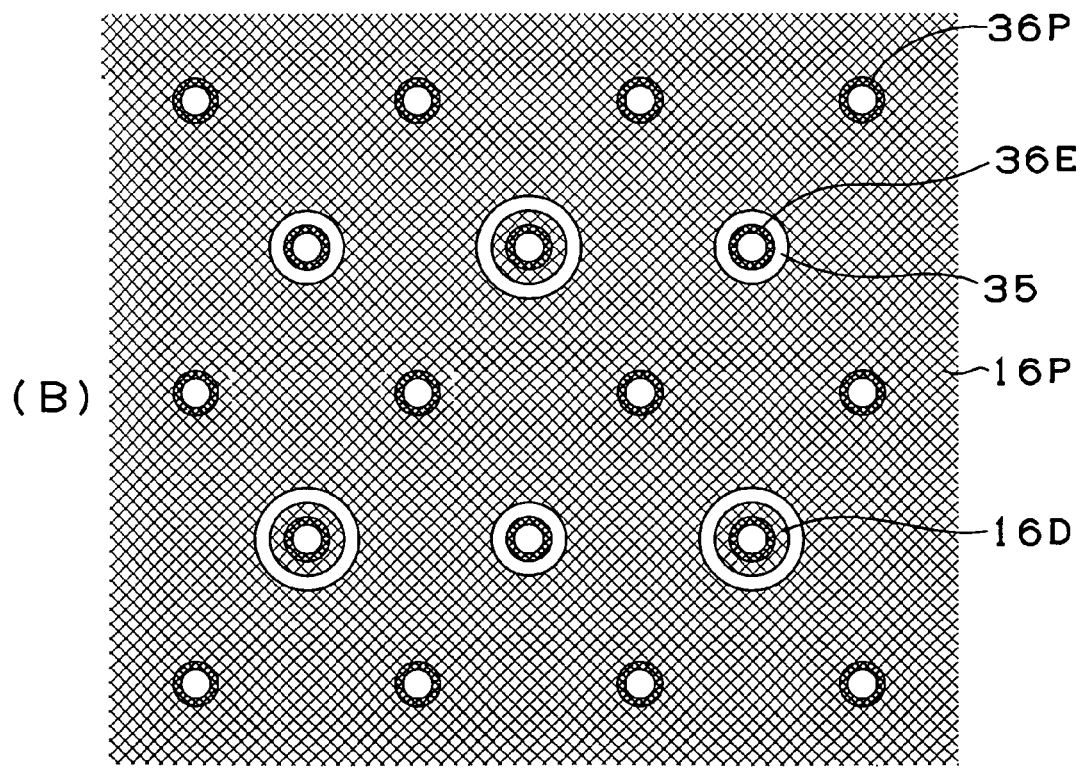
(B)

MULTILAYER PRINTED WIRING BOARD

TECHNICAL FIELD

This invention relates to a multilayer printed wiring board and provides a technique related to a multilayer printed wiring board capable of having improved electric characteristics and reliability without causing malfunction, error or the like even if a high frequency IC chip, particularly an IC chip in a high frequency range of 3 GHz or higher is mounted thereon.

BACKGROUND ART

In forming a buildup type multilayer printed wiring board constituting an IC chip package, interlayer insulating resin is formed on one of or each of the surfaces of a core substrate having through holes formed therein and via holes for interlayer conduction are opened by a laser or photo etching, whereby an interlayer resin insulating layer is thereby formed. A conductor layer is formed on the via holes by plating or the like and etching and the like are performed to form a pattern, thus creating a conductor circuit. Further, by repeatedly forming the interlayer insulating layer and the conductor layer, the buildup multilayer printed wiring board is obtained. By forming solder bumps and external terminals (PGA/BGA's or the like) on the front layer of the board at need, the board becomes a substrate capable of mounting an IC chip thereon or a package substrate. The IC chip is C4 (flip-chip) mounted, whereby the IC chip is electrically connected to the substrate.

As prior art of the buildup type multilayer printed wiring board, there are known JP 6-260756A and JP 6-275959A. In both of the publications, a land is formed on a core substrate having through holes filled with resin filler, interlayer insulating layers having via holes formed therein are provided on the both surfaces of the substrate, respectively, a conductor layer is formed by an additive method and the conductor layer is connected to the land, thereby obtaining a high density multilayer wiring board having fine wirings formed thereon.

DISCLOSURE OF THE INVENTION

Object to be Solve the Invention

Prior Art 1: JP 6-260756A is incorporated herein by reference.

Prior Art 2: JP 6-275959A is incorporated herein by reference.

However, as the frequency of an IC chip is higher, the frequency of occurrence of malfunction or error becomes higher. Particularly if the frequency of the IC chip exceeds 3 GHz, the frequency of occurrence of malfunction or error considerably increases. If the frequency exceeds 5 GHz, the IC chip often turns inoperative. Due to this, a computer including the IC chip as a CPU cannot perform operations that the computer should do, i.e., cannot perform desired functions and operations such as the recognition of an image, the changeover of a switch and the transmission of data to the outside of the computer.

If the substrate for an IC chip of this type is to be subjected to a non-destructive test and to be dissembled, no problems such as short-circuit or opens do not occur to the substrate itself and if the IC chip having a low frequency (particularly less than 1 GHz) is mounted on the substrate, then no malfunction or error occurs to the IC chip.

To solve the above objection, in Japan patent application No. 2002-233775, the inventors suggested the printed circuit board of which the thickness of the conductor layer in the core substrate is larger than the thickness of the conductor layer on the interlayer insulating layer. However, in the above invention, the insulating clearance between the circuit patterns is narrow in the core substrate having the fine pattern and the printed circuit board has low insulating reliability.

The first object of the present invention is to provide a multilayer printed wiring board capable of being constituted as a printed board or a package substrate free of malfunction or error even with an IC chip in a high frequency range, particularly, with a frequency exceeding 3 GHz.

According to the second invention, as a countermeasure for malfunction under high frequency, the inventor of the present invention considered providing a multilayer core substrate with a thick conductive layer using the multilayer core substrate as a core substrate.

This multilayer printed wiring board will be described with reference to FIG. 35. In the multilayer printed wiring board 10, a multilayer core substrate 30 is used. An interlayer insulation layer 50 in which via holes 60 and conductor circuits 58 are formed and an interlayer insulation layer 150 in which via holes 160 and conductor circuit 158 are formed are disposed on a signal circuit 34S, a power source circuit 34P and a grounding circuit 34E on the surface of the multilayer core substrate 30. Solder resist layer 70 is formed above the via hole 160 and the conductor circuit 158 and bump 76U, 76D are formed in the via hole 160 and conductor circuit 158 through an opening portion 71 of the solder resist layer 70.

The power source circuit 34P above the multilayer core substrate 30 is formed as a plain layer for power source and a grounding circuit 34E located below is formed as a plain layer for grounding. Further, a grounding circuit 16E as an inner layer and a dummy land 16D extending from a power source through hole 36THP are formed on the front surface side inside the multilayer core substrate 30 and on the rear surface side thereof are formed a power source circuit 16P and a dummy land 16D extending from a grounding through hole 36THE. The dummy land refers to a conductor circuit extending from a through hole, meaning a wiring pattern not conductive with other wiring in the same layer or wiring pattern (16D1 in FIG. 36(A)) connecting the same potential electrically. The grounding circuit 16E located above is formed as a plain layer for grounding and the power source circuit 16P located below is formed as a plain layer for power source. FIG. 36(A) shows a sectional view taken along X4-4 in FIG. 35 and FIG. 36(B) shows a sectional view taken along X5-X5. A through hole 36 is provided to connect the front and rear surfaces of the multiplayer core substrate 30. The dummy land 16D is provided around a through hole 36 not connected to the grounding circuit 16E and the power source circuit 16P. A non-conductor forming portion (non-conductor forming portion cavity 35) for securing insulation between the dummy land and other wiring pattern exists around the dummy land. If a through hole having the same potential is located at a neighboring position as shown in FIG. 36(A), dummy lands 16D1 formed together around the through holes may be formed depending on a case.

By thickening the grounding circuits 16E, 16P of the multilayer core substrate 30 in the multilayer printed wiring board having such a structure, it has been made evident that of IC voltage drops which occur multiple times after the switch is turned ON, a third voltage drop is improved. However, it has been made evident that first and second voltage drops are not improved largely.

The second invention has been achieved to solve the above-mentioned problem and an object of the invention is to propose a multilayer printed wiring board which enables to construct an IC chip in high frequency region, particularly a printed substrate or a packaged substrate in which no malfunction or error occurs even if 3 GHz is exceeded, particularly to improve the first and second voltage drops of voltage drops which occur after the switch is turned ON.

Means for Solving the Problem

FIRST INVENTION

As a result of accumulated researches for achieving the above-mentioned object, the inventor and other people have reached the first invention having a following content as its configuration. That is, according to a first invention, there is provided a multilayer printed wiring board in which interlayer insulation layer and conductive layer are formed on a core substrate so as to achieve electric connection through via holes, at least one of sums of thicknesses of conductive layers for power source or for grounding of a core substrate is larger than the thicknesses of the conductive layers on interlayer insulation layer.

The feature of the present invention exists in using a multilayer core substrate as the core substrate and not increasing the thickness of conductive layer only on the front and rear surfaces of the core substrate but increasing the sum of respective conductive layers. In case of the multilayer core substrate, the total thickness of the conductive layers on the front and rear surfaces of the core substrate and conductive layer in the inner layer is a thickness for contributing to supply of power to the IC and stabilization thereof. This case is applied when electric connection exists between the conductive layer on the front surface layer and the conductive layer in the inner layer while the electric connections are secured at two or more positions. That is, by adopting the multilayer structure to increase the sum of the thicknesses of the respective conductive layers of the multilayer core substrate and using the conductive layer of the core as a conductive layer for power source, the capacity of supply of power to the IC chip can be improved. Further, by using the conductive layer of the core as a grounding layer, noise which overlaps a signal or power of the IC chip can be reduced and power can be supplied stably to the IC. Thus, when an IC chip is mounted on the multilayer printed substrate, loop inductance from the IC chip to the substrate to power source can be reduced. Thus, shortage of power at the initial operation decreases so that the shortage of power becomes unlikely to occur and thus, even if the IC chip for high frequency region is mounted, malfunction or error at the initial startup is not induced. Further, noise is reduced thereby generating no malfunction or error.

Further, by adopting the multilayer core substrate, the thickness of the respective conductive layers of the multilayer core substrate can be decreased while securing the sum of the thicknesses of the conductive layers of the multilayer core substrate. That is, because an insulation interval between the wiring patterns can be surely secured even if a fine wiring pattern is formed, it is possible to provide a printed wiring board having a high insulation reliability.

As other effect, by increasing the thickness of the conductive layer for power source or grounding of the core substrate, the strength of the core substrate is intensified. Even if the core substrate itself is thinned, warpage or generated stress can be relaxed in the substrate itself.

Further, even if the power is supplied to the IC chip via the IC chip—the substrate—capacitors or the power supply layer—power, the same advantage can be exhibited. The loop inductance can be decreased. For this reason, no loss occurs to the supply of power to the capacitors or dielectric layers. In the first place, the IC chip performs complex arithmetic processings and operations while instantaneously consuming power. By supplying power from the power supply layer to the IC chip, it is possible to supply the power without the need to mount many capacitors even if the IC chip in a high frequency range is mounted and power shortage (a state of the occurrence of voltage drop) occurs in the initial operation. Power shortage (voltage drop) in the initial operation occurs so as to employ the IC chip in the high frequency range. If the conventional IC chip is used, the necessary power is sufficiently supplied by the capacity of the capacitors or dielectric layers.

Particularly if the total thickness of the conductor layers serving as the power supply layers of the core substrate is larger than the thickness of the conductor layer on the interlayer insulating layer on each surface or both surfaces of the core substrate, the three advantages stated above can be maximized. The conductor layer on the interlayer insulating layer means herein a conductor layer formed on an interlayer resin insulating layer of build-up part of the build-up printed circuit board (In the present invention, 58, 158 in FIG. 8)

The power supply layer of the core substrate may be arranged on the surface layer or inner layer of the substrate or on each of the surface layer and the inner layer. If the power supply layer is formed on the inner layer, a plurality of layers of two or more may be arranged. Basically, as long as total thickness of the power supply layers of the core substrate is thicker than the conductor layer of the interlayer insulating layer, the advantage of the power supply layer can be exhibited.

It is, however, preferable to form the power supply layer on the inner layer. If it is formed on the inner layer, the power supply layer is arranged between the IC chip and the external terminals or capacitors. Due to this, the distances between the IC chip and the external terminals or capacitors are uniform, which decreases hampering factors and can suppress power shortage.

Further, according to the present invention, a multilayer printed wiring board having an interlayer insulating layer and a conductor layer formed on a core substrate, the conductor layer being electrically connected through a via hole, is characterized in that if a total thickness of the conductor layers on said core substrate is $\alpha 1$ and a thickness of the conductor layer on the interlayer insulating layer is $\alpha 2$, $\alpha 1$ and $\alpha 2$ satisfy $\alpha 2 < \alpha 1 \leq 40\alpha 2$.

At $\alpha 1 \leq \alpha 2$, the advantage against the power shortage is not exhibited at all. That is, it is not clear that the voltage drop which occurs in the initial operation is suppressed.

A case in which a1 exceeds $40\alpha 2$ ($\alpha 1 > 40\alpha 2$) has been also considered. However, the electrical characteristics of a1 are basically equal to those of $40\alpha 2$. That is, it is understood that $40\alpha 2$ is a critical point of the advantage of the present application. Even if $\alpha 1$ is larger than $40\alpha$, the improvement of the electrical advantage cannot be expected. Nevertheless, if $\alpha 1$ exceeds $40\alpha$ and the conductor layer is formed on the surface layer of the core substrate, it is difficult to form lands or the like for the connection of the conductor layer to the core substrate. If the further upper interlayer insulating layer is formed, irregularities grow and waviness sometimes occurs to the interlayer insulating layers and impedances cannot be matched. However, that range ($\alpha 1 > 40\alpha 2$) does not often cause any problem depending on the materials.

It is more preferable that a1 satisfies $1.2\alpha 2 \leq \alpha 1 \leq 40\alpha 2$. It is confirmed that the malfunction, error or the like of the IC chip due to the power shortage (voltage drop) does not occur.

The core substrate means herein a resin substrate the core material of which, such as glass epoxy resin, is impregnated, a ceramic substrate, a metal substrate, a composite core substrate using a combination of resin, ceramic and metal, a substrate having a (power supply) conductor layer provided on the inner layer of the substrate, a multilayer core substrate having three or more conductor layers formed thereon, or the like.

To make the total thickness of the conductor of the power supply layers thick, the conductor layer may be formed on the substrate buried with metal by an ordinary method in relation to the printed wiring board for forming the conductor layer by plating, sputtering or the like.

Further, according to the present invention, a multilayer printed wiring board having an interlayer insulating layer and a conductor layer formed on a core substrate, the conductor layer being electrically connected through a via hole, is characterized in that if a total thickness of the conductor layers for earth on said core substrate is $\alpha 3$ and a thickness of the conductor layer on the interlayer insulating layer is $\alpha 2$, $\alpha 3$ and $\alpha 2$ satisfy $\alpha 2 < \alpha 3 \leq 40\alpha 2$.

In the range, the noise on the signal power supply to the IC chip can be reduced. The power supply to the IC has high reliability. In the rage of $1.2\alpha 2 < \alpha 3 \leq 40\alpha 2$, the advantage can be improved.

In case of a multilayer printed wiring board having a plurality of layers made of materials equal in thickness and built up, the layer having the power supply layer as the conductor layer on the printed board or the substrate is defined as the core substrate.

It is also preferable that the multilayer core substrate is such that a relatively thick conductor layer is provided on the inner layer, a relatively thin conductor layer is provided on the surface layer and that the conductor layer on the inner layer is a conductor layer mainly for a power supply layer or an earth. (Relatively thick and relatively thin mean herein that if the thicknesses of all the conductor layers are compared and there are a relatively thick layer and a relatively thin layer, then the inner layer is relatively thick to the other conductor layers and the surface layer is relatively thin.) The surface conductive layer can be used as the power supply of the earth, one surface layer can be used as the power supply and the other surface can be used as the earth.

Namely, by arranging the thick conductor layer on the inner layer side, it is possible to form the resin layer to cover the conductor layer on the inner layer and ensure the flatness of the core even if the thickness of the thick conductor layer is arbitrarily changed. Due to this, waviness does not occur to the conductor layer of the interlayer insulating layer. Even if the thin conductor layer is arranged on the surface layer of the multilayer core substrate, it is possible to secure a sufficient thickness of the conductor layers as those of the core by adding together the thicknesses of the thin conductor layer and the conductor layer on the inner layer. By employing the conductor layers for power supply layers or earth layers, it is possible to improve the electrical characteristics of the multilayer printed wiring board.

In case of a multilayer core substrate, it is preferable that the conductor layer on the inner layer is made relatively thick and used as a power supply layer, and that the conductor layers on the surface layer are formed to put the conductor layer on the inner layer therebetween and used as signal lines. With this structure, it is possible to intensify power as described above.

Furthermore, by arranging the signal line between the conductor layers in the core substrate, it is possible to form a micro-strip structure. Due to this, it is possible to decrease inductance and to match impedances to one another. It is thereby possible to stabilize the electric characteristics of the multilayer printed wiring board. It is further preferable that the conductor layer on the surface layer is relatively thin. The through hole pitch of the core substrate may be not more than 600 μm.

It is preferable that the multilayer core substrate is constituted so that the conductor layer on the inner layer is formed on the each surface of the metallic plate electrically connected to the conductor layer through a resin layer and that the conductor layer on the surface is formed outside of the inner layer conductor layer through a resin layer. By arranging the electrically insulated metallic plate in the central portion, it is possible to secure sufficient mechanical strength. Further, by forming the inner layer conductor layer on each surface of the metallic plate through the resin layer and forming the surface conductor layer outside of the inner layer conductor layer through the resin layer, it is possible to impart symmetry to the both surfaces of the metallic plate and to prevent the occurrence of warps, waviness and the like in a heat cycle and the like.

The multilayer core substrate may be constituted so that the conductor layer on the inner layer is formed on the each surface of the metallic plate, low coefficient of thermal expansion metal like a 36 alloy or 42 alloy, electrically connected to the conductor layer through an insulating layer and that the conductor layer on the surface is formed outside of the inner layer conductor layer through an insulating layer. By arranging the electrically insulated metallic plate in the central portion, it is possible to bring close the coefficient of thermal expansion in X-Y direction on the printed circuit board and the IC thereof. A small part heat cycle character of the resin layer of the interference between the printed circuit board and the IC can be improved. Further, by forming the inner layer conductor layer on each surface of the metallic plate through the insulating layer and forming the surface conductor layer outside of the inner layer conductor layer through the insulating layer, it is possible to impart symmetry to the both surfaces of the metallic plate and to prevent the occurrence of warps, waviness and the like in a heat cycle and the like.

In FIG. 10, the vertical axis indicates voltage supplied to the IC chip and the horizontal axis indicates passage of time. In FIG. 10, printed wiring boards without capacitors for the power supply of IC chip with high frequency of 1 GHz or higher are used as models. A curve A shows the change of the voltage to an IC chip with 1 GHz with the passage of time, and a curve B shows the change of the voltage to an IC chip with 3 GHz with the passage of time. According to each voltage change with time, when the IC chip starts to be actuated, a large quantity of power may be instantaneously required. If the supply of power is insufficient, voltage drops (at point X or X'). Thereafter, the power to be supplied is gradually added, so that the voltage drop is eliminated. However, if the voltage drops, malfunction or error tends to occur to the IC chip. That is, a defect caused by the insufficient function or actuation of the IC chip due to lack of the supply of power occurs. This power shortage (voltage drop) grows as the frequency of the IC chip is higher. Due to this, it takes time to solve the voltage drop problem and a time lag occurs in allowing the IC to perform a desired function or actuating the IC.

To compensate for the power shortage (voltage drop), the IC chip is connected to an external capacitor and the power accumulated in the capacitor is discharged, whereby the power shortage or voltage drop problem can be solved.

In FIG. 11, printed boards with capacitors are used as models. A curve C shows the change of the voltage to the IC chip with 1 GHz with the passage of time if a small capacity of a capacitor is mounted on the board. Compared with the curve A which shows a case where the capacitor is not mounted, the degree of the voltage drop of the curve C is low. Further, a curve D shows the change of the voltage to the IC with the passage of time similarly to the curve C if a capacitor larger in capacity than the capacitor mounted in case of the curve C. Compared with the curve C, the degree of the voltage drop of the curve D is lower. Thus, in case of the curve D, it is possible to function and actuate a desired chip in short time. However, as shown in FIG. 10, if the frequency of the IC chip is higher, a larger capacity of the capacitor may be required. As a result, the region on which the capacitor is mounted needs to be established. Therefore it is difficult to secure the voltage, it is impossible to improve the operation and function of the IC chip and it is difficult to improve the density of the IC chip.

FIG. 12 is a graph if the total thickness of the conductor layers for power supply of the multilayer core substrate is $\alpha 1$ and that of the conductor layer on the interlayer insulating layer is $\alpha 2$. In FIG. 12, a curve C shows the change of the voltage with the passage of time if a small capacity of a capacitor is mounted on an IC chip with 1 GHz and $\alpha 1 = \alpha 2$. A curve F shows the change of the voltage with the passage of time if a small capacity of a capacitor is mounted on the IC chip with 1 GHz and $\alpha 1 = 1.5 \alpha 2$. A curve E shows the change of the voltage with the passage of time if a small capacity of a capacitor is mounted on the IC chip with 1 GHz and $\alpha 1 = 2.0 \alpha 2$. As the total thickness of conductor layers of the core is thicker, the power shortage or voltage drop becomes lower. Due to this, it may be said that the malfunction of the IC chip less occurs. By making the total thickness of the conductor layers for the power supply of the core substrate thick, the volumes of the conductor layers increase. If the volumes increase, the conductor resistances decrease, so that the loss of the power to be transmitted to the voltage or current is eliminated. As a result, power is supplied while the transmission loss between the IC chip and the power supply is lowered, no malfunction or error occurs to the IC chip. This is mainly thanks to the total thickness of the conductor layer as the power supply layer; by making the total thickness the conductor layer as the power supply layer of the core substrate thicker than that on the other interlayer insulating layer, the advantage can be exhibited.

Furthermore, even if the core substrate includes electronic components such as capacitors, dielectric layers or resistances, this advantage is conspicuously exhibited. By including the electronic components in the substrate, it is possible to shorten the distance between the IC chip and each capacitor or dielectric layer. It is, therefore, possible to decrease the loop inductance. It is possible to decrease the power shortage or voltage drop. In case of the core substrate including therein capacitors or dielectric layers, for example, by making the thicknesses of the conductor layers of the core substrate and the conductor layers as the power supply layer larger than the conductor layers on the interlayer insulating layers, it is possible to decrease the resistances of the conductors of both the main power supply and the power of the included capacitors or dielectric layer, thereby making it possible to decrease transmission loss and to further exhibit the advantage of the substrate including therein capacitors.

As the core substrate, the resin substrate is employed. However, it is discovered that the ceramic or metal core substrate exhibits the same advantage. As the material of the conductor layer, copper is employed. Even if the other metals are employed, it is not confirmed that the advantage is cancelled and malfunction or error occurs to the IC chip. It, therefore, appears that the advantage is not influenced by the difference in the material of the core substrate or the difference in the material of the conductor layers. It is more preferable that the conductor layers of the core substrate and those of the interlayer insulating layer are made of the same metal. This is because the advantages of the present application can be exhibited since there is no difference in such characteristics as electrical characteristics and the coefficient of thermal expansion and physical properties between the conductor layers of the core substrate and those of the interlayer insulating layers.

EFFECT OF THE FIRST INVENTION

According to the first invention, resistance of conductor from the IC chip to the substrate to the power source can be reduced thereby transmission loss being reduced. Consequently, transmitted signal or power can exert its own specified capacity. As a result, the function and operation and the like of the IC chip are executed normally, so that no malfunction or error occurs. Resistance of conductor from the IC chip to the substrate to grounding can be reduced, so that overlapping of noise on a signal line and power line is reduced, thereby preventing malfunction and error.

Further, according to the first invention, it is evident that the degree of the shortage of power (voltage drop) generated at the time of initial startup of the IC chip decreases and that even if an IC chip for high frequency region, particularly an IC chip of 3 GHz or more is mounted, it can be started without any problem. Thus, the electric characteristic and electric connectivity can be improved.

By forming the core substrate into a multilayer structure to increase the sum of thicknesses of the conductive layers, a printed wiring board having an excellent insulation reliability can be obtained.

Resistance of a circuit of the printed substrate can be reduced as compared with a conventional printed substrate. Thus, if reliability test (high temperature, high humidity bias test) is carried out under high temperatures and high humidity by applying bias, it takes longer to destroy and therefore the reliability can be improved.

Further, because resistance of the conductive layer for power source lowers, heat generation can be suppressed even if a large amount of electricity flows. The same thing can be said of the grounding layer. From this point of view, malfunction is unlikely to occur and the reliability of the printed wiring board after the IC is mounted is increased.

SECOND INVENTION

As a result of accumulated researches for achieving the above-mentioned object, as the second invention, the inventor of the present invention and other people have reached an invention having a content described below as composition elements. That is, according to the second invention, there is provided a printed wiring board in which interlayer insulation layer and conductive layer are formed on multilayer core substrate composed of three or more layers, having a plurality of through holes for connecting the front surface with the rear surface and conductive layers on the front and rear surfaces and conductive layer in the inner layer so as to achieve electric connection through via holes, the plurality of through holes being composed of a plurality of power source through holes, a plurality of grounding through holes and a plurality of signal through holes connected electrically to a power source circuit or a grounding circuit or a signal circuit of an IC chip, when the power source through holes pass through the grounding conductive layer of the inner layer in the multilayer core substrate, of the plurality of power source through holes, at least a power source through hole just below the IC or 70% or more power source through holes having no conductive circuit extending from the power source through hole in the grounding conductive layer, or/and when the grounding through holes pass through the power source conductive layer of the inner layer in the multilayer core substrate, of the plurality of grounding through holes, at least a grounding through hole just below the IC or 70% or more grounding through holes having no conductive circuit extending from the grounding through hole in the power source conductive layer.

However, all the through holes just below the IC do not need to be formed as through holes having the above-mentioned feature and the present invention may be applied to part of the through holes.

That is, in this case, there is provided a printed wiring board in which interlayer insulation layer and conductive layer are formed on multilayer core substrate composed of three or more layers, having a plurality of through holes for connecting the front surface with the rear surface and conductive layers on the front and rear surfaces and conductive layer in the inner layer so as to achieve electric connection through via holes, the plurality of through holes being composed of a plurality of power source through holes, a plurality of grounding through holes and a plurality of signal through holes connected electrically to a power source circuit or a grounding circuit or a signal circuit of an IC chip, when the power source through holes pass through the grounding conductive layer of the inner layer in the multilayer core substrate, of the plurality of power source through holes, part of power source through holes just below the IC having no conductive circuit extending from the power source through hole in the grounding conductive layer, and when the grounding through holes pass through the power source conductive layer of the inner layer in the multilayer core substrate, of the plurality of grounding through holes, part of the grounding through holes just below the IC having no conductive circuit extending from the grounding through hole in the power source conductive layer.

Another feature of the present invention exists in that the power source through holes having no conductor circuit extending from the power source through hole in the grounding conductive layer and the grounding through holes having no conductor circuit extending from the grounding through hole in the power source conductive layer are disposed in the form of a grid or in the staggered fashion. In this case, preferably, the power source through holes and the grounding through holes are disposed alternately.

Hereinafter, the power source through hole having no conductor circuit extending from the power source through hole in the grounding conductive layer is called power source through hole having no dummy land. The grounding through hole having no conductor circuit extending from the grounding through hole in the power source conductive layer is called grounding through hole having no dummy land or just through hole having no dummy land.

Still another technological feature exists in that relative to the thickness $\alpha 2$ of the conductive layer on the interlayer insulation layer, the sum $\alpha 1$ of the thicknesses of the power source conductive layers in the multilayer core substrate is in a relation of $\alpha 2 < \alpha 1 \leqq 40\alpha 2$.

Still another technological feature exists in that relative to the thickness $\alpha 2$ of the conductive layer on the interlayer insulation layer, the sum $\alpha 3$ of the thicknesses of the grounding conductive layers in the multilayer core substrate is in a relation of $\alpha 3 < \alpha 1 \leqq 40\alpha 2$.

EFFECT OF THE SECOND INVENTION

According to the second invention, of the power source or/and grounding through holes, those just below the IC or 70% or more through holes have no dummy land in the inner layer of the multilayer core substrate.

As a first effect of the second invention, the interval of the through holes is at a small pitch, thereby achieving fine arrangement of the through holes. As a consequence, the printed wiring board can be constructed in a small size.

Because as a second effect, the interval between the power source through hole and the grounding through hole can be set small, mutual inductance can be reduced. Thus, the shortage of power due to voltage drop of the first time and the second time at the initial operation of the IC is reduced. The shortage of power becomes unlikely to occur and thus, even if an IC chip for a high frequency region is mounted, malfunction or error at the initial startup become unlikely to occur.

Because as a third effect, the length of wiring for supplying power to a transistor of the IC shortens, the voltage drop in the IC is unlikely to occur. Contrary to this, in the multilayer printed wiring board having a dummy land, the length of the wiring for supplying power to the transistor of the IC lengthens. The reason is that because electricity likely flows on the surface of a conductor, the wiring length when any dummy land is possessed is a sum of the wiring length of the through hole with the wiring length on the surface of the dummy land.

The same effect arises even if a through hole having no dummy land is part of a section just below the IC. The reason is that because electricity flows through wiring having a small resistance preferentially, even if the through holes having no dummy land exist partially, power can be supplied to the transistor of the IC through the through holes having no dummy land. However, the power source through holes and grounding through holes having no dummy land are preferred to be 30% or more all the power source through holes and grounding through holes, more preferred to be 50% or more. If the quantity of through holes having no dummy land is small, electricity is concentrated to such through holes and thus, the effect of the present invention becomes small.

Further, the power source through holes having no dummy land and the grounding through holes having no dummy land are preferred to be disposed in the form of a grid or in the staggered fashion. In this case, they are preferred to be disposed alternately. The reason is that because mutual inductance decreases, supply of power to the transistor of the IC is executed in a short time.

As a fourth effect, conductor area of the power source layer and grounding layer in the inner layer of the multilayer core can be secured in a large quantity and thus, the conductor resistance of the both conductive layers decreases, the supply of power to a transistor of the IC is carried out smoothly. The reason is that because no dummy land exists, a power source layer or grounding layer can be formed in the vicinity of the through hole (see FIG. 37). Because if comparing the surrounding of a through hole V with the surrounding of a through hole W shown in FIG. 37, the W has no dummy land, conductive layer can be formed in the vicinity of the through hole so that more conductive layers are formed than in the surrounding of the V.

As a result of the above-mentioned effects, according to the multilayer printed wiring board of the present invention, even if simultaneous switching is executed, the transistor of the IC is unlikely to be short of power and thus, malfunction is hard to occur.

Further, the thicknesses of the conductive layers on the front and rear surfaces of the multilayer core substrate and the conductive layer in the inner layer are increased. Particularly, increasing the thickness of the conductive layer in the inner layer is preferable.

As this effect, the volume of the conductor itself can be increased by thickening the conductive layer. By increasing the volume, resistance in the conductor can be reduced. Thus, by using the conductive layer as a power source layer, the capacity of supply of power to the IC chip is improved. Further, by using the conductive layer as a grounding layer, noise which overlaps a signal to the IC chip and supplied power can be reduced. Thus, when the IC chip is mounted on the printed wiring board, inductance from the IC chip to the substrate to power source can be reduced and the voltage drop of the third time at the initial operation can be mainly improved. Further, as shown in FIG. 34, if the area (opposing area) and distance of a portion in which a through hole and conductive layer each having an opposite potential oppose each other increase, both of them approach each other, so that the voltage drop of the first time and second time are intensified further. Because the through hole has no dummy land, for example, a distance between the power source through hole having no dummy land and a grounding layer having an opposite potential decreases. Further, because the grounding layer is thick, an opposing distance between the power source through hole and the grounding layer increases. For the reason, the voltage drop can be improved more effectively than a multilayer printed wiring board just having no dummy land. The distance X shown in FIG. 34 is preferred to be 15 to 150 µm. The insulation reliability drops if it is less than 15 µm. On the other hand, if the distance exceeds 150 µm, the effect of improvement of the voltage drop decreases.

As described above, when a through hole passes through the inner layer having other potential in the multilayer core substrate, without providing dummy land in through holes just below the IC or 70% or more through holes, but by increasing the thickness of the conductor, main voltage drops (voltage drops from the first time to the third time) generated at the initial operation can be improved. Thus, even if a high frequency IC chip is mounted on the printed wiring board, no malfunction or error is induced at the initial startup.

Even if a through hole having no dummy land is part of a portion located just below the IC, the same effect is secured.

The structure of the multilayer core having no dummy land in the inner layer is effective for securing a sum ($\alpha 1$) of the thickness of the conductor in the core by increasing the thickness of the conductor in the inner layer more than the thickness of the conductive layer on the front and rear surfaces of the multilayer core substrate. The reason is that the conductive layer on the front and rear surfaces absolutely need a through hole land for securing electric connection with a built-up layer formed thereon. The reason is that if the conductive layer on the front and rear surfaces is thick, the interval between the through holes cannot be made into a small pitch because insulation interval between a through hole land and other through hole land or other conductor circuit needs to be enlarged to secure insulation reliability thereof. Further, if the thickness of conductor on the front and rear surfaces of the multilayer core substrate is thickened, interlayer insulation layer formed thereon swells, thereby disabling matching of impedance.

The total of the thickness of the conductive layer on the front surface of the multilayer core substrate and the conductive layer in the inner layer is a thickness of the conductive layer of the core. This applies to a case where the conductive layer on the front surface and the conductive layer in the inner layer are connected electrically and the electric connection is secured at two or more points. In the meantime, the area of a pad, land or the like is not a sufficient thickness even if the thickness of such a conductive layer is summed up. The conductive layer is preferred to be a power source layer or a grounding layer.

In this case, a multilayer core substrate composed of three layers (front surface and inner layer) is acceptable. A multilayer core substrate of three or more layers is also acceptable. It is permissible to use an electronic component accommodating multilayer core substrate formed by burying a capacitor, dielectric layer, resistor or the like in the inner layer of the multilayer core substrate as required.

Further, when the conductive layer in the inner layer of the multilayer core substrate is thickened, it is recommendable to dispose the conductive layer just below the IC chip. By disposing it just below the IC chip, the distance between the IC chip and the power source layer can be minimized thereby reducing inductance further. As a result, power is supplied more effectively, particularly, so as to eliminate the voltage drop of the third time. At this time also, assuming that the sum of the thicknesses of the conductive layers of the multilayer core substrate is $\alpha 1$ and the thickness of the conductive layer on the interlayer insulation layer is $\alpha 2$, it is preferable that the relation of $\alpha 2 < \alpha 1 \leq 40 \alpha 2$ exists.

The thickness of the conductive layer in the inner layer of the multilayer core substrate is set larger than the conductive layer on the interlayer insulation layer. As a result, even if a thin conductive layer is disposed on the front surface of the multilayer core substrate, a sufficient thickness can be secured as the conductive layer of the core by adding it to the thick conductive layer in the inner layer. That is, even if a large volume of power is supplied, it can start up without any problem and thus, no malfunction or operation failure occurs. At this time also, assuming that the sum of the thicknesses of the conductive layers in the multilayer core substrate is $\alpha 1$ and the thickness of the conductive layer on the interlayer insulation layer is $\alpha 2$, it is preferable that the relation of $\alpha 2 < \alpha 1 \leq 40 \alpha 2$ exists.

FIG. 28 shows changes in voltage of the IC with a passage of time since the power source is turned ON. The ordinate axis indicates the voltage of the IC while the abscissa axis indicates a time passage. FIG. 28 shows a result of using a printed wiring board equipped with a high frequency IC chip for 1 GHz or more and no capacitor for power source as a model. Its line B indicates changes in voltage to the IC chip of 1 GHz with a time passage and its line A indicates changes in voltage to the IC chip of 3 GHz with a time passage. In such changes with a time passage, a large amount of power may be required immediately when the IC chip is started. If the supply thereof is short, the voltage drops (points X, X': voltage drop of the first time). After that, the voltage rises temporarily and drops again (second voltage drop) and then rises further and drops (third voltage drop) and after that, the voltage rises gradually repeating a small amplitude. However, when the voltage drops, malfunction or error of the IC chip becomes likely to occur. That is, these are faults which occur because the function of the IC chip is operated or started sufficiently due to shortage of power supply. This shortage of power (voltage drop) increases as the frequency of the IC chip increases. Thus, it takes long to solve the voltage drop, so that a time lag occurs to carry out desired functions and startup.

FIG. 29 shows changes in the voltage of the IC with a time passage when a high frequency IC chip is mounted on a printed wiring board having conventional structure and a printed wiring board of the present invention. In the meantime, because the voltage of the IC could not be measured directly, a measuring circuit for the measurement was formed in the printed wiring board. A multilayer core A (conventional structure) is composed of four layers and all its through holes have a dummy land and the thickness of conductor of each layer for power source is 15 μm (the power source layers of the core substrate is composed of two layers and the thickness of conductor on the interlayer insulation layer is 30 μm). A multilayer core B is composed of four layers like A and has a power source conductive layer 15 μm thick on its front surface and 30 μm thick in the inner layer. The power source through hole just below the IC has no conductor circuit extending from the power source through hole in the grounding layer of the inner layer of the multilayer core and the grounding through hole just below the IC has no conductor circuit extending from the grounding through hole in the power source layer of the inner layer of the multilayer core. In case of C, the thickness of conductor of the inner layer in the multilayer core B is set to 75 μm. In the conductive layer of the multilayer core, the power source layer and ground layer are disposed alternately. The A, B, C are multilayer printed wiring boards in which the interlayer insulation layer and conductive layer are built up alternately on the above-mentioned multilayer core. As shown in FIG. 29, by adopting a multilayer core structure having no conductor circuit extending from a through hole of the present invention, it is evident that the voltage drops of the first and second time have been improved. For the reason, it can be said that occurrence of faults in function and operation of the IC chip decreases. Further, it is evident that the voltage drops of the first and second time have been improved by thickening the thickness of conductor in the inner layer. The same result as the thickness of 75 μm was secured when the thickness of the inner layer circuit was 40 to 150 μm.

According to the multilayer core substrate, its effect is exerted when the sum of the thicknesses of conductors in all layers is larger than the thickness of a conductive layer on the interlayer insulation layer even if the thickness of the conductive layers of power source layers in all layers of the multilayer core substrate is larger than the thickness of the conductive layer on the interlayer insulation layer or the thickness of the conductive layers of power source layers in all layers of the multilayer core substrate is equal to or lower than the thickness of the conductive layer on the interlayer insulation layer.

BRIEF DESCRIPTION OF THE DRAWINGS

FIG. 3 is a process diagram showing the manufacturing method of the multilayer printed wiring board according to the first embodiment-1;

FIG. 5 is a process diagram showing the manufacturing method of the multilayer printed wiring board according to the first embodiment-1;

FIG. 6 is a process diagram showing the manufacturing method of the multilayer printed wiring board according to the first embodiment-1;

FIG. 7 is a process diagram showing the manufacturing method of the multilayer printed wiring board according to the first embodiment-1;

FIG. 13 is a table showing test results of the first embodiment and the first comparative example;

FIG. 14 is a table showing a result of evaluation on the minimum line interval and line width forming capacity evaluation pattern of the first embodiment;

FIG. 15 is a table showing a test result of the first embodiment and first comparative example;

FIG. 16 is a table showing a test result of the first embodiment;

FIG. 19 is a process diagram showing the manufacturing method of the multilayer printed wiring board according to the second embodiment-1;

FIG. 25(A) is a plan view of a power source plain layer 16P in the inner layer in FIG. 22 and FIG. 25(B) is a plan view of a grounding plain layer 16E in the inner layer;

FIG. 26(A) is a plan view of a power source plain layer 16P in the inner layer in FIG. 22 and FIG. 26(B) is a plan view of a grounding plain layer 16E in the inner layer;

FIG. 30 is a table showing a test result of the second embodiment and the second comparative example;

FIG. 31(A) is a plan view of another kind of the power source plain layer 16P in the inner layer in FIG. 22 and FIG. 25(B) is a plan view of the grounding plain layer 16E in the inner layer;

FIG. 32 is a graph indicating the quantity of the through holes having no dummy land, with the quantity of the through holes having no dummy land on the abscissa axis and the value (V) of the voltage drop amount on the ordinate axis;

FIG. 33 is a table showing the relation between the thickness of the conductor in the inner layer and the voltage drops of the first time to third time;

FIG. 36(A) is a lateral sectional view taken along X4-X4 of the multilayer printed wiring board of FIG. 35 and FIG. 36(B) is a sectional view taken along X5-X5;

FIG. 37(A) is a plan view of the power source plain layer 16P in the inner layer and FIG. 37(B) is a plan view of the grounding plain layer 16E in the inner layer;

BEST MODES FOR CARRYING OUT THE INVENTION

A. Embodiment 1

Embodiment 1-1

Figure 1:
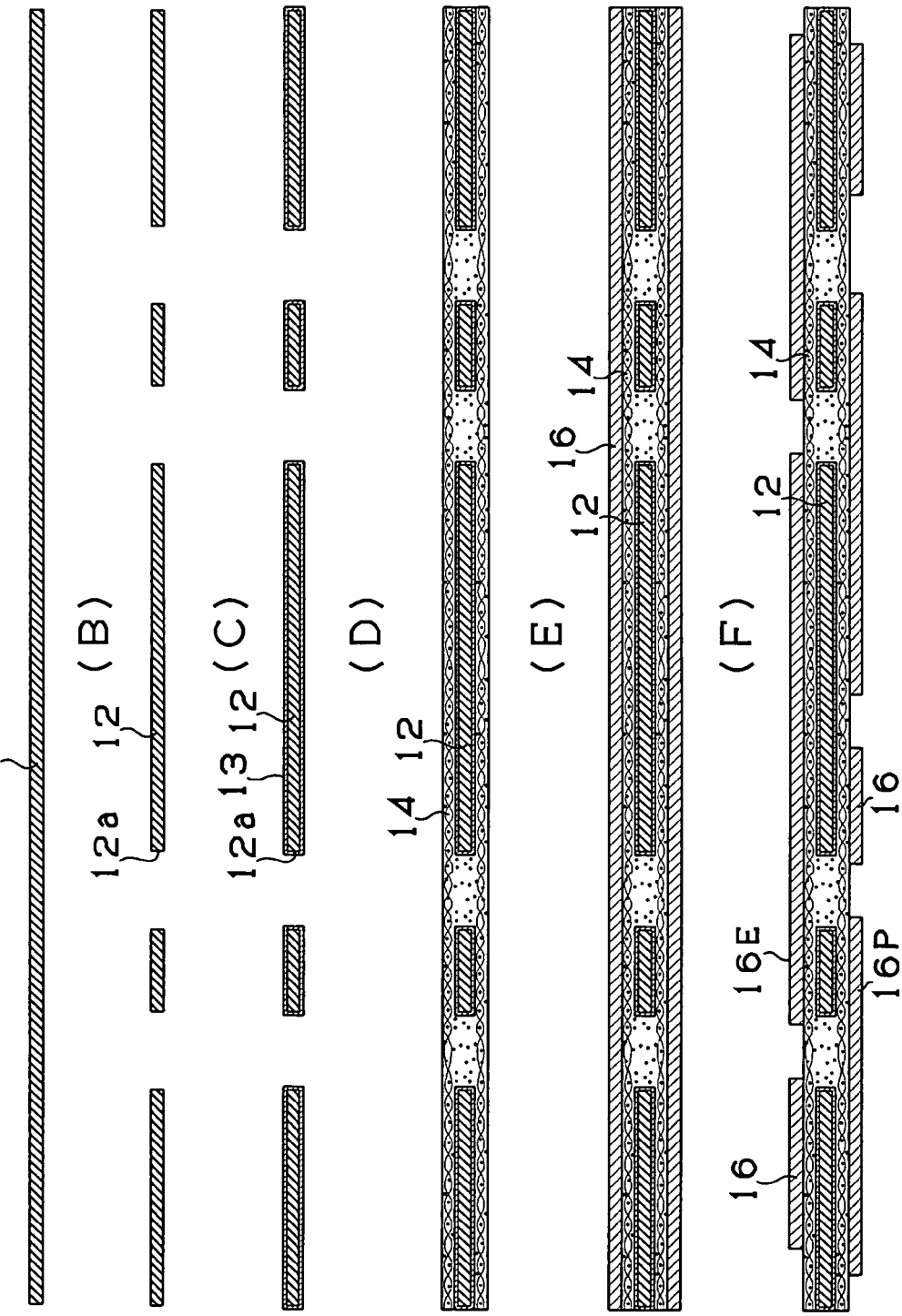
FIG. 1 is a process diagram showing the manufacturing method of the multilayer printed wiring board according to a first embodiment-1 of the present invention.
Figure 2:
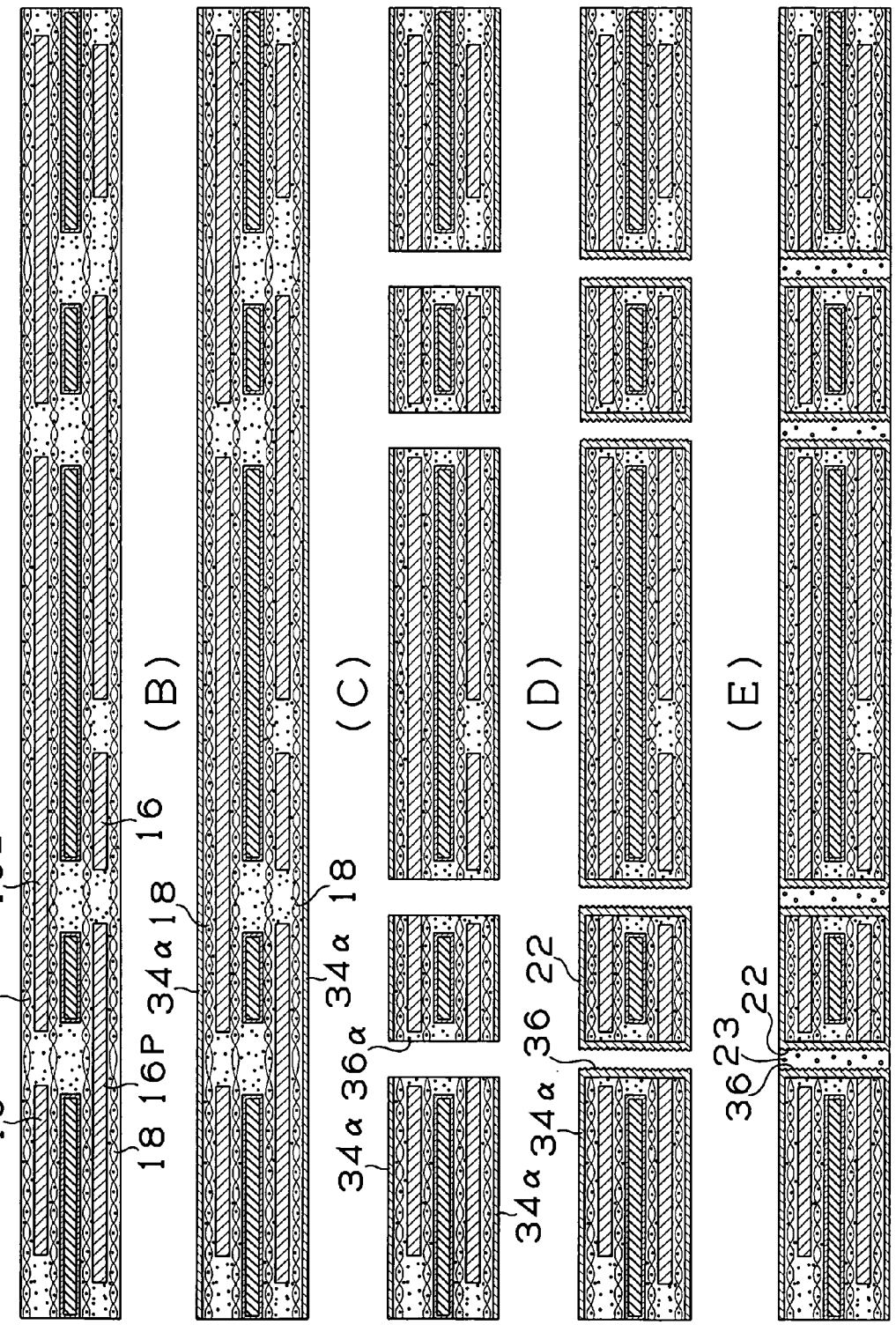
FIG. 2 is a process diagram showing the manufacturing method of the multilayer printed wiring board according to the first embodiment-1.
Figure 4:
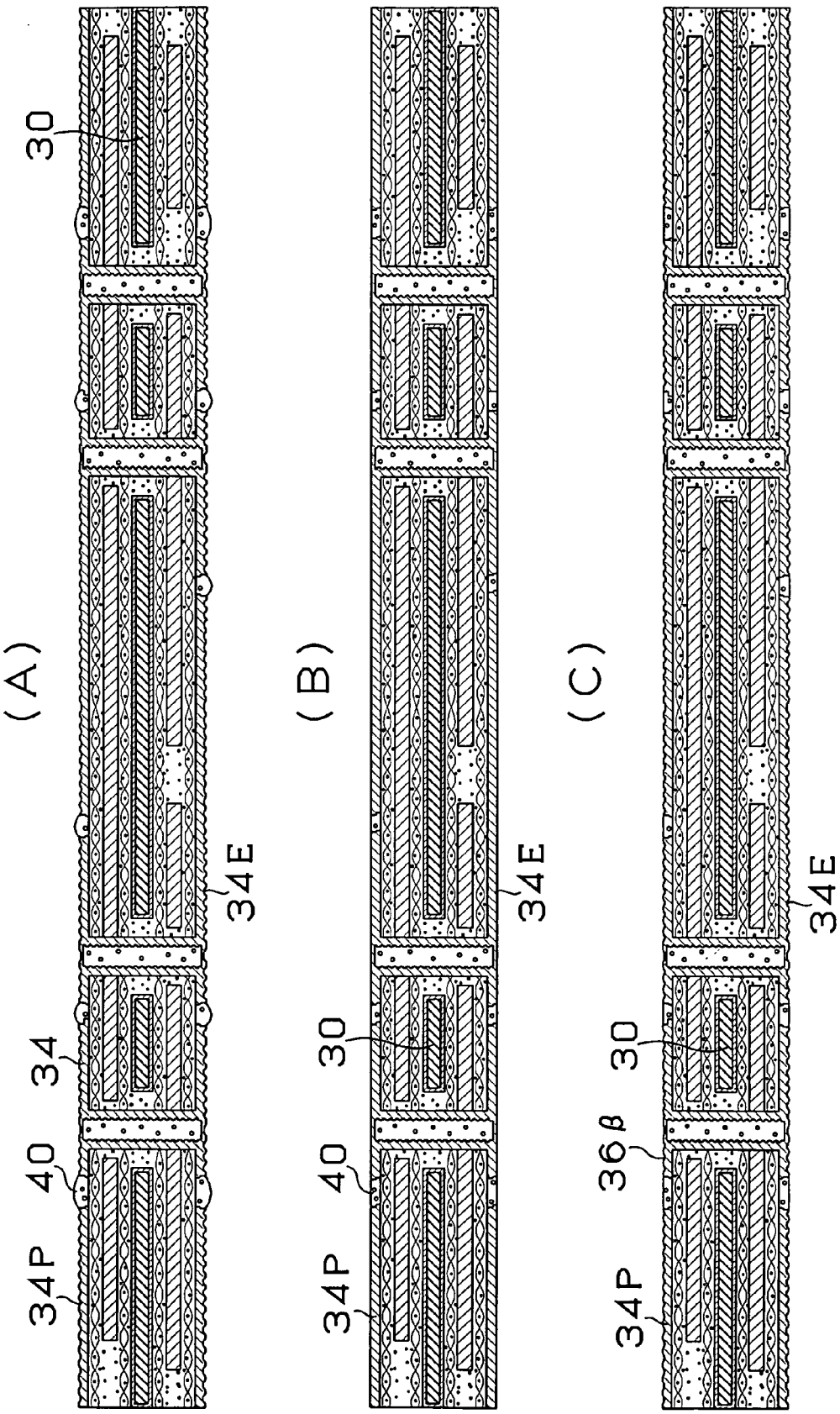
FIG. 4 is a process diagram showing the manufacturing method of the multilayer printed wiring board according to the first embodiment-1.
Figure 8:
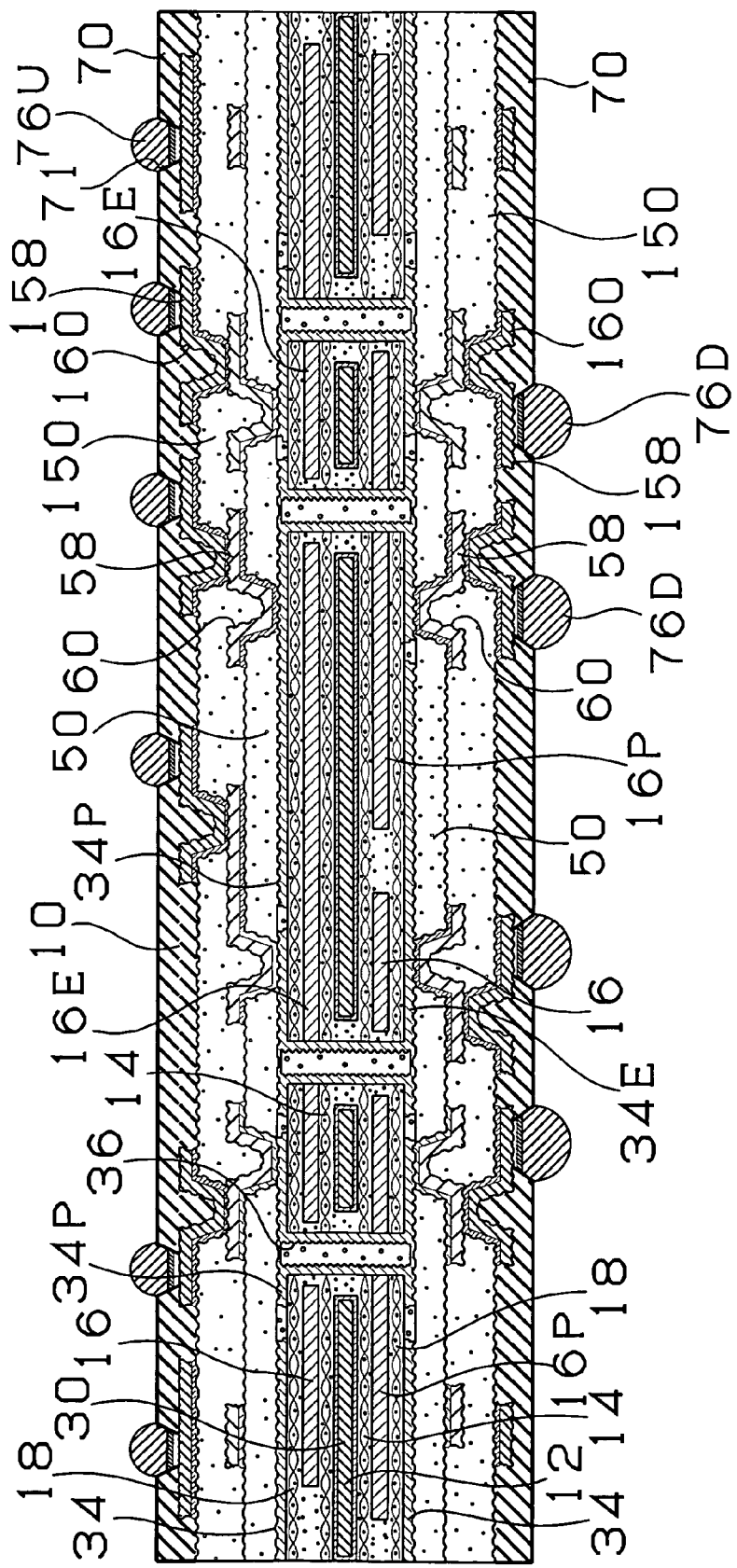
FIG. 8 is a sectional view of the multilayer printed wiring board according to the first embodiment-1.
Figure 9:
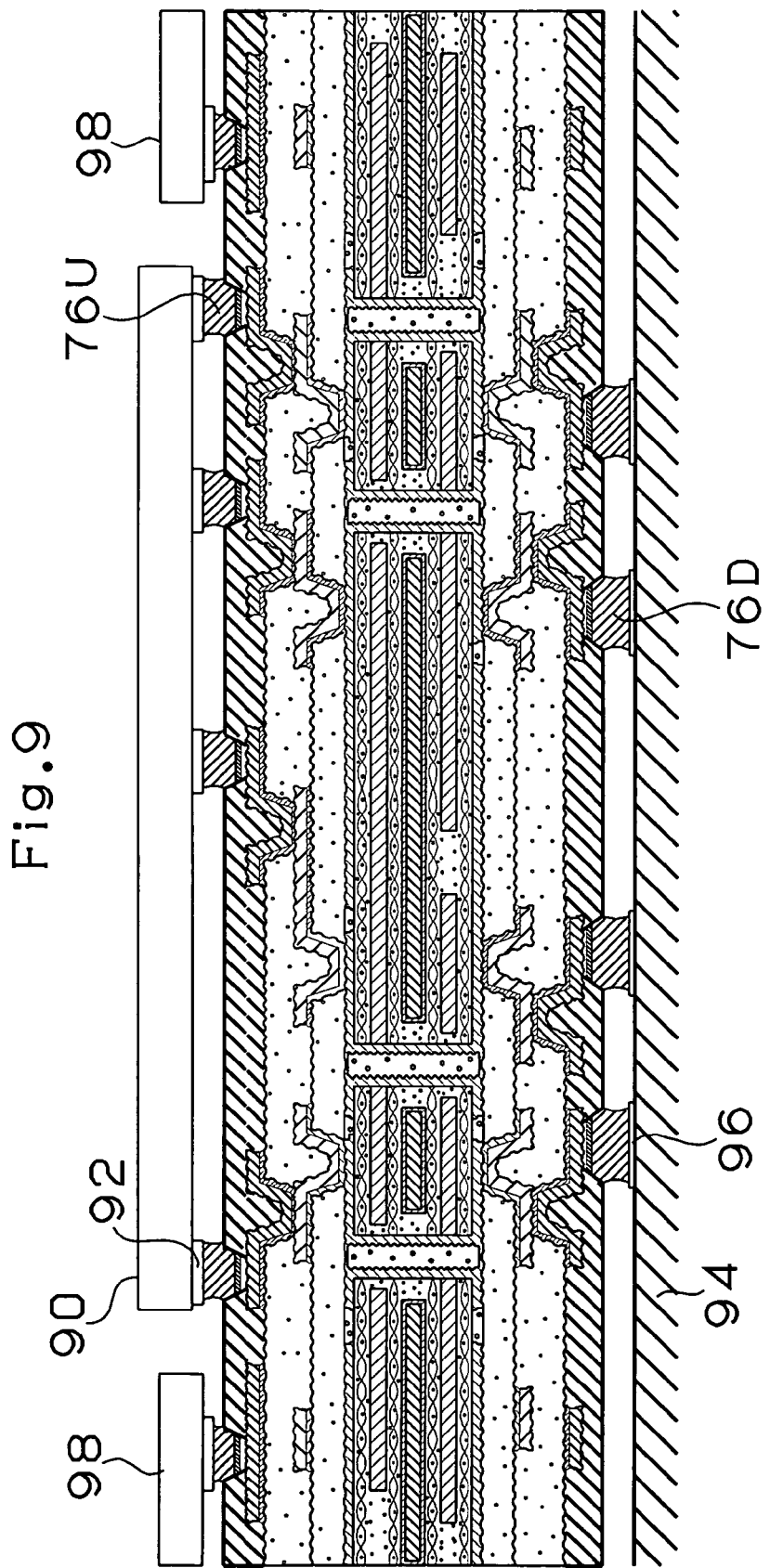
FIG. 9 is a sectional view showing a condition in which an IC chip is mounted on the multilayer printed wiring board according to the first embodiment-1.
Figure 10:
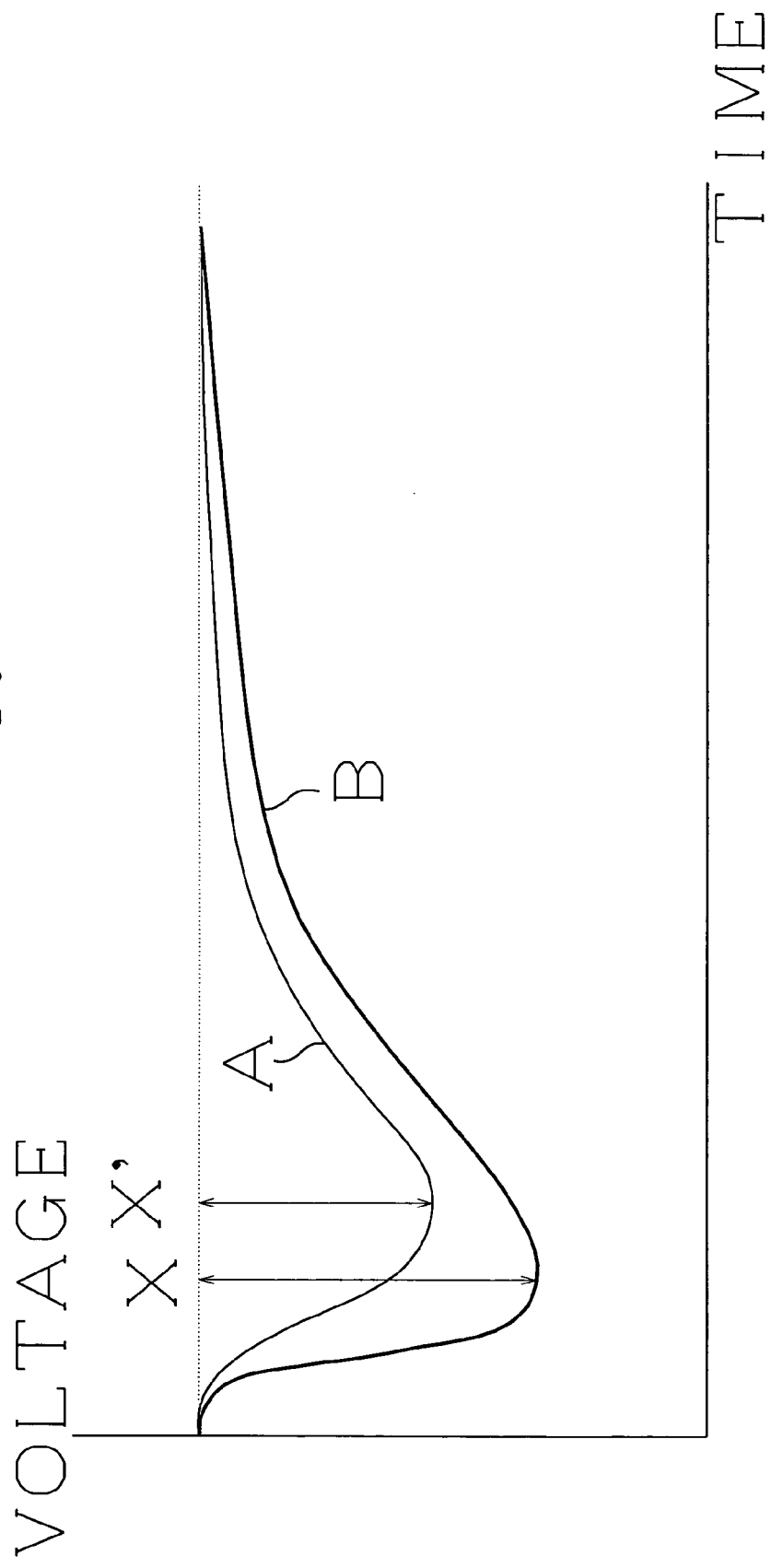
FIG. 10 is a graph showing changes in voltage during the operation of the IC chip.
Figure 11:
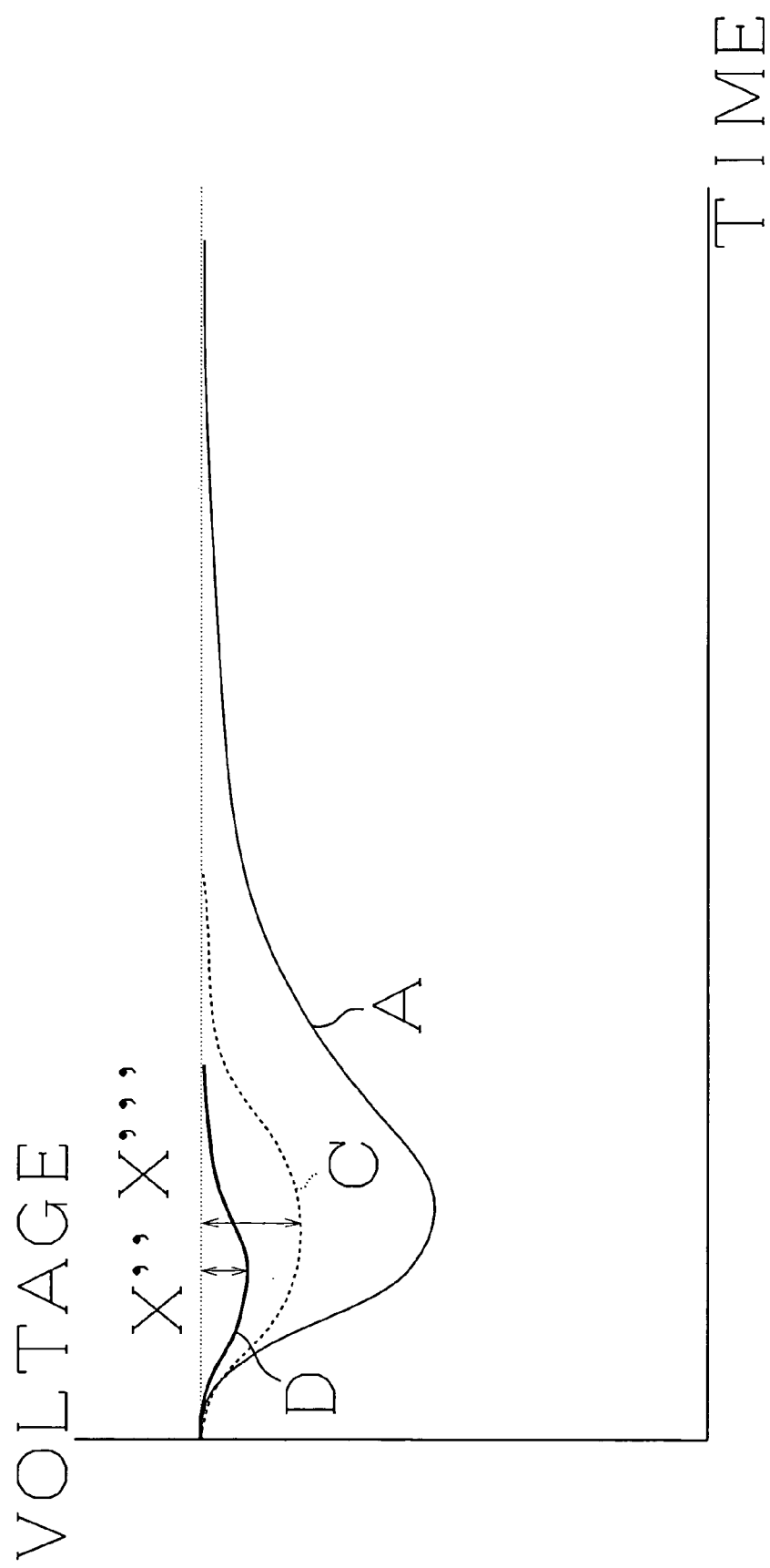
FIG. 11 is a graph showing changes in voltage during the operation of the IC chip.
Figure 12:
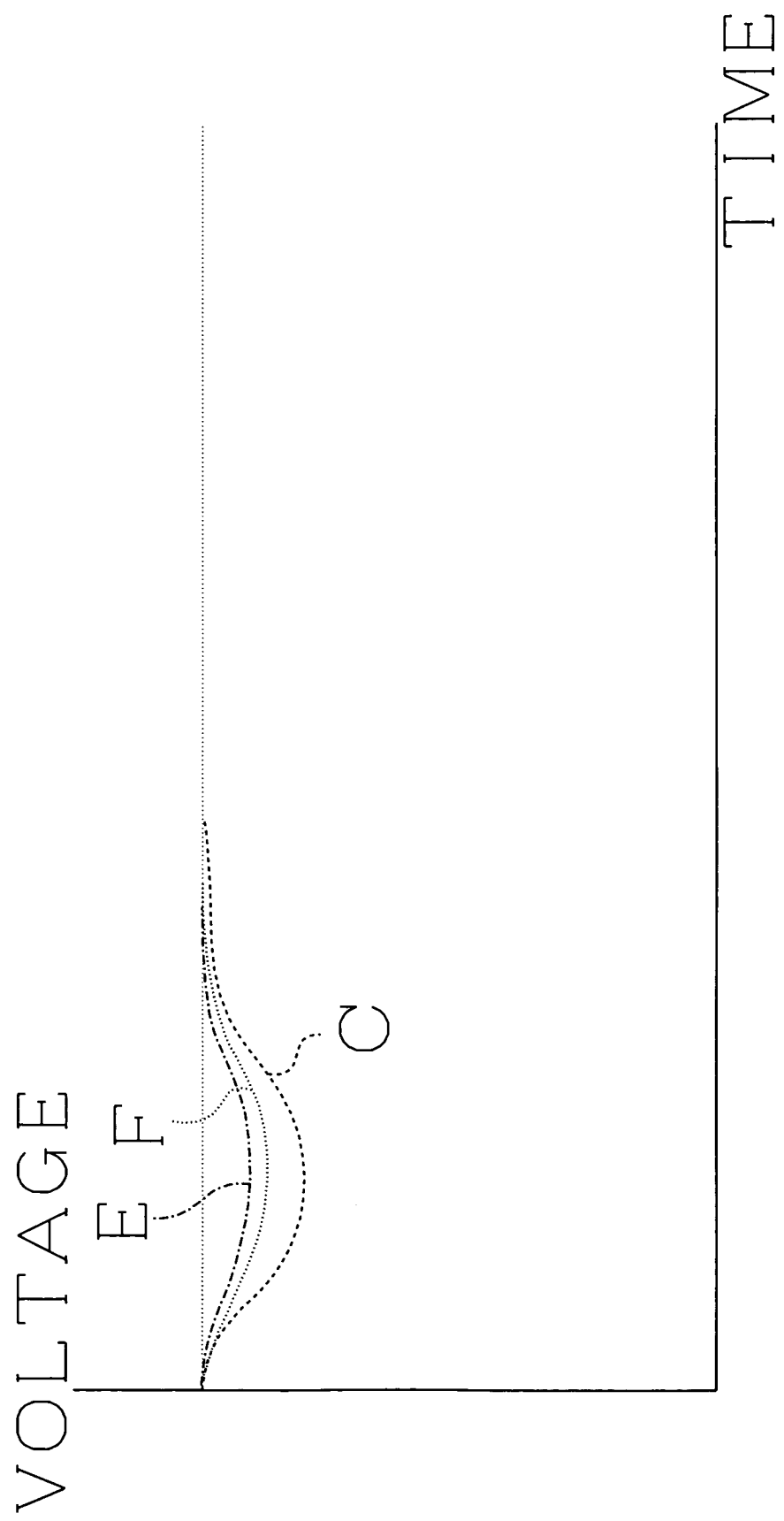
FIG. 12 is a graph showing changes in voltage during the operation of the IC chip.

A multilayer printed wiring board according to Embodiment 1-1 of the present invention will be described with reference to FIGS. 1 to 9. The configuration of a multilayer printed wiring board 10 according to Embodiment 1-1 will first be described with reference to FIGS. 8 and 9. FIG. 8 shows the cross section of the multilayer printed wiring board 10 and FIG. 9 shows a state in which an IC chip 90 is attached to the multilayer printed wiring board 10 shown in FIG. 8 and in which the board 10 is mounted on a daughter board 94. As shown in FIG. 8, a multilayer printed wiring board 10 employs a multilayer core substrate 30. A conductor circuit 34 and a conductor layer 34P are formed on the front surface of the multilayer core substrate 30 and a conductor circuit 34 and a conductor layer 34E are formed on the rear surface thereof. The upper conductor layer 34P is formed as a power supply plane layer while the lower conductor layer 34E is formed as an earth plane layer. Further, a conductor circuit 16 and a conductor layer 16E on the inner layer are formed on the inside surface of the multilayer core substrate 30 while a conductor circuit 16 and a conductor layer 16P are formed on the inside rear surface thereof. The upper conductor layer 16E is formed as an earth plane layer while the lower conductor layer 16P is formed as a power supply plane layer. Connection to the power supply plane layer is established by through holes or via holes. The plane layer may comprise a single layer formed on one side or comprise two or more layers. Preferably, the plane layer comprises two to four layers. Since it is not confirmed that the plane layer comprising five or more plane layers can improve electric characteristic, the electric characteristic of the plane layer comprising four or more layers is the same as that of the plane layer comprising four layers. The plane layer comprising five or more plane layers, the thickness of the core substrate ticks, the electronic character may become bad. Particularly if the plane layer comprising two layers, the expansion ratios of the substrate can be made uniform and warps less occur in terms of the rigidity matching of the multilayer core substrate. An electrically insulated metallic plate 12 is contained at the center of the multilayer core substrate 30. (Although the metallic plate 12 serves as a central material, it is not electrically connected to the through holes, via holes and the like. The metallic plate 12 mainly serves to improve the rigidity of the substrate 30 against warps.) A conductor circuit 16 and a conductor layer 16E are formed on the metallic plate 12 on the front surface side of the substrate 30 through an insulating resin layer 14 and a conductor circuit 16 and a conductor layer 16P are formed on the metallic plate 12 on the rear surface side of the substrate 30 through an insulating resin layer 14. Further, a conductor circuit 34 and a conductor layer 34P are formed on the metallic plate 12 on the front surface side of the substrate 30 through an insulating resin layer 18 and a conductor circuit 34 and a conductor layer 34E are formed on the metallic plate 12 on the rear surface side of the substrate 30 through an insulating resin layer 18. The front surface side and the rear surface side of the multilayer core substrate 30 are connected to each other via through holes 36.

Interlayer resin insulating layers 50 on which via holes 60 and conductor circuits 58 are formed and interlayer resin insulating layers 150 on which via holes 160 and conductor circuits 158 are formed are arranged on the conductor layers 34P and 34E on the surfaces of the multilayer core substrate 30, respectively. Solder resist layers 70 are formed on the upper layers of the via holes 160 and the conductor circuits 158 and bumps 76U and 76D are formed on the via holes 160 and the conductor circuits 158 through the opening portions 71 of the solder resist layers 70, respectively.

As shown in FIG. 9, solder bumps 76U on the upper surface of the multilayer printed wiring board 10 are connected to lands 92 of the IC chip 90. Further, chip capacitors 98 are mounted on the board 10. External terminals 76D on the lower surface thereof are connected to lands 96 of the daughter board 94. External terminals refer herein to PGA's, BGA's, solder bumps or the like.

A method for manufacturing the multilayer printed wiring board according to Embodiment 1-1.

A. Manufacturing of Resin Film of Interlayer Resin Insulating Layer 29 parts by weight of bisphenol A type epoxy resin (epoxy equivalent weight of 455, Epicoat 1001 manufactured by Yuka Shell Epoxy), 39 parts by weight of cresol novolac type epoxy resin (epoxy equivalent weight of 215, EpiclonN-673 manufactured by Dainippon Ink and Chemicals) and 30 parts by weight of phenol novolac resin including a triazine structure (phenol hydroxyl group equivalent weight of 120, PhenoliteKA-7052 manufactured by Dainippon Ink and Chemicals) are heated and molten while being agitated with 20 parts by weight of ethyl diglycol acetate and 20 parts by weight of solvent naphtha, and 15 parts by weight of terminally epoxidized polybutadiene rubber (DenalexR-45EPT manufactured by Nagase Chemicals Ltd.) and 1.5 parts by weight of crushed product of 2-phenyl-4,5-bis(hydroxymethyl) imidazole, 2.5 parts by weight of pulverized silica and 0.5 parts by weight of silicon-based defoaming agent are added thereto, thereby preparing an epoxy resin composition.

The obtained epoxy resin composition is coated on a PET film having a thickness of 38 µm so as to have a thickness of 50 µm after being dried by a roll coater and dried for 10 minutes at 80 to 120° C., thereby manufacturing a resin film for an interlayer resin insulating layer.

B. Preparation of Resin Filler 100 parts by weight of bisphenol F type epoxy monomer (manufactured by Yuka Shell, molecular weight: 310, YL983U), 170 parts by weight of $SiO_2$ spheroidal particles having a silane coupling agent coated on surfaces thereof, a mean particle size of 1.6 μm, and a largest particle size of not more than 15 μm (manufactured by ADTEC Corporation, CRS 1101-CE) and 1.5 parts by weight of leveling agent (manufactured by Sannopuko KK, PelenolS4) are input in a container and agitated and mixed therein, thereby preparing resin filler having a viscosity of 44 to 49 Pa·s at 23≦1° C. As hardening agent, 6.5 parts by weight of imidazole hardening agent (manufactured by Shikoku Chemicals, 2E4MZ-CN) is used. As the resin filler, thermosetting resin such as the other epoxy resin (e.g., bisphenol A type, novolac type or the like), polyimide resin or phenol resin may be used.

C. Manufacturing the Multilayer Printed Wiring Board

Next, a method for manufacturing the multilayer printed wiring board 10 shown in FIG. 8 will be described with reference to FIGS. 1 to 7.

(1) Formation of Metallic Layer

Openings 12*a* are provided in an inner layer metallic layer (metallic plate) 12 having a thickness of 20 to 400 μm as shown in FIG. 1(A) to penetrate the front and rear surfaces of the layer 12 (FIG. 1(B)). As the material of the metallic layer, a material containing a mixture of copper, nickel, zinc, aluminum, iron and the like can be used. The openings 12*a* are formed by punching, etching, drilling, a laser or the like. Depending on cases, metallic films 13 may be coated on the entire surfaces of the metallic layer 12 having the openings 12*a* formed therein by electroplating, electroless plating, substitutional plating or sputtering (FIG. 1(C)). The metallic plate 12 may comprise a single layer or a plurality of layers of two or more layers. In addition, the metallic films 13 preferably have curves formed on the corners of the openings 12*a*. The curves can eliminate points at which stresses are concentrated and make it more difficult to cause defects such as cracks and the like around the points.

(2) Formation of Insulating Layers on Inner Layer and Conductive Layers

Insulating resin is used to cover the entire surfaces of the metallic layer 12 and fill up the openings 12*a*. For example, the metallic plate 12 is put between resin films in a B stage state of a thickness of about 30 to 400 μm, the resin films are thermally pressed and hardened (FIG. 1(D)), copper foils having thickness of 12~275 μm are laminated the outsides, whereby insulating rein layers 14 and conductive layer 16 can be formed (FIG. 1(E)). Depending on cases, the insulating rein layers 14 may be formed out of films after applying resin, applying resin and press-fitting the resin films or applying the resin only to the opening portions.

As the material of the insulating resin layers 14, a prepreg having a core material such as glass cloth, aramid bonded material impregnated with thermosetting resin such as polyimide resin, epoxy resin, phenol resin or BT resin is preferable. The other resin may be used.

In embodiment 1, a prepreg having thickness of 50 μm is used. The conductive layer 16 can be made by plating on a metal foil.

(3) Formation of Circuits of Metallic Layer on the Inner Layer

Two or more layers may be formed. The metallic layer may be formed by the additive method.

Through a denting method, etching steps and the like, conductor layers 16, 16P and 16E on the inner layer are formed from the inner layer metallic layer 16 (FIG. 1(F)). The inner layer conductor layers are formed to have thicknesses of 10 to 250 μm. Alternatively, the thicknesses may exceed the range. In embodiment 1, the thickness of conductive layer for the power supply on inner layer is 25 μm. In this process, for an insulating reliability examination of the core substrate, comb tooth pattern for the insulating reliability examination having conductive circuit width/interval between conductive circuit=150 μm/150 μm is formed as the test pattern (insulating reliability examination pattern of the core substrate). In the case where the power supply through hole connecting to the power supply of the IC goes through the conductive layer for the earth on inner layer, the power supply through hole may not have an extending pattern thereof. Also, in the case where the earth through hole connecting to the grand of the IC goes through the conductive layer for the power supply on inner layer, the earth through hole may not have an extending pattern thereof. Due to the configuration, the pitch between the through holes can be narrow, interval between the through hole and the inner conductive circuit becomes narrow pith, mutual inductance decreases.

(4) Formation of Insulating Layers as Outer Layers and Conductive Layer

Insulating resin is used to cover the entire surfaces of the inner layer conductor layers 16, 16P and 16E and fill up the gaps between the circuits of outer layer metal. By way of example, outer layer insulating resin layers 18 and outermost conductive layer of the core substrate 34α are formed on the both sides of the substrate of the process (3) by putting the metallic plate between resin films in a B stage state of a thickness of about 30 to 200 μm, thermally press-fitting and hardening the resin films (FIG. 2(B)). Depending on cases, the outer layer insulating resin layers 18 and outermost conductive layer of the core substrate 34α may be formed out of films after applying resin, applying resin and press-fitting the resin films or applying the resin only to the opening portions. By applying pressure, it is possible to flatten the surfaces of the layers 18. B-stage prepreg having a core material such as glass cloth, aramid bonded material may be used. In embodiment 1, the prepreg having thickness of 200 μm is used. As an alternative to the method for forming the metallic foils, one-sided copper-clad laminates are built up. Two or more layers of the laminates may be formed on the metallic foils. The metallic layers may be formed by the additive method.

(5) Formation of Through Holes

Pass-through holes 36α for through holes having opening diameter of 50 to 400 μm are formed to penetrate the front and rear surfaces of the substrate (FIG. 2(C)). As a formation method, the holes are formed by drilling, a laser or a combination of drilling and the laser. (The holes are opened in the outermost insulating layers by the laser, and then may be penetrated through the substrate by drilling while using the holes opened by the laser as target marks.) The forms of the holes are preferably those having linear sidewalls. Depending on cases, the holes may be tapered.

To secure the conductive properties of the through holes, it is preferable to form plated films 22 in the respective pass-through holes 36α for the through holes and roughen the surfaces of the plated films 22 (FIG. 2(D)), and then to fill the holes with resin filler 23 (FIG. 2(E)). As the resin filler, either an electrically insulated resin material (e.g., a resin material containing a resin component, hardening agent, particles and the like) or a conductive material holding electrical connection by metallic particles (e.g., a conductive material containing metallic particles such as gold or copper particles, a resin material, hardening agent and the like) can be used. After the filling process, temporarily, resin filler is dried, unnecessary resin filler fixed on the plated films 22 is removed by grinding, completely dried under condition of 150° for 1 hour.

As plating, electroplating, electroless plating, panel plating (electroless plating and electroplating) or the like may be performed. The plated films 22 are formed by plating metals containing copper, nickel, cobalt, phosphorus or the like. The thicknesses of the plated metals are preferably 5 to 30 μm.

The resin filler 23 filled in the pass-through holes 36a for the through holes is preferably made of an insulating material comprising a resin material, hardening agent, particles and the like. As the particles, inorganic particles such as silica or alumina particles can be used solely, metallic particles such as gold, silver or copper particles can be used solely, resin particles can be used solely or the inorganic particles, the metallic particles and the resin particles can be mixed together. The particles equal in particle size from 0.1 to 5 μm or different in particle size from 0.1 to 5 μm can be mixed. As the resin material, thermosetting resin such as epoxy resin (e.g., bisphenol type epoxy resin or novolac type epoxy resin and the like) or phenol resin, ultraviolet setting resin having a photosensitive property, thermoplastic resin or the like may be used solely or mixed together. As the hardening agent, imidazole based hardening agent, amine based hardening agent or the like can be used. Alternatively, hardening agent containing hardening stabilizer, reaction stabilizer, particles and the like may be used. In the latter case, the resin filler is replaced by conductive paste made of a conductive material comprising metallic particles, a resin component, hardening agent and the like. Depending on cases, metallic films having a conductive property may be formed on the surface layers of an insulating material such as solder or insulating resin. It is also possible to fill the pass-through holes 36a for through holes with plated members. Since the conductive paste is hardened and contracted, depressed portions are sometimes formed on the surface layers.

(6) Formation of Outermost Layer Conductor Circuits

Cover plated members 25 may be formed right on the through holes 36 by coating plated films on the entire surfaces of the substrate (FIG. 3(A)). Thereafter, outer layer conductor circuits 34, 34P and 34E are formed through the denting method, etching steps and the like (FIG. 3(B)). As a result, the multilayer core substrate 30 is completed. In embodiment 1, the thickness of the conductive layer on the multilayer core substrate is 15 μm.

At this time, although not shown in the drawings, the electrical connection of the outer conductor circuits to inner conductor layers 16 and the like of the multilayer core substrate may be established by via holes, blind through holes or blind via holes.

(7) The multilayer core substrate 30 on which the conductor circuits 34 have been formed thereon is subjected to a blackening treatment and a reduction treatment, thereby forming roughened surfaces 34B on the entire surfaces of the conductor circuits 34 and the conductor layers 34P and 34E (FIG. 3(C)).

(8) Layers of the resin filler 40 are formed on the conductor circuit unformed portions of the multilayer core substrate 30 (FIG. 4(A)).

(9) The one surface of the substrate which has been subjected to the above treatments is polished by belt sander polishing or the like so as not to leave the resin filler 40 on the outer edges of the conductor layers 34P and 34E, and then the entire surfaces of the conductor layers 34P and 34E (including the land surfaces of the through holes) are further polished by buffing or the like so as to eliminate scratches caused by the former polishing. A series of polishing operations are similarly conducted to the other surface of the substrate. Next, the resin filler 40 is hardened by heat treatments at 100° C. for 1 hour and 150° C. for 1 hour (FIG. 4(B)).

The resin filler may not be filled between the conductor circuits. In that case, using resin layers such as interlayer insulating layers, the insulating layers are formed and the portions between the conductor circuits are filled up.

(10) Etchant is sprayed onto the both surfaces of the multilayer core substrate 30 and the surfaces of the conductor circuits 34 and the conductor layers 34P and 34E and the land surfaces and inner walls of the through holes 36 are subjected to etching or the like, thereby forming roughened surfaces 36B on the entire surfaces of the conductor circuits (FIG. 4(C)).

(11) Resin films 50γ for interlayer resin insulating layers are mounted on the both surface of the multilayer core substrate 30, respectively, temporarily press-fitted and cut, and then bonded onto the substrate using the vacuum laminator, thereby forming interlayer resin insulating layers (FIG. 5(A)).

(12) Thereafter, openings 50a for via holes are formed to have a diameter of 80~100 μm in the interlayer resin insulating layers 2 by a CO2 gas laser having wavelength of 10.4 μm under conditions of a beam diameter of 4.0 mm, a top hat mode, a pulse width of 3~7.9 microseconds, the pass-through hole diameter of the mask of 1.0~5.0 mm and 13 shots (FIG. 5(B)).

(13) The multilayer core substrate 30 is immersed in a solution containing 60 g/l of permanganic acid at 80° C. for 10 minutes to form roughened surfaces 50α on the surfaces of the interlayer resin insulating layers 50 including the inner walls of the via hole openings 50a (FIG. 5(C)). The roughened surfaces are formed to have a thickness between 0.1 to 5 μm.

(14) Next, the multilayer core substrate 30 which has been subjected to the above-stated treatments is immersed in neutralizer (manufactured by Shipley Corporation) and then washed.

Further, a palladium catalyst is added to the surfaces of the roughened substrate (a roughening depth of 3 μm), thereby attaching catalyst nuclei to the surfaces of the interlayer resin insulating layers and the inner wall surfaces of the via hole openings.

(15) The substrate to which the catalyst is attached is immersed in an electroless copper plating aqueous solution and electroless copper plated films having a thickness of 0.6 to 3.0 μm are formed on the entire roughened surfaces, thereby obtaining the substrate having electroless copper plated films 52 formed on the surfaces of the interlayer resin insulating layers 50 including the inner walls of the via hole openings 50a (FIG. 5(D)).

| [Electroless plating aqueous solution] | |
|---|---|
| NiSO4 | 0.03 mol/l |
| Tartaric acid | 0.200 mol/l |
| HCHO | 0.18 g/l |
| NaOH | 0.100 mol/l |

-continued

| [Electroless plating aqueous solution] | |
|---|---|
| α,α'-bipyridyl | 100 mg/l |
| Polyethylene glycol (PEG) | 0.10 g/l |

[Electroless Plating Conditions]
40 minutes and a solution temperature of 34° C.

(16) Commercially available dry films are bonded to the substrate on which electroless copper plated films 52 are formed, a mask is put on the substrate, the substrate is developed and plating resists 54 are thereby provided (FIG. 6(A)). Plating resists are formed on a part of the interlayer resin insulating layers for examine of effect for the undulation of interlayer resin insulating layers due to the thickness of the multilayer core substrate. The plating resists are formed so that the plated circuit patterns (minimum lines distance, line width making ability examination pattern) have conductive circuit width/interval between conductive circuit=5/5 μm, 7.5/7.5 μm, 10/10 μm, 12.5/12.5 μm, 15/15 μm. The plating resists having a thickness of 10 to 30 μm are used.

(17) Next, the multilayer core substrate 30 is electroplated, thereby forming electroplated copper films 56 having a thickness of 5 to 20 μm are formed on portions in which the plating resists 54 are not formed, respectively (FIG. 6(B)).

| [Electroplating solution] | |
|---|---|
| Sulfuric acid | 2.24 mol/l |
| Copper sulfate | 0.26 mol/l |
| Additive (Kalapacid GL manufactured by Atotech Japan) | 19.5 ml/l |

| [Electroplating conditions] | |
|---|---|
| Current density | 1 A/dm$^2$ |
| Time | 90 ± 5 minutes |
| Temperature | 22 ± 2° C. |

(18) After peeling off the plating resists with 5% KOH, the electroless plated films under the plating resist are etched, molten and removed with a solution mixture of sulfuric acid and hydrogen peroxide, thus forming independent conductor circuits 58 and via holes 60 (FIG. 6(C)).

(19) Next, the same treatment as that of (12) is conducted to form roughened surfaces 58α and 60α on the surfaces of the conductor circuits 58 and via holes 60. In embodiment 1, the upper conductor circuits 58 are formed to have a thickness of 20 μm (FIG. 6(D)).

(20) The steps (11) to (19) stated above are repeated, thereby forming further upper layer conductor circuits and a multilayer wiring board is obtained (FIG. 7(A)).

(21) Next, after the above-stated solder resist composition 70 is coated on each surface of the multilayer wiring board by a thickness of 12 to 30 μm, and dried under conditions of 70° C. for 20 minutes and 70° C. for 30 minutes (FIG. 7(B)), a photomask on which a pattern of solder resist opening portions are drawn and which has a thickness of 5 mm, is fixedly attached to each solder resist layer 70, exposed with ultraviolet rays of 1000 mJ/cm$^2$, and developed with a DMTG solution, thereby forming opening portions 71 having a diameter of 200 μm (FIG. 7(C)). Further, heat treatments are conducted at 80° C. for 1 hour, at 100° C. for 1 hour, at 120° C. for 1 hour, and at 150° C. for 3 hours, respectively, to harden the solder resist layers, thus forming solder resist pattern layers each having opening portions and a thickness of 10 to 25 μm.

(22) Next, the substrate on which the solder resist layers 70 are formed is immersed in an electroless nickel plating solution, thereby forming nickel plated layers 72 having a thickness of 5 μm on the opening portions 71, respectively. Furthermore, the substrate is immersed in an electroless gold plating solution, thereby forming gold plated layers 74 having a thickness of 0.03 μm on the respective nickel plated layers 72 (FIG. 7(D)). Alternatively, a single tin or noble metal (gold, silver, palladium, platinum or the like) layer may be formed in stead of the nickel-gold layers.

(23) Thereafter, tin-lead containing solder paste is printed on each opening 71 of the solder resist layer 70 on one surface of the substrate on which surface the IC chip is mounted, tin-antimony containing solder paste is further printed on each opening on the other surface of the substrate, and external terminals are formed by conducting reflow at 200° C., thereby manufacturing a multilayer printed wiring board including solder bumps (FIG. 8).

The IC chip 90 is attached to the multilayer printed wiring board and chip capacitors 98 are mounted thereon through the external terminals 76U. Further, the multilayer printed wiring board is attached to the daughter board 94 through the solder bumps 76D (FIG. 9).

BEST MODE FOR CARRYING OUT THE INVENTION

As well as the above-mentioned first embodiment-1, first embodiment-2 to first embodiment-28 and first comparative example-1 to first comparative example-3 were manufactured. In those embodiments and comparative examples, the thickness of the conductive layer of the core substrate, the number of the conductive layers of the core substrate, the number of through holes having no dummy land, an area having no dummy land and the thickness of the conductive layer on the interlayer insulation layer were changed. In case of changing the thickness of the conductive layer as an internal layer, the thickness of copper foil was changed in FIG. 1(E). In case of changing the thickness of the conductive layer on front and rear surfaces of the core substrate, the thickness of copper foil in FIG. 2(B) was changed and the thickness of plating in FIG. 2(D) and FIG. 3(A) was changed. In case of changing the number of the conductive layers of the core substrate, after a process of FIG. 2(B), it was performed by repeating formation of a circuit, roughing of a circuit surface and laminating of prepreg and copper foil at a predetermined time. In case of changing the number of through holes having no dummy land or an area having no dummy land, it was performed by changing an exposure mask for forming etching resist for etching the copper foil at the time of formation of a circuit in FIG. 1(F) (tenting method) (see FIGS. 19, 38. FIG. 19 indicates an example that no dummy land is provided and FIG. 38 indicates an example that all have the dummy lands). In case of changing the thickness of the conductive layer on the interlayer insulation layer, it was performed by changing the thickness of plating in FIG. 6(B).

Hereinafter, the number of core layers, the thickness of power source conductive layer, the thickness of conductive layer on interlayer insulation layer, the number of through holes having no dummy land, its area and the like of each embodiments and comparative examples are indicated.

Embodiment 1-1

Thickness of power supply conductor layers on the inner layer of the four layers core substrate: 25 μm;
Thickness of power supply conductor layers as surface layers the four layers core substrate: 15 μm;
Sum of the thicknesses of the power supply conductor layers of the core substrate: 40 μm
Thickness of the conductor layers of the interlayer insulating layers: 20 μm.

Embodiment 1-2

Thickness of power supply conductor layers on the inner layer of the four layers core substrate: 15 μm;
Thickness of power supply conductor layers as surface layers the four layers core substrate: 9 μm;
Sum of the thicknesses of the power supply conductor layers of the core substrate: 24 μm
Thickness of the conductor layers of the interlayer insulating layers: 20 μm.

Embodiment 1-3

Thickness of power supply conductor layers on the inner layer of the four layers core substrate: 45 μm;
Thickness of power supply conductor layers as surface layers the four layers core substrate: 15 μm;
Sum of the thicknesses of the power supply conductor layers of the core substrate: 60 μm
Thickness of the conductor layers of the interlayer insulating layers: 20 μm.

Embodiment 1-4

Thickness of power supply conductor layers on the inner layer of the four layers core substrate: 60 μm;
Thickness of power supply conductor layers as surface layers the four layers core substrate: 15 μm;
Sum of the thicknesses of the power supply conductor layers of the core substrate: 75 μm
Thickness of the conductor layers of the interlayer insulating layers: 20 μm.

Embodiment 1-5

Thickness of power supply conductor layers on the inner layer of the 14 layers core substrate: 100 μm;
Thickness of power supply conductor layers as surface layers the 14 layers core substrate: 15 μm;
Sum of the thicknesses of the power supply conductor layers of the core substrate: 615 μm
Thickness of the conductor layers of the interlayer insulating layers: 20 μm.

Embodiment 1-6

Thickness of power supply conductor layers on the inner layer of the 18 layers core substrate: 100 μm;
Thickness of power supply conductor layers as surface layers the 18 layers core substrate: 15 μm;
Sum of the thicknesses of the power supply conductor layers of the core substrate: 815 μm
Thickness of the conductor layers of the interlayer insulating layers: 20 μm.

Embodiment 1-7

Thickness of power supply conductor layers on the inner layer of the four layers core substrate: 15 μm;
Thickness of power supply conductor layers as surface layers the four layers core substrate: 45 μm;
Sum of the thicknesses of the power supply conductor layers of the core substrate: 60 μm
Thickness of the conductor layers of the interlayer insulating layers: 20 μm.

Embodiment 1-8

Thickness of power supply conductor layers on the inner layer of the four layers core substrate: 15 μm;
Thickness of power supply conductor layers as surface layers the four layers core substrate: 60 μm;
Sum of the thicknesses of the power supply conductor layers of the core substrate: 75 μm
Thickness of the conductor layers of the interlayer insulating layers: 20 μm.

Embodiment 1-9

Thickness of power supply conductor layers on the inner layer of the four layers core substrate: 50 μm;
Thickness of power supply conductor layers as surface layers the four layers core substrate: 15 μm;
Sum of the thicknesses of the power supply conductor layers of the core substrate: 65 μm
Thickness of the conductor layers of the interlayer insulating layers: 20 μm.

Embodiment 1-10

Thickness of power supply conductor layers on the inner layer of the four layers core substrate: 150 μm;
Thickness of power supply conductor layers as surface layers the four layers core substrate: 15 μm;
Sum of the thicknesses of the power supply conductor layers of the core substrate: 165 μm
Thickness of the conductor layers of the interlayer insulating layers: 20 μm.
In Embodiment 1-10, on the above process (4: Formation of insulating layers as outer layers and conductive layer), a prepreg having thickness of 300 μm is utilized.

Embodiment 1-11

Thickness of power supply conductor layers on the inner layer of the four layers core substrate: 175 μm;
Thickness of power supply conductor layers as surface layers the four layers core substrate: 15 μm;
Sum of the thicknesses of the power supply conductor layers of the core substrate: 190 μm
Thickness of the conductor layers of the interlayer insulating layers: 20 μm.
In Embodiment 1-11, on the above process (4: Formation of insulating layers as outer layers and conductive layer), the prepreg having thickness of 300 μm is utilized.

Embodiment 1-12

Thickness of power supply conductor layers on the inner layer of the four layers core substrate: 200 μm;

Thickness of power supply conductor layers as surface layers the four layers core substrate: 15 μm;

Sum of the thicknesses of the power supply conductor layers of the core substrate: 215 μm Thickness of the conductor layers of the interlayer insulating layers: 20 μm.

In Embodiment 1-12, on the above process (4: Formation of insulating layers as outer layers and conductive layer), the prepreg having thickness of 300 μm is utilized.

First Embodiment-13

Part of the power source through holes and grounding through holes in the first embodiment-3 were formed as through holes having no dummy land indicated in the process (3)<circuit formation process of metallic layer in inner layer>. Its area is just below an IC and the number of the power source through holes having no dummy land was set to 50% all the power source through holes and the number of the grounding through holes having no dummy land was set to 50% all the grounding through holes.

First Embodiment-14

All the power source through holes just below the ICs and all the grounding through holes in the first embodiment-3 were formed as through holes having no dummy land indicated in the above-mentioned (3)<circuit formation process of metallic layer in inner layer>

First Embodiment-15

Part of the power source through holes and grounding through holes in the first embodiment-9 were formed as through holes having no dummy land indicated in the above-mentioned (3)<circuit formation process of metallic layer in inner layer>. Its area is just below an IC and the number of the power source through holes having no dummy land was set to 50% all the power source through holes and the number of the grounding through holes having no dummy land was set to 50% all the grounding through holes.

First Embodiment-16

All the power source through holes just below the ICs and all the grounding through holes in the ninth embodiment-9 were formed as through holes having no dummy land indicated in the above-mentioned (3)<circuit formation process of metallic layer in inner layer>.

First Embodiment-17

Part of the power source through holes and grounding through holes in the first embodiment-4 were formed as through holes having no dummy land indicated in the process (3)<circuit formation process of metallic layer in inner layer>. Its area is just below an IC and the number of the power source through holes having no dummy land was set to 50% all the power source through holes and the number of the grounding through holes having no dummy land was set to 50% all the grounding through holes.

First Embodiment-18

All the power source through holes just below the ICs and all the grounding through holes in the first embodiment-4 were formed as through holes having no dummy land indicated in the above-mentioned (3)<circuit formation process of metallic layer in inner layer>.

First Embodiment-19

Part of the power source through holes and grounding through holes in the first embodiment-10 were formed as through holes having no dummy land indicated in the process (3)<circuit formation process of metallic layer in inner layer>. Its area is just below an IC and the number of the power source through holes having no dummy land was set to 50% all the power source through holes and the number of the grounding through holes having no dummy land was set to 50% all the grounding through holes.

First Embodiment-20

All the power source through holes just below the ICs and all the grounding through holes in the first embodiment-10 were formed as through holes having no dummy land indicated in the above-mentioned (3)<circuit formation process of metallic layer in inner layer>.

First Embodiment-21

Part of the power source through holes and grounding through holes in the first embodiment-11 were formed as through holes having no dummy land indicated in the process (3)<circuit formation process of metallic layer in inner layer>. Its area is just below an IC and the number of the power source through holes having no dummy land was set to 50% all the power source through holes and the number of the grounding through holes having no dummy land was set to 50% all the grounding through holes.

First Embodiment-22

All the power source through holes just below the ICs and all the grounding through holes in the first embodiment-11 were formed as through holes having no dummy land indicated in the above-mentioned (3)<circuit formation process of metallic layer in inner layer>

First Embodiment-23

Part of the power source through holes and grounding through holes in the first embodiment-12 were formed as through holes having no dummy land indicated in the process (3)<circuit formation process of metallic layer in inner layer>. Its area is just below an IC and the number of the power source through holes having no dummy land was set to 50% all the power source through holes and the number of the grounding through holes having no dummy land was set to 50% all the grounding through holes.

First Embodiment-24

All the power source through holes just below the ICs and all the grounding through holes in the first embodiment-12 were formed as through holes having no dummy land indicated in the above-mentioned (3)<circuit formation process of metallic layer in inner layer>.

First Embodiment-25

Part of the power source through holes and grounding through holes in the first embodiment-7 were formed as through holes having no dummy land indicated in the process (3)<circuit formation process of metallic layer in inner layer>. Its area is just below an IC and the number of the power source through holes having no dummy land was set to 50% all the power source through holes and the number of the grounding through holes having no dummy land was set to 50% all the grounding through holes.

First Embodiment-26

All the power source through holes just below the ICs and all the grounding through holes in the first embodiment-7 were formed as through holes having no dummy land indicated in the above-mentioned (3)<circuit formation process of metallic layer in inner layer>.

First Embodiment-27 thickness of power source conductive layer of each inner layer in 6-layer core substrate: 32.5 μm
thickness of power source conductive layer of front surface layer in 6-layer core substrate: 15 μm
sum of thicknesses of power source conductive layers of core substrate: 80 μm
thickness of conductive layer on interlayer insulation layer: 20 μm First Embodiment-28 thickness of power source conductive layer in inner layer of 4-layer core substrate: 125 μm
thickness of power source conductive layer on front surface layer of 4-layer core substrate: 15 μm
sum of thicknesses of power source conductive layers of core substrate: 140 μm
thickness of conductive layer on interlayer insulation layer: 20 μm First Embodiment-29

Part of the power source through holes and grounding through holes in the first embodiment-27 were formed as through holes having no dummy land indicated in the process (3)<circuit formation process of metallic layer in inner layer>. Its area is just below an IC and the number of the power source through holes having no dummy land was set to 50% all the power source through holes and the number of the grounding through holes having no dummy land was set to 50% all the grounding through holes.

First Embodiment-30

All the power source through holes just below the ICs and all the grounding through holes in the first embodiment-29 were formed as through holes having no dummy land indicated in the above-mentioned (3)<circuit formation process of metallic layer in inner layer>

First Comparative Example-1 thickness of power source conductive layer in inner layer of 4-layer core substrate: 10 μm
thickness of power source conductive layer on front surface layer of 4-layer core substrate: 10 μm
sum of thicknesses of power source conductive layers of core substrate: 20 μm
thickness of conductive layer on interlayer insulation layer: 20 μm First Comparative Example-2 thickness of power source conductive layer of each inner layer of 18-layer core substrate: 100 μm
thickness of power source conductive layer on front surface layer of 18-layer core substrate: 40 μm
sum of thicknesses of power source conductive layer of core substrate: 840 μm
thickness of conductive layer on interlayer insulation layer: 20 μm First Comparative Example-3 thickness of power source conductive layer of each inner layer of 22-layer core substrate: 100 μm
thickness of power source conductive layer on front surface layer of 22-layer core substrate: 15 μm
sum of thicknesses of power source conductive layer of core substrate: 1015 μm
thickness of conductive layer on interlayer insulation layer: 20 μm In the meantime, in the multilayer printed wiring board according to the first embodiment and the first comparative example, if there is no description about the dummy land, all the through holes have the dummy land.

By mounting an IC chip of 3.1 GHz in frequency on a multilayer printed wiring boards of the first embodiment-1 to the first embodiment-12, the first embodiment-27, 28 and the first comparative example-1 to the first comparative example-3 and supplying the same amount of power, the amount of dropped voltage at the time of startup (a drop amount corresponding to a third time of a plurality of voltage drops) was measured. A measurable circuit was formed on a printed wiring board and the IC voltage in the IC was measured because the IC voltage could not be measured directly. The values of the voltage drops at this time are shown in FIGS. 13, 15. These are values of the voltage drops which deflected when the power source voltage was 1.0V.

HAST test (85° C., 85% in humidity, 3.3V applied) was made on the printed wiring boards according to the first embodiment-1 to the first embodiment-12, the first embodiment-28, the first comparative example-1 to the first comparative example-3. In the meantime, an evaluation object pattern is a test pattern for insulation resistance evaluation formed on the core substrate. Its result is shown in FIG. 13. The test time is 115 hours and if the insulation resistance is $10^7 \Omega$ or more after 115 hours pass, the test result is acceptable and if it is below that value, it is unacceptable.

For the first embodiments-3, 4, 7, 8, the minimum line interval and line width formation capacity evaluation pattern (see the above-mentioned process (16) of the first embodiment-1) were evaluated during manufacturing of the printed wiring board. Its result was shown in FIG. 14 as a formation capacity. In the same Figure, O indicates that there was a short-circuit and X indicates that there was a short-circuit between adjoining wirings.

Figure 17:
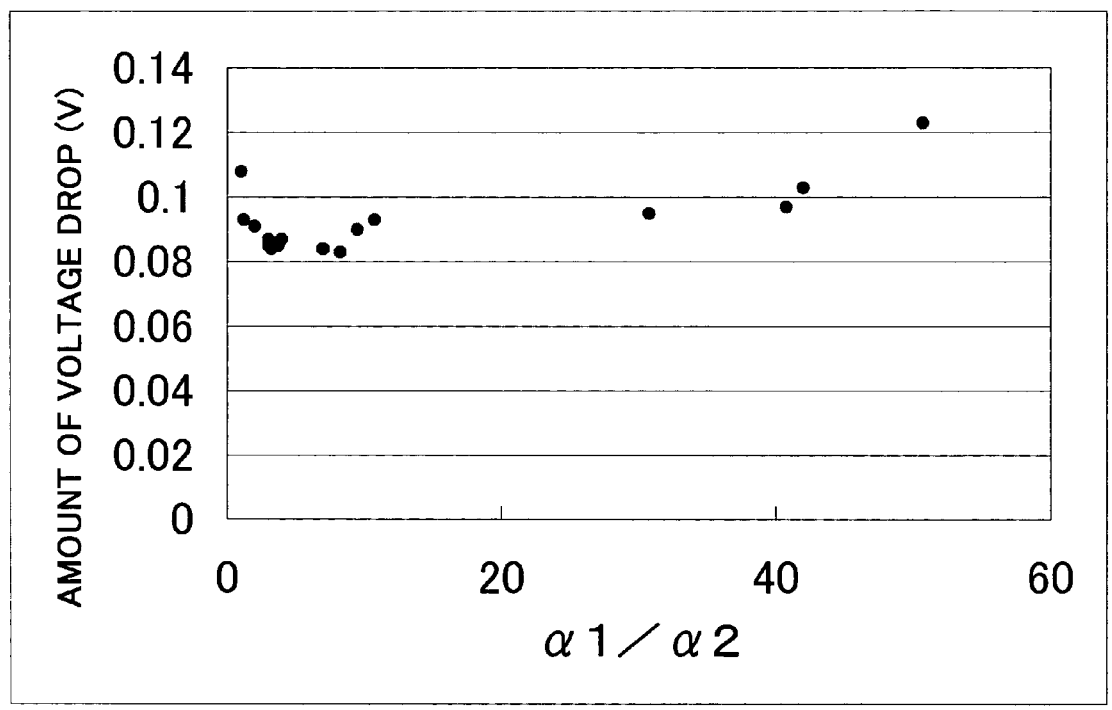
FIG. 17 is a graph of voltage drop amount to $\alpha 1/\alpha 2$.
Figure 18:
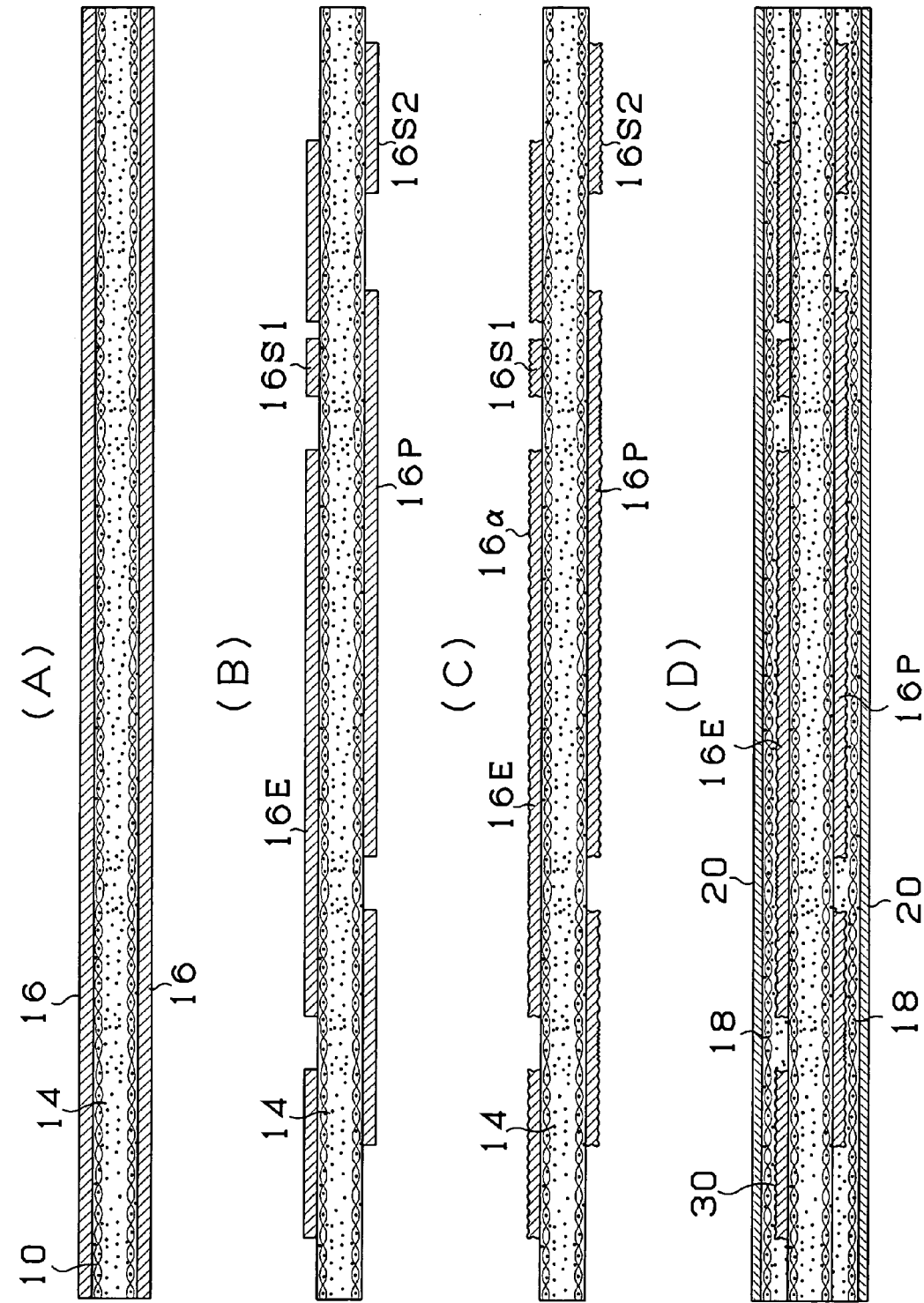
FIG. 18 is a process diagram showing the manufacturing method of the multilayer printed wiring board according to the second embodiment-1 of the present invention.
Figure 20:
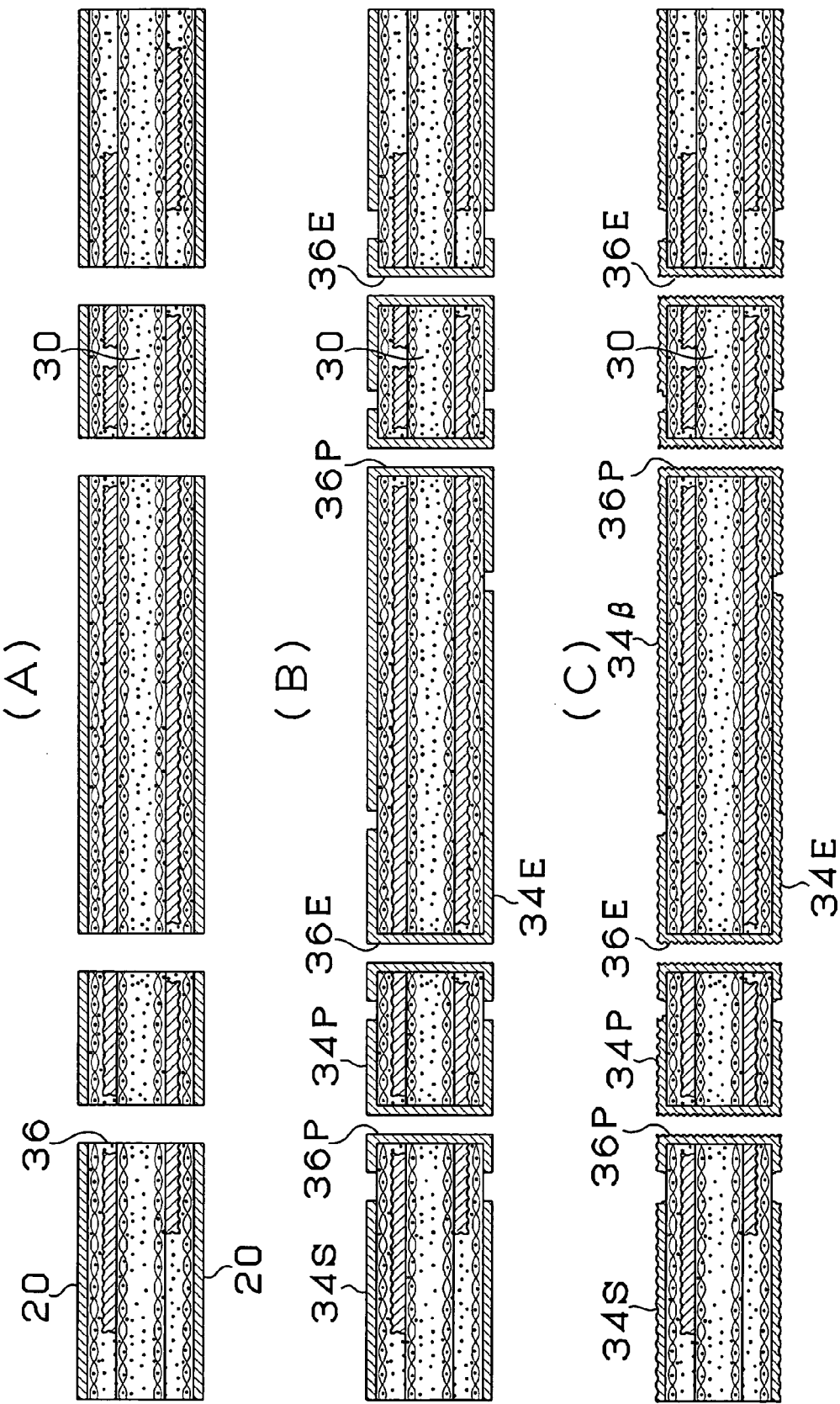
FIG. 20 is a process diagram showing the manufacturing method of the multilayer printed wiring board according to the second embodiment-1.
Figure 21:
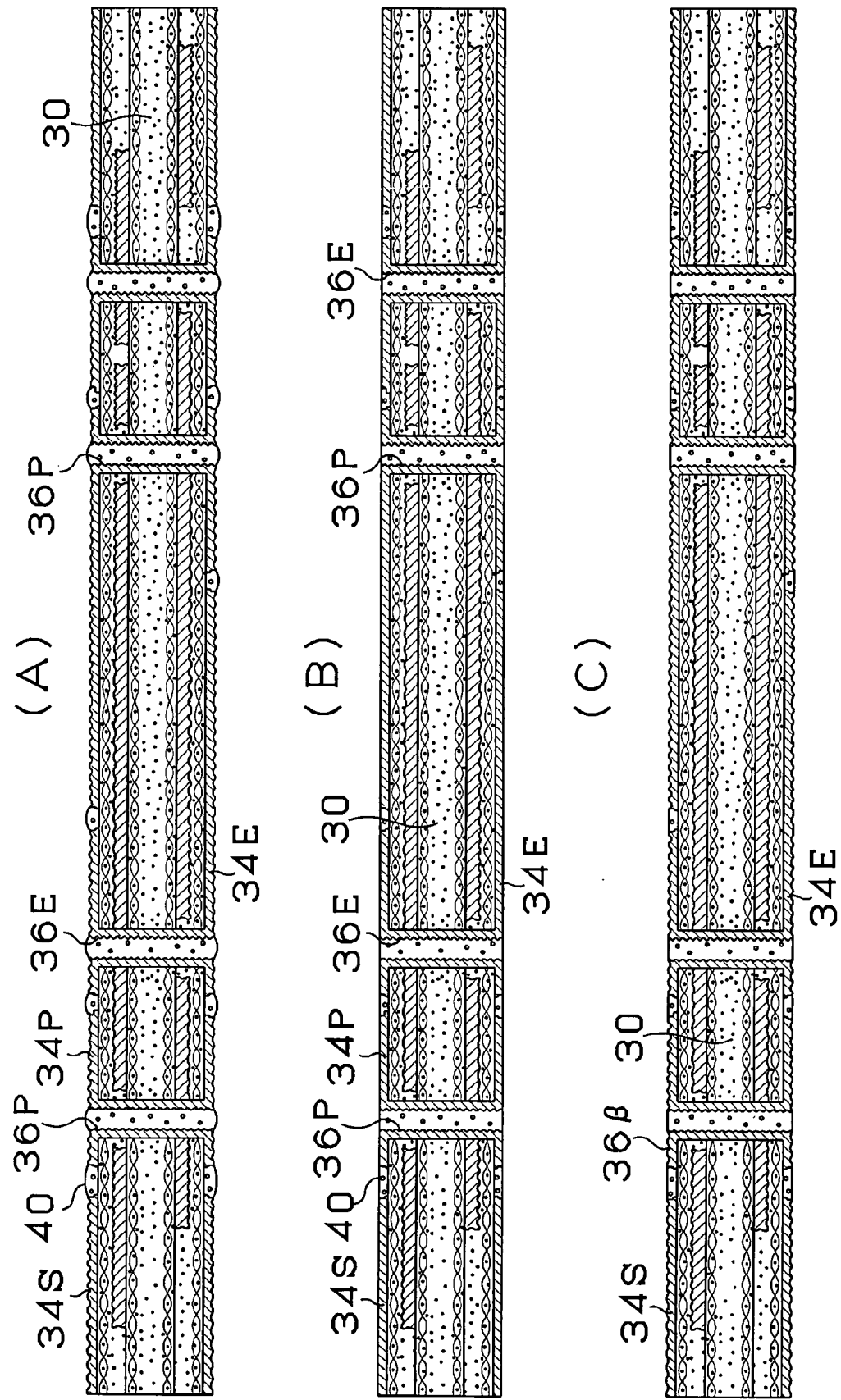
FIG. 21 is a process diagram showing the manufacturing method of the multilayer printed wiring board according to the second embodiment-1.

FIGS. 13, 15 show an amount of voltage drop and an insulation resistance after HAST to various α1/α2. As for the result after the HAST, an acceptable result is indicated with O and an unacceptable result is indicated with X. FIG. 17 shows a graph of the voltage drop amount to various α1/α2.

If a deflection allowable range is ±10% (voltage drop amount of the third time) when the power source voltage is 1.0V in the results of FIGS. 13, 15, this means that the voltage behavior is stable and no malfunction of the IC chip is induced. That is, if the voltage drop amount is less than 0.1 V, no malfunction or the like of the IC chip due to the voltage drop is induced. Therefore, if it is less than 0.09 V, the stability increases. For the reason, it is better that the ratio of (sum of thicknesses of power source conductive layers of multilayer core substrate/thickness of conductive layer on interlayer insulation layer) is over 1.0. Further, the range of 1.2≦(sum of thicknesses of power source conductive layers of multilayer core substrate/thickness of conductive layer on interlayer insulation layer)≦40 is within the deflection allowable range.

However, this value begins to rise when it exceeds 8.25 and if it exceeds 40, the voltage drop amount passes over 0.1 V. This reason is estimated to be that the through hole length increases so that it takes longer to supply power to the IC because the conductive layer of the multilayer core substrate becomes thick or the number of the inner layers increases.

However, if the (sum of thicknesses of power source conductive layers of multilayer core substrate/thickness of conductive layer on interlayer insulation layer) was within the above-mentioned range, the first embodiments-11, 12 in which only a layer was formed thick was inferior to other embodiments in the insulation reliability of the core substrate and thus they were unacceptable (see FIG. 13). This indicates that by setting the sum of the power source conductive layers in the above-mentioned range by forming the core into multilayers not by forming the thickness of only a layer, a printed wiring board having an excellent insulation reliability can be produced, in which no malfunction occurs even if a high frequency IC is loaded.

As a result of analyzing the insulation evaluation test patterns of the core substrate of the first embodiments-11, 12, it was confirmed that a gap between their lines was small. It is estimated that the insulation resistance was below the standard because of this. By comparison of the first embodiments-3, 4 with the first embodiments-7, 8 of FIG. 14, it is made evident that the thickness of conductive layers on the front and rear surfaces of the multilayer core substrate is smaller than the thickness of the conductive layer in the inner layer. This reason is that because interlayer agent meanders when a thick conductive layer is formed on the front and rear surfaces, fine wiring cannot be formed on the interlayer insulation layer.

Whether or not any malfunction occurred in a loaded IC chip was verified regarding multilayer printed wiring boards manufactured according to the first embodiment-1 to 12, 27, 28 and the first comparative example-1 to 3 according to a method described below.

As for the IC chip, any IC chip selected from following NOs. 1-3 was mounted on each multilayer printed wiring board and whether or not any malfunction existed was evaluated by executing simultaneous switching 100 times. Those results are shown in FIG. 15.

Figure 39:
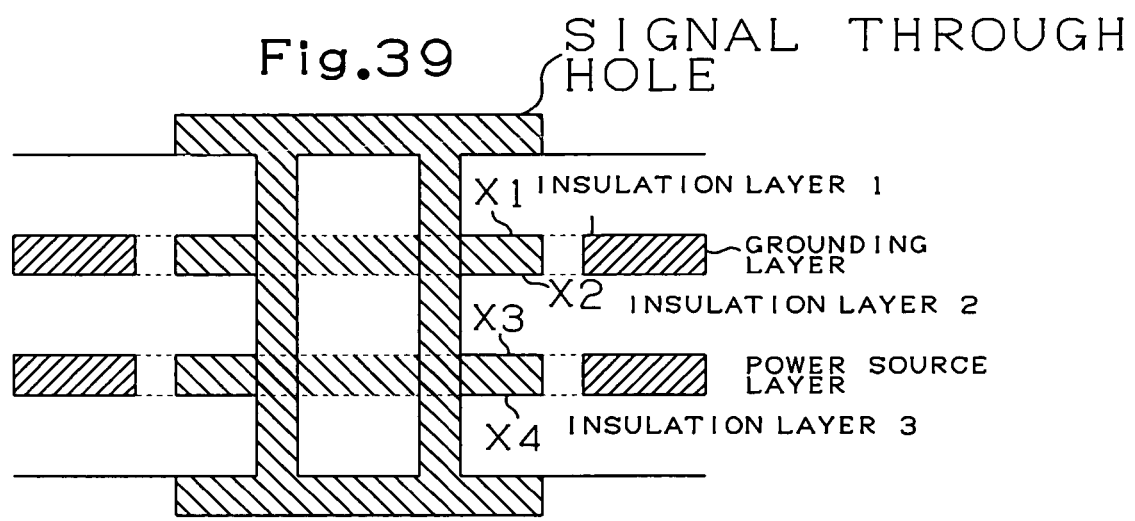
FIG. 39 is a schematic view of the signal through hole passing the multilayer core.

No. 1: drive frequency: 3.06 GHz, bass clock (FSB): 533 MHz
No. 2: drive frequency: 3.2 GHz, bass clock (FSB): 800 MHz
No. 3: drive frequency: 3.46 GHz, bass clock (FSB): 1066 MHz It is made evident that no malfunction is observed in the IC if the ratio of $\alpha 1/\alpha 2$ is in the range of 1.2 to 40 according to a result of mounting the NO. 1 IC chip. The reason is estimated to be that supply of power to the IC is carried out in a moment because the conductive resistance of the power source layer is low. According to the result of mounting the No. 2 IC chip, power needs to be supplied to the IC in a shorter time if the drive frequency of the IC increases, thereby indicating that there exists a more preferable range. The reason why a malfunction occurred in the first embodiments-11, 12 in which the conductive layer in the inner layer of the multilayer core and the first embodiments-5, 6 having a number of the inner layers is estimated to be that a signal may deteriorate when transmitted through the through hole ((not shown) electrically connected to the signal circuit of the IC) as well as that the supply of power delays as the thickness of the core substrate increases. When the signal through hole passes through the four-layer core, that through hole passes through, from top, an insulation layer (insulation layer located between the power source layer on the front surface layer and the ground layer in the inner layer in FIG. 9), ground layer, insulation layer (insulation layer located between the ground layer in the inner layer and the power source layer in the inner layer in FIG. 9), power source layer, insulation layer (insulation layer located between the power source layer in the inner layer and the ground layer on the rear surface in FIG. 9). In the signal line, the value of its impedance differs across an interface between an insulation layer between the power source layer on the front surface layer and the ground layer and the ground layer because the impedance changes depending on the surrounding ground and whether or not power is present. Thus, reflection of signal occurs on that interface. The same thing occurs in other interface. It is estimated that any malfunction occurred in the first embodiments-5, 6, 11, 12 because the change amount of the impedance increases as a distance between the signal through hole and the ground layer or the power source layer decreases, the thickness of the ground layer or the power source layer increases, and the number of the interfaces increases (FIG. 39 shows a schematic diagram of the signal through hole, surrounding power source layers, ground layer and insulation layer and the interfaces (X1, X2, X3, X4) for reflecting a signal). The reason for the malfunction of the first embodiments-1, 2 is estimated to be that the sum of the thicknesses of the power source layers is small.

As a result of mounting the NO. 3 IC, it is made evident that having a thick conductive layer located in the inner layer and forming of 4-layer core whose $\alpha 1/\alpha 2$ is 3 to 7 are effective for high speed of the IC. This reason is estimated to be that the supply of power in a short time and prevention of signal deterioration can be achieved at the same time. Further, by comparison of the first embodiments-3, 4 with the first embodiments-7, 8, it is made evident that disposing a thick conductive layer as an inner layer is effective in electrical viewpoints. This reason is estimated to be that inductance decreases due to a mutual operation between the power source through hole and the ground layer in the inner layer and between the ground through hole and the power source layer in the inner layer.

Whether or not any malfunction occurred in a loaded IC chip was verified regarding multilayer printed wiring boards manufactured according to the first embodiments-13 to 26 according to a method described below.

As for the IC chip, any IC chip selected from following NOs. 1-3 was mounted on each multilayer printed wiring board and whether or not any malfunction existed was evaluated by executing simultaneous switching 100 times. Those results are shown in FIG. 16. TH used in the same Figure is an abbreviation of the through hole.

No. 1: drive frequency: 3.06 GHz, bass clock (FSB): 533 MHz
No. 2: drive frequency: 3.2 GHz, bass clock (FSB): 800 MHz
No. 3: drive frequency: 3.46 GHz, bass clock (FSB): 1066 MHz If comparing the first embodiments-10, 27 with the first embodiments-19, 20, 29, 30, it is made evident that the malfunction of the IC is unlikely to occur in a through hole having no dummy land. This reason is estimated to be that the mutual inductance decreases by an amount corresponding to having no dummy land because the through hole and the conductive layer in the inner layer, each having an opposite potential, are located nearer. Estimated another reason is that the wiring length for supply of electricity is shorter by an amount corresponding to having no dummy land because electricity flows on the surface of a conductor easily.

Printed wiring boards of the first embodiments-3, 4, 13, 14, 17, 18, 28 were left under an environment of a high temperatures and high humidity (85° C., 85%) for 100 hours. After that, whether or not malfunction occurred was verified by performing the simultaneous switching by mounting the above-mentioned NO. 3 IC chip on each printed wiring board. No malfunction occurred except in the first embodiment-3. It is estimated that a malfunction was generated in the first embodiment-3 because resistance of the conductive layer was increased due to the high temperature and high humidity test. As regards other embodiments, it is estimated that no malfunction occurred although resistance rose because other embodiments had a thicker conductive layer or a through hole having no dummy land different from the first embodiment-3 or the inductance of the other embodiments was lower than the first embodiment-3. Therefore, it is considered that the thickness of the conductive layer in the inner layer is preferred to be 60 μm to 125 μm. In conclusion, it can be estimated that the thickness of the conductive layer in the inner layer and the through hole having no dummy land affect each other in the multilayer core.

B. Second Embodiment

The multilayer printed wiring board according to the second embodiment-1 will be described with reference to FIGS. 18-25.

Figure 22:
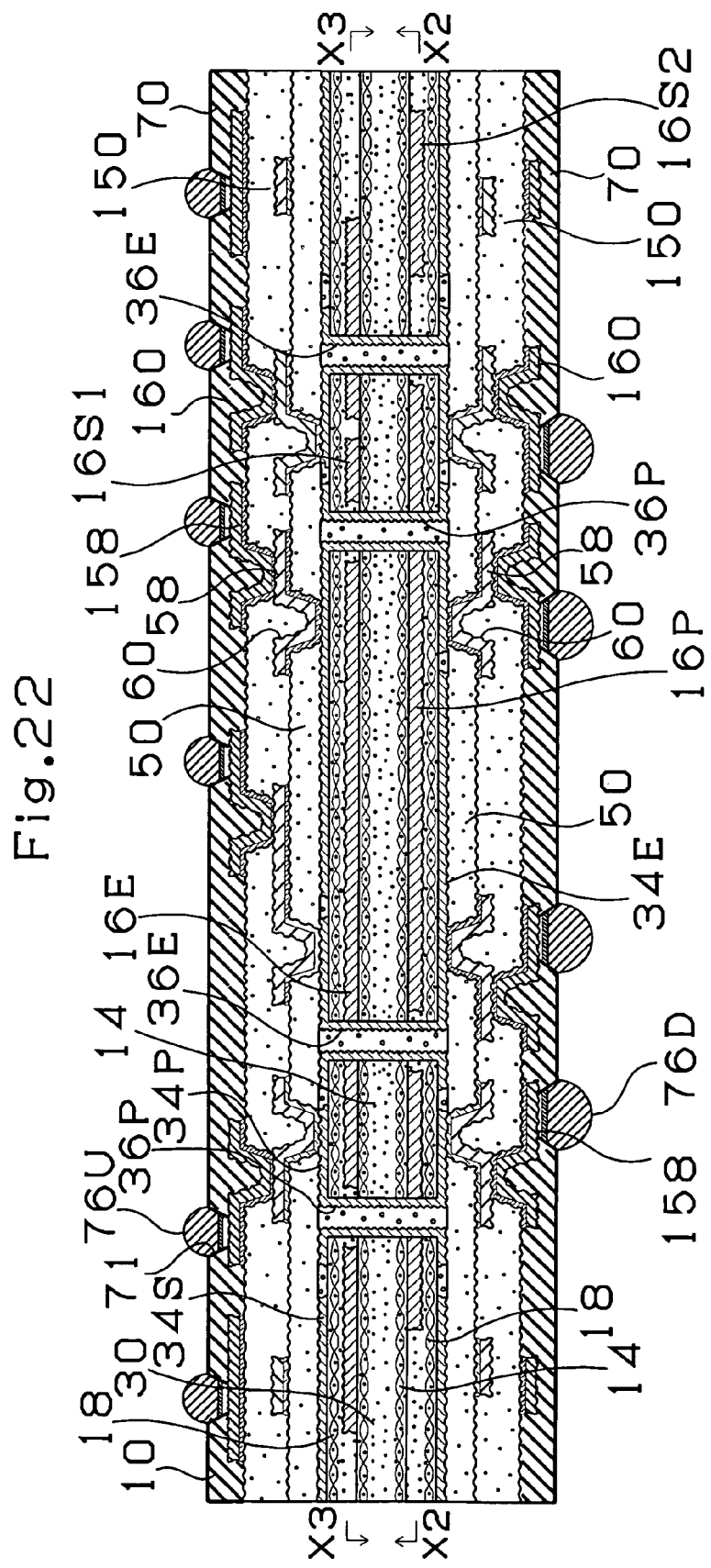
FIG. 22 is a sectional view of the multilayer printed wiring board according to the second embodiment-1.
Figure 23:
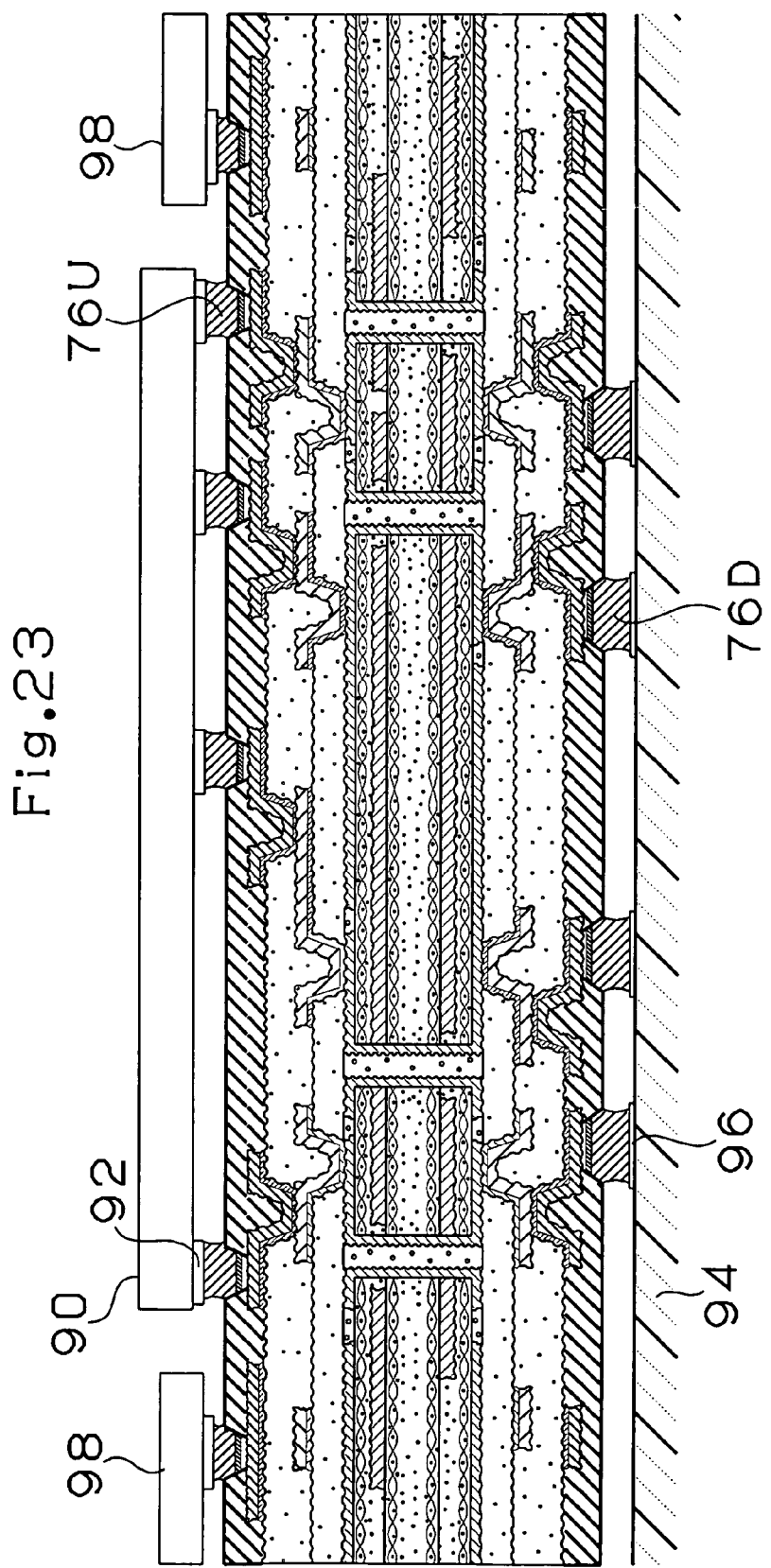
FIG. 23 is a sectional view showing a condition in which an IC chip is mounted on the multilayer printed wiring board according to the second embodiment-1.

First, the structure of the multilayer printed wiring board 10 of the second embodiment-1 will be described with reference to FIGS. 22, 23. FIG. 22 shows a sectional view of the multilayer printed wiring board 10 and FIG. 23 shows a condition in which an IC chip 90 is mounted on the multilayer printed wiring board 10 shown in FIG. 22, which is placed on a daughter board 94. As shown in FIG. 22, the multilayer printed wiring board 10 uses a multilayer core substrate 30. A signal circuit 34S, a power source circuit 34P and a grounding circuit 34E are formed on the front and rear surfaces of the multilayer core substrate 30. A grounding circuit 16E and a signal circuit 16S1 of the inner layer are formed on the front surface side inside of the multilayer core substrate 30 and a power source circuit 16P and a signal circuit 16S2 are formed on the rear surface. A grounding circuit 16E on the upper side is formed as a plain layer for grounding and a power source circuit 16P on the lower side is formed as a plain layer for power source. The plain layer may be formed of a single layer on only one side or two or more layers. It is preferred to be composed of two to four layers. If the four layers are exceeded, the effect is about the same as four layers because the thickness of the core increases so that any improvement of electric characteristic has not been verified. Conversely, the effect may worsen depending on the case. The reason is that formation with two layers makes it difficult to cause warpage because the through hole length decreases and the elongation ratio of the substrate is arranged neatly in viewpoints of stiffness adjustment of the multilayer core substrate. An electrically isolated metallic plate may be accommodated in the center of the multilayer core substrate 30. Although the metal plate makes a role as a core material, no electrical connection in the through hole or via hole is achieved. Mainly, the stiffness against the warpage of the substrate is improved. In the multilayer core substrate 30, its inner layer, the front surface side and the rear surface side are connected with each other through a signal through hole (not shown) for connecting a signal circuit of the IC, a grounding circuit, and a power source circuit electrically, a grounding through hole 36E and a power source through hole 36P.

An interlayer insulation layer 50 in which a via hole 60 and a conductor circuit 58 are formed and an interlayer insulation layer 150 in which a via hole 160 and a conductor circuit 158 are formed are disposed on a power source circuit 34P, a grounding circuit 34E and a signal circuit 34S on the front surface of the multilayer core substrate 30. A solder resist layer 70 is formed above the via hole 160 and the conductor circuit 158 and bumps 76U, 76D are formed in the via hole 160 and conductor circuit 158 through solder resist layer 70 and opening portion 71.

As shown in FIG. 23, the solder bump 76U on the upper side of the multilayer printed wiring board 10 is connected to a land 92 of an IC chip 90. Further, a chip capacitor 98 is mounted. On the other hand, an external terminal 76D on the lower side is connected to a land 96 of a daughter board 94. The external terminal in this case refers to PGA, BGA, solder bump or the like.

FIG. 25(A) shows a lateral sectional view taken along X3-X3 of FIG. 22, namely, a plan view of a grounding plain layer 16E as an inner layer. FIG. 25(B) shows a sectional view taken along X2-X2, namely, a plan view of a power source plain layer 16P as an inner layer. The reason why the arrangements of FIG. 22 and FIGS. 25(A), (B) do not coincide is that FIG. 22 shows schematically the longitudinal structure of the multilayer printed wiring board.

Figure 28:
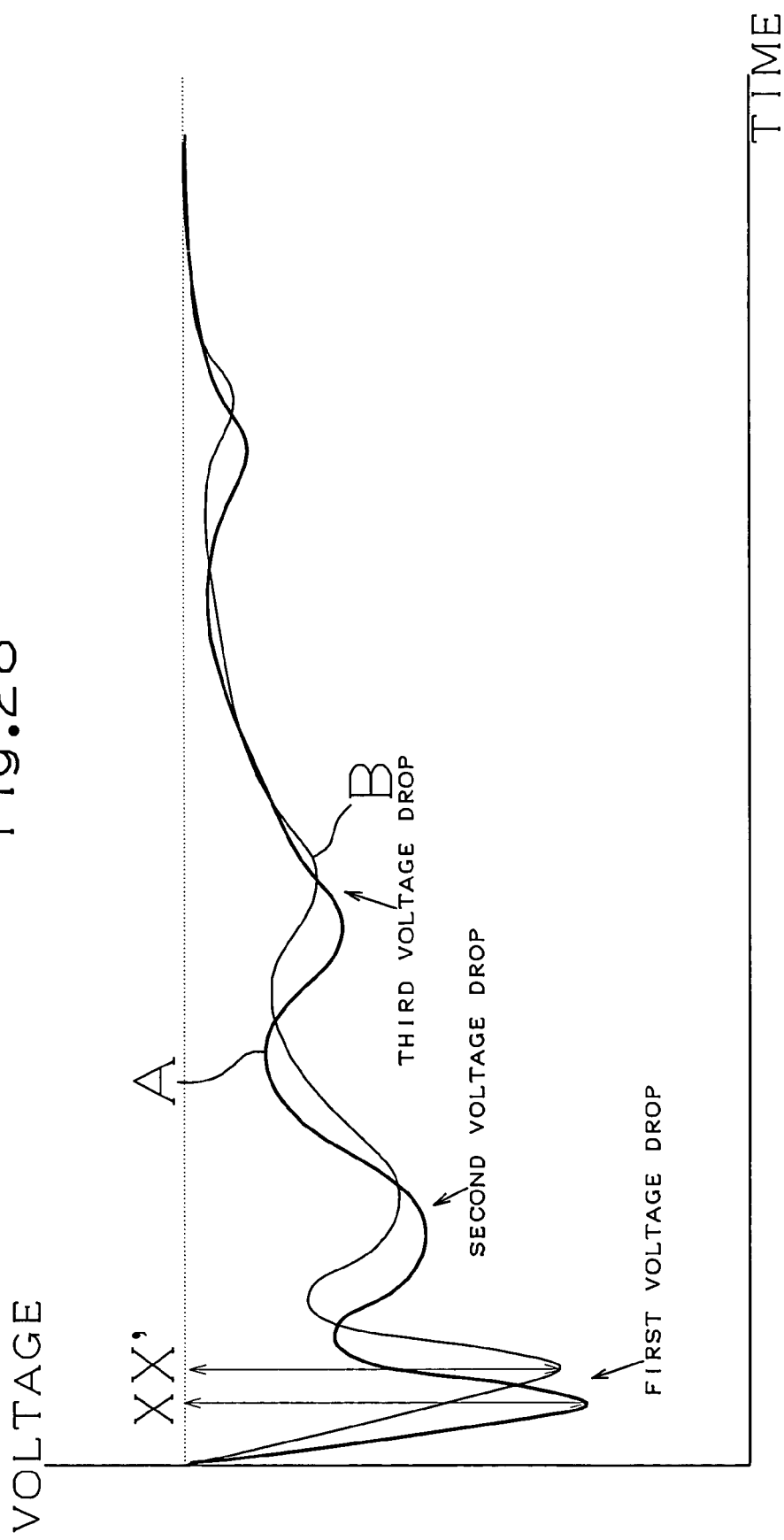
FIG. 28 is a graph showing changes in voltage during the operation of the IC chip.
Figure 29:
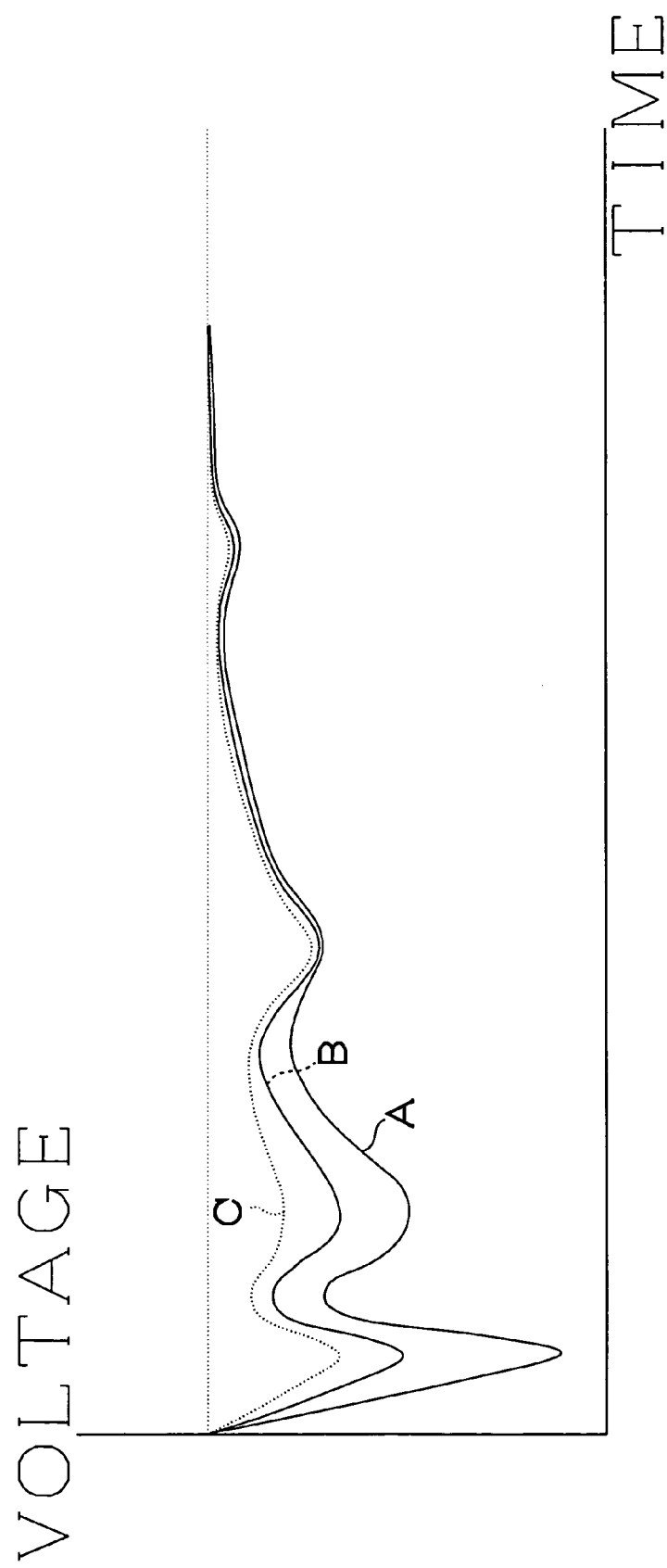
FIG. 29 is a graph showing changes in voltage during the operation of the IC chip.

In the multilayer printed wiring board 30 as shown in FIG. 25(A), the power source through hole 36P has no conductor circuit such as land extending from the through hole within the grounding plain layer 16E when the power source through hole 36P passes through the grounding plain layer 16E as an inner layer of the multilayer core. The power source through hole 36P is disposed in a vacancy 35 provided in the grounding plain layer 16E. The grounding through hole 36E, which passes through the power source plain layer 16P, is disposed in the vacancy 35 within the power source plain layer 16P when the grounding through hole 36E passes through the power source plain layer 16P as shown in FIG. 25(B) and has no conductor circuit such as a land extending from the through hole. Such a core structure enables gaps between the power source through hole and grounding through hole, between the power source through hole and the grounding plain layer in the horizontal direction of the core and between the grounding through hole and the power source plain layer in the horizontal direction of the core, thereby making it possible to reduce the mutual inductance. Further, the conductor area of the power source plain layer and the grounding plain layer can be increased because the through hole does not have any dummy land. Consequently, the voltage drop of the first time and the second time can be reduced as described with reference to FIGS. 28, 29, so that shortage of power becomes unlikely to occur and even if an IC chip having a high frequency range is mounted, a malfunction or error at the time of initial operation is not induced.

In FIG. 25, as for the through holes in the multilayer core substrate, the power source through hole 36P and the grounding through hole 36E are disposed alternately. Such an alternate arrangement reduces the mutual inductance so as to reduce the voltage drop of the first time and second time.

However, all the ones do not have to be disposed alternately and as shown in FIGS. 31(A), 31(B), part of the power source through holes and the grounding through holes may adjoin each other. If the through holes 36P, 36P adjoin each other as shown in FIG. 31(A), both of them may be connected via the power source circuit 16P1 within the grounding plain layer 16E or the through hole 36P may be formed within the vacancy 35 without connecting the both. The same thing is performed if the grounding through holes 36E adjoin each other as shown in FIG. 31(B). Forming it in the vacancy 35 is preferable because the conductive volume of the plain layer increases.

Although any conductor circuit extending from the through hole does not need to be provided within the power source plain layer 16P and the grounding plain layer 16E because a signal through hole is not connected to the power source plain layer 16P and the grounding plain layer 16E, a circuit may be formed in any plain layer if space for circuit formation is available. Arrangement of the signal circuit with a core is advantageous for making the configuration fine when wiring is performed with build-up layer.

Further, the thickness of the conductor of the multilayer core substrate 30 and the thickness of the conductor of the inner layer are preferred to be larger than the thickness of the conductor of the front surface layer. The power source circuit 34P, the grounding circuit 34E and the signal circuit 34S on the front surface of the multilayer core substrate 30 are formed 10 to 60 μm thick, the power source circuit 16P, the grounding circuit 16E and the signal circuit 16S1, 16S2 of the inner layer are formed 10 to 250 μm thick and the conductor circuit 58 on the interlayer insulation layer 50 and the conductor circuit 158 on the interlayer insulation layer 150 are formed 5 to 25 μm thick. The thickness of the conductor circuit in the inner layer of the multilayer core substrate is preferred to be twice or more the thickness of the conductor circuit on the front and rear surfaces of the multilayer core substrate.

In the multilayer printed wiring board of the second embodiment-1, the strength of the multilayer core substrate is increased by forming the power source layer (conductive layer) 34P, the grounding circuit 34E, and the signal circuit 34S included in the multilayer core substrate 30 and the power source circuit 16P and the grounding circuit 16E of the inner layer thick. As a consequence, warpage and generated stress can be relaxed in the substrate itself even if the multilayer core substrate itself is formed thin.

The volume of the conductor itself can be increased by forming the signal circuit 34S, the power source circuit 34P, the grounding circuit 34E, the power source circuit 16P and the grounding circuit 16E thick. Resistance of the conductor can be decreased by increasing the volume.

Further, the supply capacity of electric power to the IC chip 90 can be improved by using the power source circuits 34P, 16P as a power source layer. Thus, when the IC chip is mounted on the multilayer printed substrate, inductance from the IC chip to the substrate to the power source can be decreased. As a result, the voltage drop of the third time at the initial operation decreases so that shortage of power becomes unlikely to occur and thus, even if the IC chip for a high frequency region is mounted, malfunction or error at the initial start is not induced. Further, by using the grounding circuits 34E, 16E as a grounding layer, no noise overlaps supplies of signal or electric power for the IC chip thereby preventing generation of malfunction or error. If a capacitor is mounted, shortage of electric power becomes unlikely to occur because electric power accumulated in the capacity can be used as a supplement. Particularly by disposing the capacitor just below the IC chip, its effect (making shortage of power unlikely to occur) is improved considerably. The reason is that if it is just below the IC chip, the length of wring in the multilayer printed wiring board can be decreased.

Figure 34:
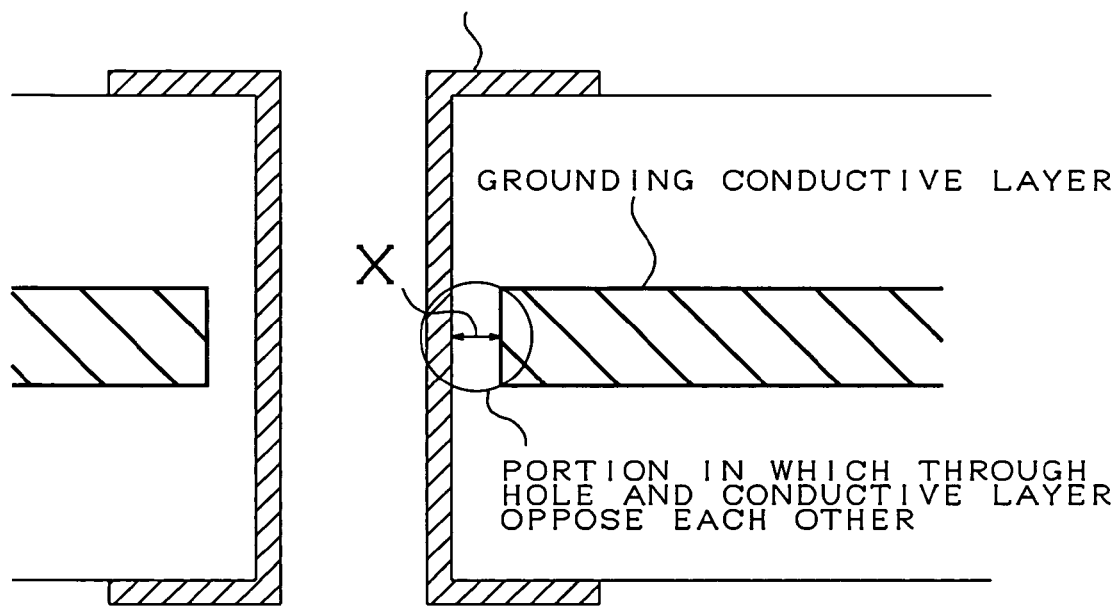
FIG. 34 is an explanatory diagram showing the relation between the through hole and the conductive layer.
Figure 35:
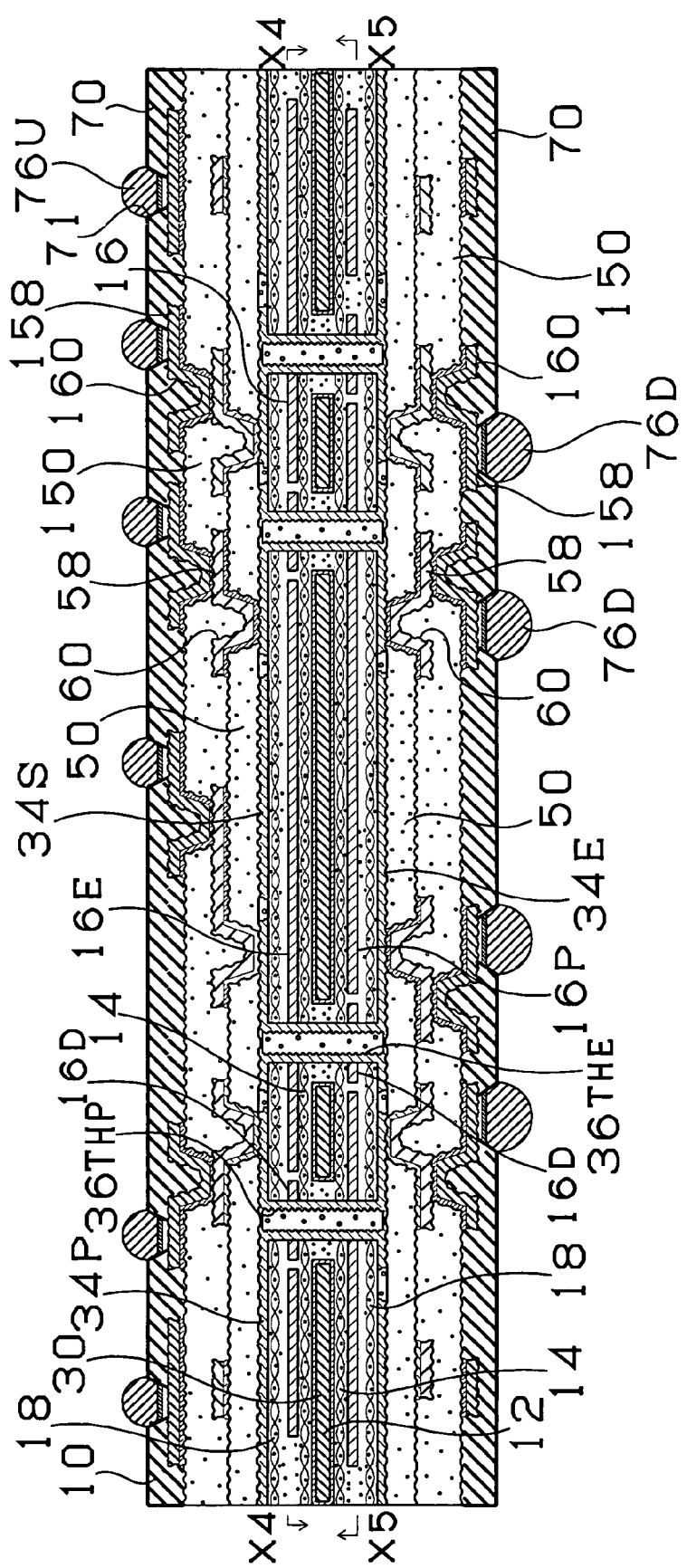
FIG. 35 is a sectional view of the multilayer printed wiring board according to a related art of the present invention.

According to the second embodiment-1, the multilayer core substrate 30 has the thick power source circuit 16P and grounding circuit 16E as an inner layer and the thin power source circuit 34P and grounding circuit 34E on the front surface, and the power source circuit 16P and grounding circuit 16E of the inner layer and the power source circuit 34P and the grounding circuit 34E on the front side are used as a conductive layer for power source layer and conductive layer for grounding. That is, even if the thick power source circuit 16P and grounding circuit 16E are disposed in the inner layer, an insulation layer is formed to cover the conductor circuit. Consequently, the front surface of the multilayer core substrate 30 can be made flat by killing unevenness with the conductor circuit. Thus even if the thin power source circuit 34P and grounding circuit 34E are disposed on the surface of the multilayer core substrate 30 to prevent the conductor circuit 58, 158 in the interlayer insulation layer 50, 150 from meandering, a sufficient thickness can be secured as the conductive layer of the core by adding the thicknesses of the power source circuit 16P and the grounding circuit 16E of the inner layer. Any fault do not occur in impedance of the conductive layer on the interlayer insulation layer. The electric characteristic of the multilayer printed wiring board can be improved by using the power source circuits 16P, 34P as a conductive layer for power source layer and the grounding circuits 16E, 34E as a conductive layer for grounding. Further, the electric characteristic can be improved because the opposing area (opposing distance) of the through hole and conductive layer of inner layer, whose potentials are opposite to each other, increases as shown in FIG. 34.

Further, the thicknesses of the power source circuit 16P and the grounding circuit 16E in the inner layer of the multilayer core substrate are set larger than the conductor circuits 58, 158 on the interlayer insulation layers 50, 150. As a result, even if the thin grounding circuit 34E and power source circuit 34P are disposed on the front surface of the multilayer core substrate 30, a sufficient thickness as the conductive layer of the core can be secured by adding the thicknesses of the thick power source circuit 16P and grounding circuit 16E in the inner layer. The ratio is preferred to be 1<(thickness of conductor circuit of the inner layer of the core/thickness of conductor circuit of interlayer insulation layer)≦40, and more preferably it is 1.2≦(thickness of conductor circuit of the inner layer of the core/thickness of conductor circuit of interlayer insulation layer)≦30.

Further, a micro strip structure can be formed by disposing a signal line 16S1 between the power source circuit 34P and the power source circuit 16P within the multilayer core substrate. Likewise, the micro strip structure can be formed by disposing a signal line (not shown, in the same layer as the power source circuit 16P) between the grounding circuit 16E and the grounding circuit 34E. By forming the micro strip structure, the inductance drops and impedance matching can be secured. Thus, the electric characteristic can be stabilized.

Figure 24:
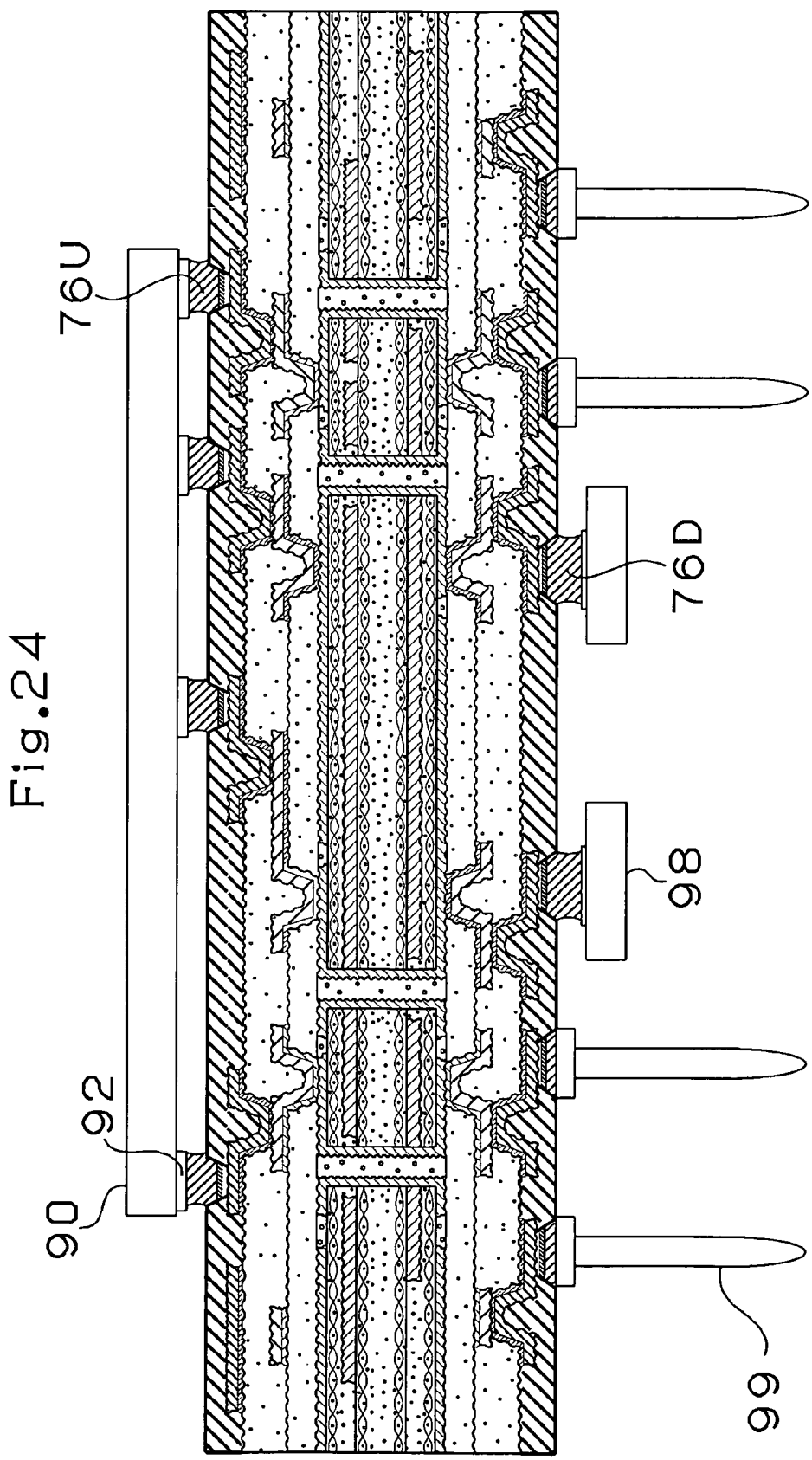
FIG. 24 is a sectional view showing a condition in which the IC chip is mounted on the multilayer printed wiring board according to a modification of the second embodiment-1.

FIG. 24 shows a modification of the second embodiment-1. According to this modification, a capacitor 98 is disposed just below the IC chip 90. Thus, the distance between the IC chip 90 and the capacitor 98 is small, thereby preventing voltage drop of power to be supplied to the IC chip 90.

Subsequently, the manufacturing method of the multilayer printed wiring board 10 shown in FIG. 22 will be described with reference to FIGS. 18-23.

C. Manufacturing of Multilayer Printed Wiring Board

Creation of Multilayer Core Substrate (1) A copper clad laminate 10 was used as a starting material, in which copper foil 16 having a thickness of 10 to 250 μm was laminated on both faces of an insulation substrate 14 composed of glass epoxy resin or BT (Bsmaleimide-Triazine) resin 0.6 mm thick (FIG. 18(A)). In the second embodiment-1, a copper foil 30 μm thick was used.

Figure 38:
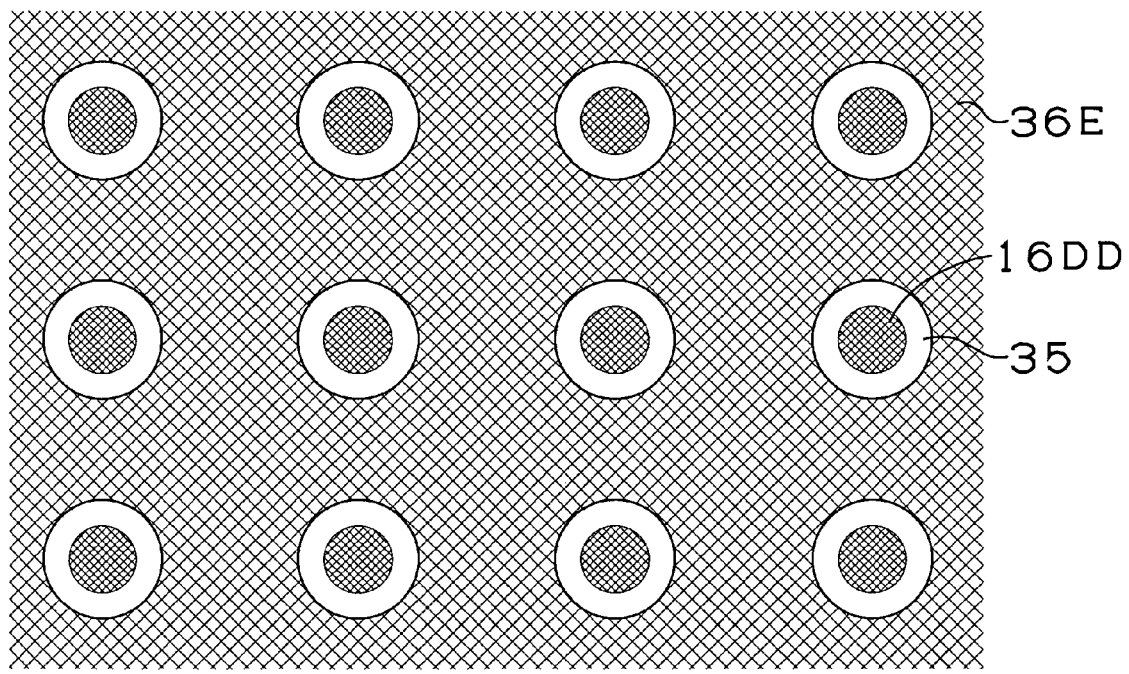
FIG. 38 is a lateral sectional view of the multilayer printed wiring board of a conventional technology.

(2) Subsequently, a conductor circuit 16E having no dummy land was formed in the vacancy 35 in the copper foil 16 just below the IC as shown in FIG. 19(A) indicating the front surface and a conductor circuit 16P having no dummy land was formed in the vacancy 35 as shown in FIG. 19(B) indicating the rear surface according to subtractive method. For reference, FIG. 38 shows a conventional example. According to the conventional example, a circuit 16DD acting as a dummy land 16D is provided in all the vacancies 35 so that a through hole passage 36 is formed within the circuit 16DD. The vacancy (opening) 35 is formed at a position in which the through hole is formed. By forming a conductor circuit having no dummy land, the interval between the through holes, the interval between the power source through hole and grounding conductive layer (X in FIG. 34) and the interval between the grounding through hole and power source conductive layer can be narrowed relative to an ordinary structure having the dummy land, because usually, the circuit 16DD acting as the dummy land 16D is formed in the diameter of +150 to 250 μm with respect to the through hole diameter. Mutual inductance can be reduced or the conductor resistance can be reduced by providing no dummy land. Further, an area in which the power source layer and grounding layer can be formed increases.

(3) After that, that substrate was subjected to black oxidation with aqueous solution containing NaOH (10 g/1), $NaClO_2$ (40 g/1), $Na_3PO_4$ (6 g/1) as black oxidation solution (oxidation solution) and reduction with aqueous solution containing NaOH (10 g/1), $NaBH_4$ (6 g/1) as reduction solution so as to form a roughed face 16a on the surface of the lower layer conductor circuits 16E, 16S1, 16P and 16S2. (FIG. 18(C))

(4) Prepreg 18 200 μm thick and copper foil 20 18 μm thick were laminated on both surfaces of the aforementioned substrate in order and after that, a 4-layer multilayer core substrate 30 was created by heating and pressing with pressure (FIG. 18(D)). The thickness of the prepreg is changed depending on the thickness of the copper foil 16.

(5) A through hole passage 36 was made by drilling this multilayer core substrate 30 (FIG. 20(A)). After that, by executing electroless plating or electrolytic plating and then etching in the form of a pattern, conductor circuits 34S, 34P, 34E, a signal through hole 36S (not shown) for a diameter of 250 μm, a power source through hole 36P, and a grounding through hole 36E were formed in the front and rear surfaces of the multilayer core substrate (FIG. 20(B)).

(6) After the conductor circuits 34S, 34P and 34E and the through holes 36S, 36P, 36E were formed in the front and rear surfaces of the multilayer core substrate, that substrate was subjected to black oxidation with aqueous solution containing NaOH (10 g/1), $NaClO_2$ (40 g/1), $Na_3PO_4$ (6 g/1) as black oxidation solution and reduction with aqueous solution containing NaOH (10 g/1), $NaBH_4$ (6 g/1) as reduction solution so as to form a roughed face 34β on the surfaces of the upper layer conductor circuit and through hole (FIG. 20(C)).

(7) Then, after through hole charging resin compound 40 created in the same way as the aforementioned first embodiment-1 was charged between the conductor circuits 34S, 34P, 34E and in the through holes 36S, 36P, 36E using a squeegee, it was dried at 100° C. for 20 minutes (FIG. 21(A)). The surface of the substrate 30 was polished into a flat surface until the surfaces of the conductor circuit and the land surface of the through hole are exposed and resin charged layer was formed by hardening the through hole charging resin compound 40 by heating at 100° for an hour and at 150° for an hour so as to form the through holes 36S (not shown), 36P, 36E (FIG. 21(B)).

The copper thickness on the front and rear surfaces of the multilayer core substrate was 7.5 to 70 μm. It is preferable to form the copper thickness on the front and rear surfaces of the multilayer core substrate smaller than the copper thickness of the inner layer. It was set to 25 μm according to the second embodiment-1.

As a consequence, a finer circuit than in the inner layer can be formed in the front and rear surfaces so that the diameter of the through hole land can be reduced and the gap between the conductor circuits, the gap between the through hole land and the conductor circuit can be formed small. Therefore, the through hole land and the conductor circuit on the front and rear surface layers are not an obstacle to reduction of the through hole pitch.

(8) After the aforementioned substrate was washed with water and degreased with acid, soft etching was carried out and then, the surface of the signal circuit 34S, the power source circuit 34P and the grounding circuit 34E and the land surface of the through hole 36 were etched by spraying etching liquid on both surfaces of the substrate so as to form the roughed face 36β on the entire surface of the conductor circuit (FIG. 21(C)). As the etching liquid, etching liquid (manufactured by MECK, MECK etch bond) composed of copper imidazole (II) complex of 10 weight part, glycolic acid of 7.3 weight part and potassium chloride of 5 weight part was used.

Because following processes are the same as the first embodiment-1 described above with reference to FIGS. 5-7, description thereof is omitted. However, the thickness of the conductor circuit 58, 158 was set to 15 μm for adjustment of plating time.

Second embodiment-2

Although the second embodiment-1 defines that a region in which a through hole having no conductor circuit extending from the through hole exists just below the IC, that is changed as following according to the second embodiment-2. The other portion is the same as the second embodiment-1.

FIG. 26(A) shows a lateral sectional view of a typical grounding layer of the inner layer of the inner layer of a 4-layer core and FIG. 26(B) shows a lateral sectional view of a typical power source layer of the 4-layer core.

The multilayer core of the second embodiment-2 is a 4-layer core and the power source through holes 36P having no conductor circuit 16D extending from the through hole when passing through the grounding layer 16E occupy 50% all through holes connected to a power source circuit of the IC and the grounding through holes 36E having no conductor circuit extending from the through hole when passing through the power source layer 16P occupy 50% all through holes connected to a grounding circuit of the IC. The quantity of the through holes having no dummy land can be adjusted by changing the pattern of an exposure film when a circuit is formed in the copper foil 16 in the aforementioned process (2), with reference to FIG. 18(B).

Second Embodiment-3

The second embodiment-3 is the same as the second embodiment-2 except that the through holes having no conductor circuit extending from the through hole of the second embodiment-2 were set to 70%.

Second Embodiment-4

The second embodiment-4 is the same as the second embodiment-2 except that the through holes having no conductor circuit extending from the through hole of the second embodiment-2 were set to 80%.

Second Embodiment-5

The second embodiment-5 is the same as the second embodiment-2 except that the through holes having no conductor circuit extending from the through hole of the second embodiment-2 were set to 90%.

Second Embodiment-6

According to the second embodiment-6, the thicknesses of the power source layer in the inner layer and the conductor in the grounding layer of the second embodiment-1 were changed to 45 µm. The other thing is the same as the second embodiment-1.

Second Embodiment-7

According to the second embodiment-7, the thicknesses of the power source layer in the inner layer and the conductor in the grounding layer of the second embodiment-1 were changed to 60 µm. The other thing is the same as the second embodiment-1.

Second Embodiment-8

According to the second embodiment-8, the thicknesses of the power source layer in the inner layer and the conductor in the grounding layer of the second embodiment-1 were changed to 75 µm. The other thing is the same as the second embodiment-1.

Second Embodiment-9

According to the second embodiment-9, the thicknesses of the power source layer in the inner layer and the conductor in the grounding layer of the second embodiment-3 were changed to 75 µm. The other thing is the same as the second embodiment-3.

Second Embodiment-10

Figure 27:
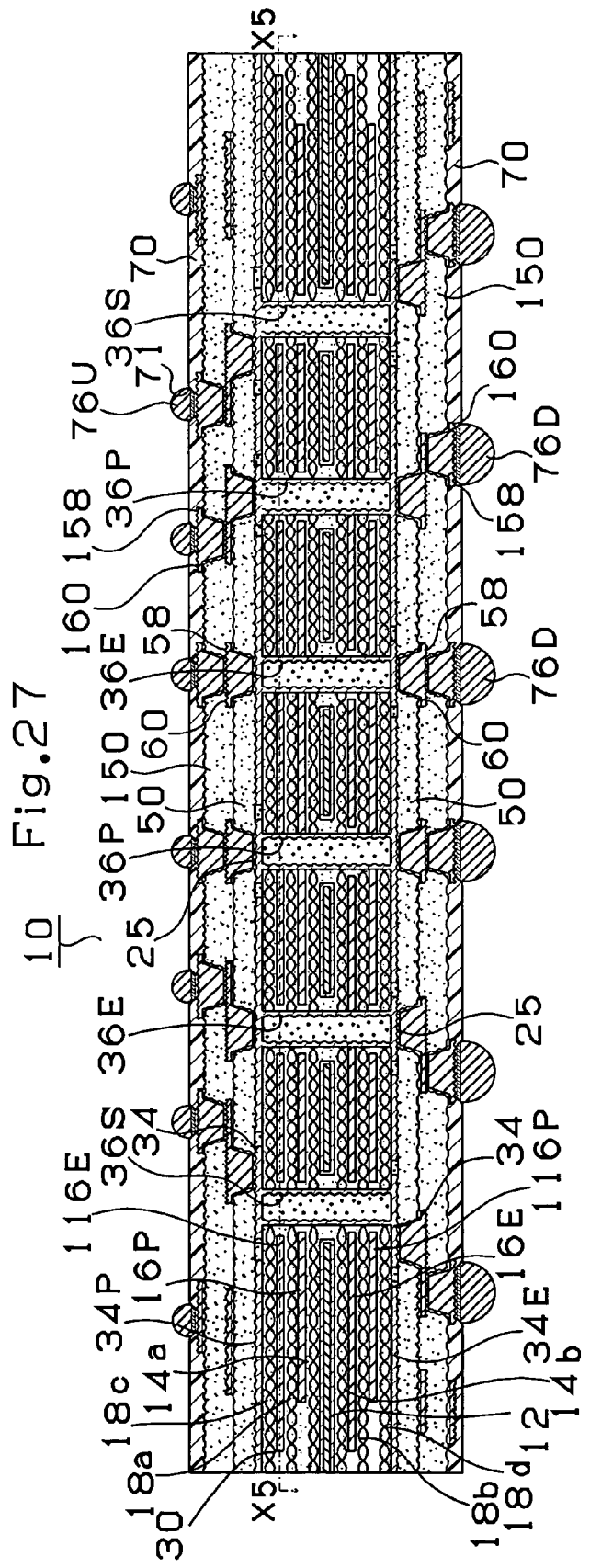
FIG. 27 is a sectional view of the multilayer printed wiring board according to the second embodiment-10.

The multilayer printed wiring board according to the second embodiment-10 will be described with reference to FIG. 27.

In the multilayer printed wiring board of the second embodiment-1 described above with reference to FIG. 22, a multilayer core substrate 30 in which two grounding circuits 16E, 16P were disposed in its inner layer was used. Contrary to this, the second embodiment-10 uses a multilayer core substrate 20 in which four-layer grounding circuits 16E, 116E, 16P, 116PP in the inner layer are provided. The grounding circuit and power source circuit are disposed alternately.

Second Embodiments-11 to 19

In the second embodiments-1 to 9, the thickness of a starting material and the thickness of conductive layers on the front and rear surfaces of the core substrate were changed. More specifically, the thickness of the copper clad laminate 10 of FIG. 18(A) was set to 0.2 mm and the thickness of the conductive layer (34S, 34P, 34E) on the front and rear surfaces of the core substrate of FIG. 20(B) was set to 10 µm. A following process was the same as the second embodiment-1.

Second Embodiment-20

According to the second embodiment-20, the quantity of the power source through holes having no dummy land located just below the IC of the second embodiment-16 was set to 30% all power source through holes and the quantity of the grounding through holes having no dummy land just below the IC was set to 30% all grounding through holes.

Second Embodiment-21

According to the second embodiment-21, the thicknesses of the power source layer in the inner layer of the multilayer core substrate and the conductor in the grounding layer of the second embodiment-20 were set to 60 µm.

Second Embodiment-22

According to the second embodiment-22, the thicknesses of the power source layer in the inner layer of the multilayer core substrate and the conductor in the grounding layer of the second embodiment-20 were set to 75 µm.

Second Embodiment-23

According to the second embodiment-23, the thicknesses of the power source layer in the inner layer of the multilayer core substrate and the conductor in the grounding layer of the second embodiment-20 were set to 150 µm. The thickness of the prepreg in FIG. 18(D) was set to 275 µm.

Second Embodiment-24

According to the second embodiment-24, the thickness of the power source layer in the inner layer of the multilayer core substrate and the conductor in the grounding layer of the second embodiment-20 were set to 300 µm. The thickness of the prepreg in FIG. 18(D) was set to 450 µm.

Second Embodiment-25

According to the second embodiment-25, the quantity of the power source through holes having no dummy land just below the IC of the second embodiment-20 was set to 50% all the power source through holes and the quantity of the grounding through holes having no dummy land just below the IC was set to 50% the grounding through holes.

Second Embodiment-26

According to the second embodiment-26, the quantity of the power source through holes having no dummy land just below the IC of the second embodiment-21 was set to 50% all the power source through holes and the quantity of the grounding through holes having no dummy land just below the IC was set to 50% the grounding through holes.

Second Embodiment-27

According to the second embodiment-27, the quantity of the power source through holes having no dummy land just below the IC of the second embodiment-22 was set to 50% all the power source through holes and the quantity of the grounding through holes having no dummy land just below the IC was set to 50% the grounding through holes.

Second Embodiment-28

According to the second embodiment-28, the quantity of the power source through holes having no dummy land just below the IC of the second embodiment-23 was set to 50% all the power source through holes and the quantity of the grounding through holes having no dummy land just below the IC was set to 50% the grounding through holes.

Second Embodiment-29

According to the second embodiment-29, the quantity of the power source through holes having no dummy land just below the IC of the second embodiment-24 was set to 50% all the power source through holes and the quantity of the grounding through holes having no dummy land just below the IC was set to 50% the grounding through holes.

Second Embodiment-30

According to the second embodiment-30, the quantity of the power source through holes having no dummy land just below the IC of the second embodiment-20 was set to 70% all power source through holes and the quantity of the grounding through holes having no dummy land just below the IC was set to 70% all the grounding through holes.

Second Embodiment-31

According to the second embodiment-31, the quantity of the power source through holes having no dummy land just below the IC of the second embodiment-21 was set to 70% all power source through holes and the quantity of the grounding through holes having no dummy land just below the IC was set to 70% all the grounding through holes.

Second Embodiment-32

According to the second embodiment-32, the quantity of the power source through holes having no dummy land just below the IC of the second embodiment-22 was set to 70% all power source through holes and the quantity of the grounding through holes having no dummy land just below the IC was set to 70% all the grounding through holes.

Second Embodiment-33

According to the second embodiment-33, the quantity of the power source through holes having no dummy land just below the IC of the second embodiment-23 was set to 70% all power source through holes and the quantity of the grounding through holes having no dummy land just below the IC was set to 70% all the grounding through holes.

Second Embodiment-34

According to the second embodiment-34, the quantity of the power source through holes having no dummy land just below the IC of the second embodiment-24 was set to 70% all power source through holes and the quantity of the grounding through holes having no dummy land just below the IC was set to 70% all the grounding through holes.

Second Embodiment-35

According to the second embodiment-35, the thicknesses of the power source layer in the inner layer of the multilayer core substrate and the conductor in the grounding layer of the second embodiment-12 were set to 60 μm.

Second Embodiment-36

According to the second embodiment-36, the thicknesses of the power source layer in the inner layer of the multilayer core substrate and the conductor in the grounding layer of the second embodiment-25 were set to 30 μm.

The quantity of the through holes having no dummy land just below the IC of the second embodiments-2 to 5, 12 to 15, 19, 35 is a number expressed by subtracting 10 to 15% from a percentage indicated in FIGS. 30, 33.

Second Comparative Example-1

A multilayer core substrate was formed so that the conductive layer in the inner layer and the conductive layer on the front surface have the same thickness as the second embodiment-1. The dummy lands 16 were disposed in all the through holes like the related technology described with reference to FIGS. 36, 38.

Second Comparative Example-2

This embodiment is the same as the second comparative-1 except that the thickness of the conductor of the multilayer core substrate of the second comparative example-1 was set to 15 μm.

Second Comparative Example-3

In the second comparative example-1, the thickness of a starting material was changed. More specifically, the thickness of the copper clad laminate 10 was set to 0.2 mm. In FIG. 18(A), the thickness of the copper foil 16 was set to 5 μm.

An IC chip of 3.1 GHz in frequency was mounted on substrates of the second embodiments-1 to 9 and the second comparative examples-1, 2, the same amount of power was supplied and then the amount of voltage dropped at the startup was measured. Because the voltage of the IC chip cannot be measured directly, a circuit which enables the voltage of the IC to be measured is formed on a printed wiring board. The value of voltage drop at this time is indicated. This is a value of the voltage drop when the power source voltage is 1.0 V.

Further, the initial operations of the second embodiments-1 to 9 and the second comparative examples-1, 2 were verified. Table 33 shows this result.

The quantity of the through holes having no dummy land was verified also. Its result is shown below. With the quantity of the through holes having no dummy land on the abscissa axis and the value of the voltage drop amount on the ordinate axis, FIGS. 32(A), (B) show a result (V).

As a result of comparison between the second embodiment-1 and the second comparative example-1, it is evident that the voltage drops of the first time and second time is improved by forming a through hole just below the IC with a through hole having no conductor circuit extending from the through hole, so that malfunction of the IC is eliminated.

As a result of comparison between the second embodiments-2 to 5 and the second comparative example-1, it is evident that the voltage drop of the first time and second time is improved by forming the power source and grounding through holes with through holes having no dummy land and then increasing the quantity thereof (see FIGS. 32(A), (B) and FIG. 33).

Figure 40:
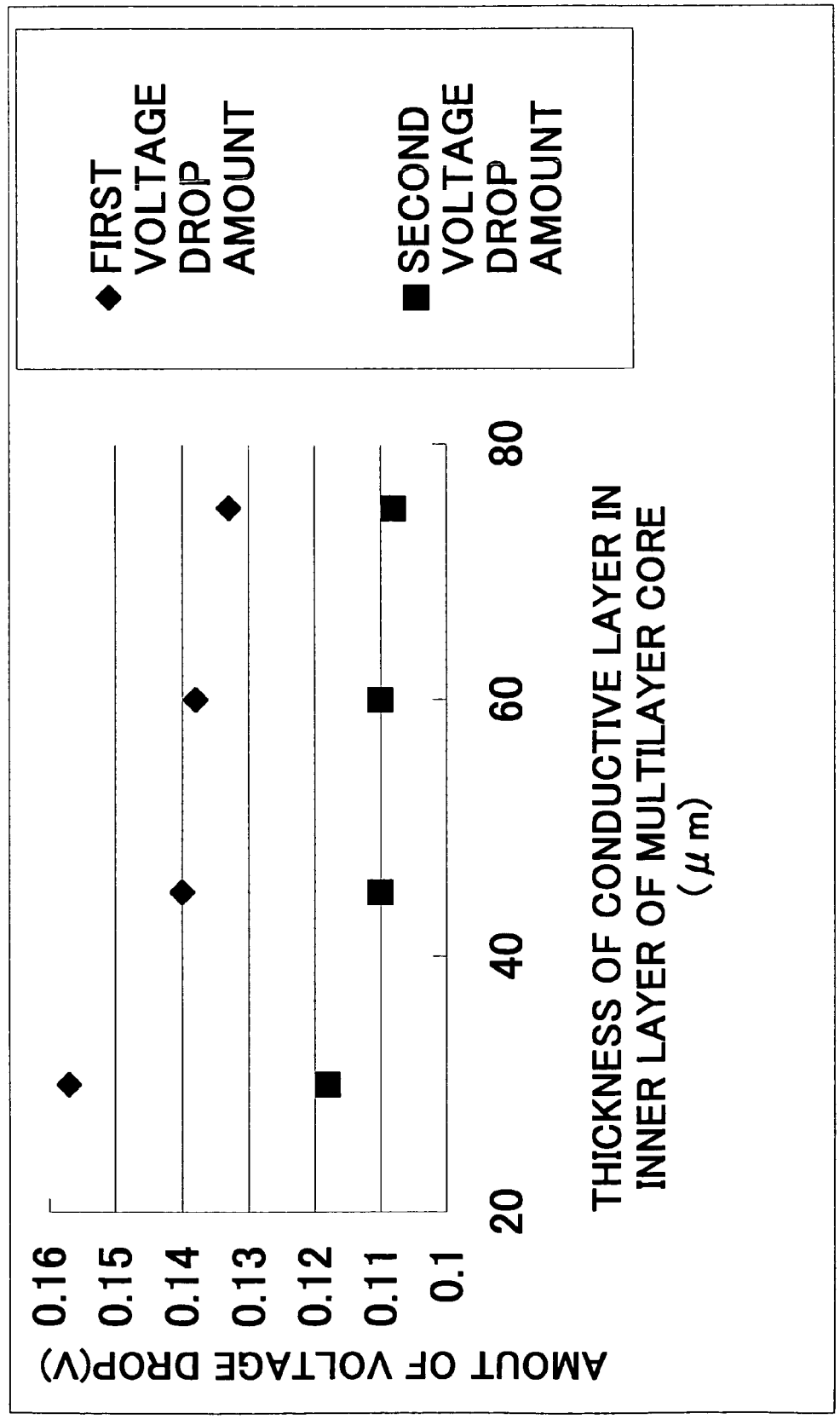
FIG. 40 is a graph showing the amounts of voltage drops of the first time and second time.

As a result of comparison of the second embodiments-1, 6, 7, 8, it is evident that the voltage drop of the first time and second time is further improved by increasing the thickness of the inner layer in the multilayer core (see FIG. 40). Then, if the thickness of the conductor of the conductor of the inner layer is three or more times the thickness of the conductor of a built-up layer, the effect of the improvement lowers.

From the second embodiments-2 to 5 and the second comparative example-1, it is evident that the voltage drops of the first time and second time are improved by increasing the quantity of the through holes having no conductor circuit extending from the through hole. If the quantity exceeds 70%, malfunction of the IC is eliminated. Then, if the quantity of the through holes having no conductor circuit extending from the through hole is over 70%, the effect of the improvement lowers.

From the second comparative example-1 and the second comparative example-2, it is evident that the voltage drop of the third time is improved by increasing the thickness of the conductor.

From the above-mentioned test result, it is evident that the degree of shortage of power (voltage drop) generated at the initial startup of the IC chip is reduced by the structure of the present invention and that even if an IC chip for high frequency region, particularly an IC chip of 3 GHz or more is mounted, it can be started without any problem. For the reason, the electric characteristic and electric connectivity can be improved also.

Resistance within a circuit of a printed substrate can be reduced relative to a conventional printed substrate. Thus, when reliability test (high temperature and high humidity bias test) is carried out under high temperatures and high humidity by applying bias, it takes long to destroy, so that the reliability can be improved.

Next, as regards the multilayer printed wiring board manufactured according to the second embodiments-11 to 36 and the second comparative example-3, the voltage drop amount of the IC chip was measured according to a method descried below.

In each multilayer printed wiring board equipped with a No. 3 IC chip described below, the amount of a voltage drop of the IC chip at that time was measured by performing simultaneous switching. A circuit allowing the voltage of the IC to be measured is formed in a printed wiring board because the voltage of the IC chip cannot be measured directly. This is a value of the voltage drop when the power source voltage is 1.0 V.

As regards the multilayer printed wiring board manufactured according to the second embodiments-11 to 36 and the second comparative example-3, whether or not the mounted IC chip malfunctioned was verified according to a method described below.

As for the IC chip, any one IC chip selected from following Nos. 1 to 3 was mounted on each multilayer printed wiring board and whether or not malfunction occurred was evaluated by executing the simultaneous switching 100 times. FIG. 30 shows the results.

No. 1: drive frequency: 3.06 GHz, bass clock (FSB): 533 MHz
No. 2: drive frequency: 3.2 GHz, bass clock (FSB): 800 MHz
No. 3: drive frequency: 3.46 GHz, bass clock (FSB): 1066 MHz From a result of mounting the No. 1 IC chip, it is evident that malfunction of the IC chip and voltage drop can be suppressed if part of the through holes are through holes having no dummy land. This is estimated to be due to the effects 2-4 of the second invention described in the specification.

From comparison between the second embodiment-12 provided with the No. 2 IC chip and the second embodiment-36, it is evident that an area for forming a through hole having no dummy land is preferred to be just below the IC.

From comparison between the second embodiments-20 to 24 equipped with the No. 3 IC chip and the second embodiments-25 to 29, it is evident that interaction exists between the thickness of the conductor in the inner layer and the quantity of the through holes having no dummy land. If the thickness of the conductor in the inner layer is small, the quantity of the through holes having no dummy land needs to be increased and if the thickness of the conductor in the inner layer is large, the through holes may be in a small quantity. This is estimated to be due to the effect described with reference to FIG. 34.

The thickness of the conductor in the grounding layer of the inner layer is equal to the thickness of the conductor of the power source layer in the inner layer and the thickness of the conductor in the grounding layer on the rear surface of the core substrate is equal to the thickness of the conductor in the power source layer on the front surface. Thus, the total thickness of the conductors in the grounding layer is large like the power source layer, so that noise can be reduced thereby making it difficult for malfunction to occur.

As a result of comparison between the second embodiment-12 equipped with the No. 2 IC chip and the second embodiment-36, even if the thickness of the conductive layer of the multilayer core or the quantity of the through holes having no dummy land is the same, it is evident that the amount of voltage drop or malfunction differs depending on an area in which a through hole having no dummy land is provided. This reason is estimated to be that the feature of this application is made more effective by providing a through hole having no dummy land just below the IC because the through hole just below the IC has a short wiring length for connecting to the IC.

The invention claimed is:
1. A multilayer printed wiring board comprising:
a multilayer core substrate comprising a plurality of insulating layers, a front conductive layer formed on a surface of a front outermost one of the insulating layers, a rear conductive layer formed on a surface of a rear outermost one of the insulating layers, a plurality of inner conductive layers formed between the insulating layers, and a plurality of through holes electrically connecting the front, rear and inner conductive layers;
an interlayer insulation layer formed over the multilayer core substrate;
a conductive layer formed over the interlayer insulating layer and the multilayer core substrate,
wherein one of the front and rear conductive layers comprises one of a power source conductive layer and a grounding conductive layer, the other one of the front and rear conductive layers comprises the other one of the power source and grounding conductive layers, the plurality of inner conductive layers comprises an inner power source conductive layer and an inner grounding conductive layer, the inner power source conductive layer has a thickness which is larger than a thickness of the power source conductive layer, and the inner grounding conductive layer has a thickness which is larger than a thickness of the grounding conductive layer.

2. The multilayer printed wiring board according to claim 1, wherein a sum of the thicknesses of the power source and inner power source conductive layers in said multilayer core substrate is α1, a thickness of the conductive layer is α2, and a relation between α1 and α2 satisfies α2<α1≦40α2.

3. The multilayer printed wiring board according to claim 1, wherein a sum of the thicknesses of the grounding and inner grounding conductive layers in said multilayer core substrate is α3, a thickness of the conductive layer is α2, and a relation between α3 and α2 satisfies α2<α3≦40α2.

4. The multilayer printed wiring board according to claim 1, wherein a sum of the thicknesses of the power source and inner power source conductive layers in said multilayer core substrate is α1, a thickness of the conductive layer is α2, and a relation between α1 and α2 satisfies 1.2α2≦40α2.

5. The multilayer printed wiring board according to claim 1, wherein a sum of the thicknesses of the grounding and inner grounding conductive layers in said multilayer core substrate layers is α3, a thickness of the conductive layer is α2, and a relation between α3 and α2 satisfies 1.2α2≦≦40α2.

6. The multilayer printed wiring board according to claim 1, wherein a sum of the thicknesses of the power source and inner power source conductive layers in said multilayer core substrate is α1, a thickness of the conductive layer is α2, a relation between α1 and α2 satisfies α2<α1≦40α2, a sum of the thicknesses of the grounding and inner grounding conductive layers in said multilayer core substrate is α3, and a relation between α3 and α2 satisfies α2<α3≦40α2.

7. The multilayer printed wiring board according to claim 1, wherein a sum of the thicknesses of the power source and inner power source conductive layers in said multilayer core substrate is α1, a thickness of the conductive layer is α2, a relation between α1 and α2 satisfies 1.2α2≦40α2, a sum of the thicknesses of the grounding and inner grounding conductive layers in said multilayer core substrate is α3, and a relation between α3 and α2 satisfies 1.2α2≦3≦40α2.

* * * * *